United States Patent
Wang et al.

(10) Patent No.: US 12,369,420 B2
(45) Date of Patent: Jul. 22, 2025

(54) METHODS FOR FORMING IMAGE SENSORS

(71) Applicant: Taiwan Semiconductor Manufacturing Company, Ltd., Hsin-Chu (TW)

(72) Inventors: Chiao-Chi Wang, Hsin-Chu (TW); Chung-Chuan Tseng, Hsinchu (TW); Chia-Ping Lai, Hsinchu (TW); Szu-Chien Tseng, Taipei (TW); Yeh-Hsun Fang, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 40 days.

(21) Appl. No.: 17/880,954

(22) Filed: Aug. 4, 2022

(65) Prior Publication Data
US 2022/0375972 A1    Nov. 24, 2022

Related U.S. Application Data

(62) Division of application No. 16/988,955, filed on Aug. 10, 2020, now Pat. No. 11,626,442.

(51) Int. Cl.
*H10F 39/00* (2025.01)
*H10F 39/12* (2025.01)
*H10F 39/18* (2025.01)

(52) U.S. Cl.
CPC ......... *H10F 39/807* (2025.01); *H10F 39/011* (2025.01); *H10F 39/8023* (2025.01); *H10F 39/184* (2025.01); *H10F 39/199* (2025.01)

(58) Field of Classification Search
CPC .......... H01L 27/14605; H01L 27/1462; H01L 27/14627; H01L 27/1463; H01L 27/14636;
(Continued)

(56) References Cited

U.S. PATENT DOCUMENTS

| 8,802,484 B1* | 8/2014 | Verma ................. H01L 27/1203 438/57 |
| 2004/0160520 A1* | 8/2004 | Kubota .................. H04N 25/68 348/E3.018 |

(Continued)

FOREIGN PATENT DOCUMENTS

| CN | 102769033 A | 11/2012 |
| WO | 2018160721 A1 | 9/2018 |

OTHER PUBLICATIONS

Chen, Gim S. "The Application of DI-O3 Water on Wafer Surface Preparation." International Conference on Waver Rinsing, Water Reclamation and Environmental Technology for Semiconductor Manufacturing, WWW.oZomax.com/pdf/dio3prep.pdf, (1999), 10 pages, published in 1999.

(Continued)

*Primary Examiner* — Meiya Li
(74) *Attorney, Agent, or Firm* — Eschweiler & Potashnik, LLC

(57) ABSTRACT

Various embodiments of the present disclosure are directed towards methods for forming an image sensor in which a device layer overlies and has a different semiconductor material than a substrate and in which the device layer has high crystalline quality. Some embodiments of the methods include: epitaxially growing the device layer on the substrate; patterning the device layer to form a trench dividing the device layer into mesa structures corresponding to pixels; forming an inter-pixel dielectric layer filling the trench and separating the mesa structures; and forming photodetectors in the mesa structures. Other embodiments of the methods include: depositing the inter-pixel dielectric layer over the substrate; patterning the inter-pixel dielectric layer to form cavities corresponding to the pixels; epitaxially (Continued)

growing the mesa structures in the cavities; and forming the photodetectors in the mesa structures.

20 Claims, 34 Drawing Sheets

(58) Field of Classification Search
CPC .......... H01L 27/1464; H01L 27/14649; H01L 27/14683; H01L 27/14685; H01L 27/14687; H10F 39/011; H10F 39/024; H10F 39/026; H10F 39/184; H10F 39/199; H10F 39/8023; H10F 39/805; H10F 39/8063; H10F 39/807; H10F 39/811

See application file for complete search history.

(56) References Cited

U.S. PATENT DOCUMENTS

| | | | |
|---|---|---|---|
| 2005/0184354 A1* | 8/2005 | Chu | ........................ H01L 31/101 257/458 |
| 2011/0284981 A1 | 11/2011 | Chang et al. | |
| 2012/0319166 A1 | 12/2012 | Adam et al. | |
| 2013/0113061 A1 | 5/2013 | Lai et al. | |
| 2013/0323876 A1 | 12/2013 | Lu et al. | |
| 2016/0027837 A1* | 1/2016 | Webster | .............. H01L 27/1462 257/443 |
| 2016/0254253 A1 | 9/2016 | Meitl et al. | |
| 2018/0167606 A1 | 6/2018 | Cazaux et al. | |
| 2019/0148570 A1 | 5/2019 | Wu et al. | |
| 2019/0386050 A1 | 12/2019 | Kim et al. | |
| 2020/0194480 A1* | 6/2020 | Na | ........................ H01L 29/167 |
| 2020/0350345 A1 | 11/2020 | Hiramatsu | |
| 2021/0028603 A1 | 1/2021 | Lee et al. | |

OTHER PUBLICATIONS

Carroll et al. "Low-Temperature Preparation of Oxygen- and Carbon-Free Silicon and Silicon-Germanium Surfaces for Silicon and Silicon-Germanium Epitaxial Growth by Rapid Thermal Chemical Vapor Deposition." Journal of the Electrochemical Society, 147 (12) 4652-4659 (2000), published Aug. 18, 2020.

Non-Final Office Action dated Aug. 10, 2022 for U.S. Appl. No. 16/988,955.

Notice of Allowance dated Nov. 28, 2022 for U.S. Appl. No. 16/988,955.

* cited by examiner

METHODS FOR FORMING IMAGE SENSORS

REFERENCE TO RELATED APPLICATION

This Application is a Divisional of U.S. application Ser. No. 16/988,955, filed on Aug. 10, 2020, the contents of which are hereby incorporated by reference in their entirety.

BACKGROUND

Integrated circuits (IC) with image sensors are used in a wide range of modern-day electronic devices, such as, for example, cameras and cell phones. In recent years, complementary metal-oxide-semiconductor (CMOS) image sensors have begun to see widespread use, largely replacing charge-coupled devices (CCD) image sensors. Compared to CCD image sensors, CMOS image sensors are increasingly favored due to low power consumption, small size, fast data processing, direct output of data, and low manufacturing cost. Some types of CMOS image sensors include front side illuminated (FSI) image sensors and back side illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
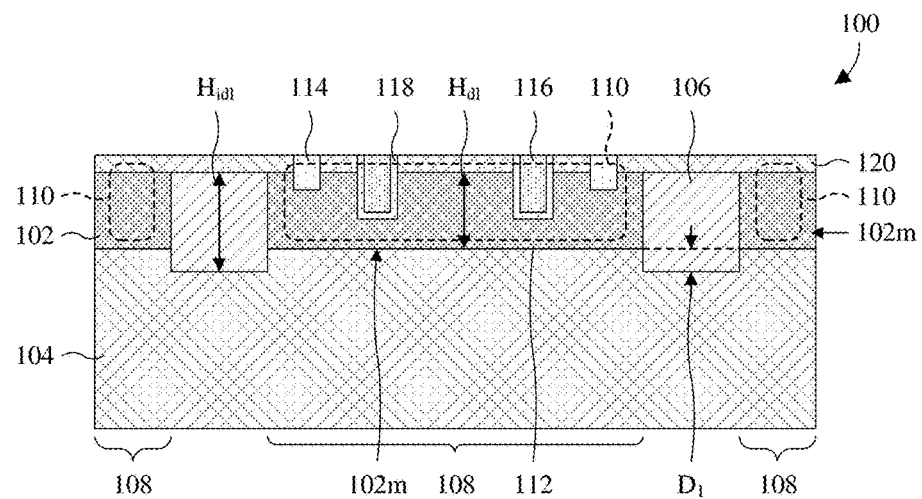
FIG. 1 illustrates a cross-sectional view of some embodiments of an image sensor in which a device layer overlies and has a different semiconductor material than a substrate.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Complementary metal-oxide-semiconductor (CMOS) image sensors may be employed to detect near infrared (NIR) and infrared (IR) radiation. This may arise for CMOS image sensors employed for time-of-flight (ToF) imaging and other suitable types of imaging. However, CMOS image sensors typically comprise silicon-based photodetectors. Silicon has a large bandgap and is hence poor at absorption of NIR and IR radiation. Therefore, CMOS image sensors may have poor quantum efficiency (QE) for NIR and IR radiation. To mitigate this, silicon-based photodetectors may be replaced by photodetectors based on germanium or some other suitable type of semiconductor material having a smaller bandgap.

A method for forming such a CMOS image sensor may comprise providing a substrate, epitaxially growing a device layer having a smaller bandgap than the substrate on the substrate, and forming a photodetector in the device layer. Because the photodetector is formed in the device layer, signal-to-noise ratio (SNR), QE, and other suitable performance metrics of the photodetector depend upon crystalline quality of the device layer. For example, poor crystalline quality may increase leakage current and may hence degrade SNR and QE. However, epitaxially forming the device layer with high crystalline quality may be challenging. Further, completing the CMOS image sensor around the device layer without damaging the crystalline lattice of the device layer may be challenging.

Various embodiments of the present disclosure are directed towards methods for forming an image sensor in which a device layer overlies and has a different semiconductor material than a substrate and in which the device layer has high crystalline quality. Further, various embodiments of the present disclosure are directed towards the image sensors resulting from the methods. Some embodiments of the methods include: epitaxially growing the device layer on the substrate; patterning the device layer to form a trench dividing the device layer into mesa structures corresponding to pixels; forming an inter-pixel dielectric layer filling the trench and separating the mesa structures; and forming photodetectors in the mesa structures. Other embodiments of the methods include: depositing the inter-pixel dielectric layer over the substrate; patterning the inter-pixel dielectric layer to form cavities corresponding to the pixels; epitaxially growing the mesa structures in the cavities; and forming the photodetectors in the mesa structures. Yet other embodiments of the methods are described hereafter.

Because the device layer and the substrate are different semiconductor materials, lattice constants may be different. As a result, threading-dislocation defects may arise at an interface between the device layer and the substrate. Because the device layer may be patterned outside the substrate in the above described methods, the interface may be localized to a bottom surface of the device layer and may hence span a small area. Because the interface may span a small area, the density of threading-dislocation defects may be low and crystalline quality may hence be high. High crystalline quality may reduce leakage current and may hence enhance SNR, QE, and other suitable performance metrics of the photodetectors.

With reference to FIG. 1, a cross-sectional view 100 of some embodiments of an image sensor is provided in which a device layer 102 overlies and has a different semiconductor material than a substrate 104. Further, sidewalls of the device layer 102 adjoin an inter-pixel dielectric layer 106 from top to bottom. The device layer 102 may, for example, be or comprise germanium, silicon germanium, some other suitable semiconductor material(s), or any combination of the foregoing. The substrate 104 may, for example, be or comprise silicon and/or some other suitable semiconductor material(s).

The inter-pixel dielectric layer 106 extends through the device layer 102 to the substrate 104. Further, the inter-pixel dielectric layer 106 divides the device layer 102 into discrete mesa structures 102m. The mesa structures 102m are individual to pixels 108 of the image sensor and accommodate photodetectors 110 individual to the pixels 108. Note that the pixels at the periphery of the cross-sectional view 100 are only partially illustrated. The inter-pixel dielectric layer 106 may, for example, be or comprise silicon oxide and/or some other suitable dielectric(s).

As seen hereafter, a method for forming the image sensor may, for example, comprise: epitaxially growing the device layer 102 on the substrate 104; patterning the device layer 102 to form a trench dividing the device layer 102 into the mesa structures 102m; and forming the inter-pixel dielectric layer 106 in the trench. Other suitable methods are, however, amenable.

Because the device layer 102 and the substrate 104 are different semiconductor materials, lattice constants may be different. As a result, threading-dislocation defects may arise at an interface 112 between the device layer 102 and the substrate 104. Further, because the interface 112 is localized to a bottom surface of the device layer 102 and does not extend along sidewalls of the device layer 102, the interface 112 spans a small area. As a result, the density of threading-dislocation defects may be low and crystalline quality may be high. High crystalline quality may reduce leakage current and may hence enhance SNR, QE, and other suitable performance metrics of the photodetectors 110.

Because the mesa structures 102m are discrete and separated from each other by the inter-pixel dielectric layer 106, electrical isolation between the mesa structures 102m is high. As a result, the mesa structures 102m may have high density. Further, because top layouts of the mesa structures 102m may be defined by patterning the device layer 102, the top layouts may be chosen for high density. The top layouts may, for example, be square, rectangular, hexagonal, triangular, circular, octagonal, pentagonal, or some other suitable shape. Because density may be high, and because the mesa structures 102m may be defined and isolated from each other with relatively few processing steps, manufacturing costs for the image sensor may be low.

The photodetectors 110 include corresponding first contact regions 114, corresponding second contact regions 116, and corresponding contact wells 118. While not visible for the pixels 108 at the periphery of the cross-sectional view 100, the pixels 108 at the periphery of the cross-sectional view 100 still include first and second contact regions 114, 116 and contact wells 118. The pixel 108 at the middle of the cross-sectional view 100 may, for example, be representative of the pixels 108 at the periphery of the cross-sectional view 100.

The first and second contact regions 114, 116 and the contact wells 118 are doped semiconductor regions in the device layer 102. The first contact regions 114 have a first doping type, and the second contact regions 116 and the contact wells 118 have a second doping type opposite the first doping type. The first and second doping types may, for example, respectively be N-type and P-type or vice versa. The contact wells 118 are individual to and respectively cup undersides of the second contact regions 116 to separate the second contact regions 116 from a bulk of the device layer 102. In some embodiments, the bulk of the device layer 102 is undoped. The photodetectors 110 may, for example, be PIN photodiodes or some other suitable type of photodiodes.

A device cap layer 120 overlies the device layer 102 and the inter-pixel dielectric layer 106. In alternative embodiments, the device cap layer 120 is localized to the device layer 102 and does not overlie the inter-pixel dielectric layer 106. The device cap layer 120 protects the device layer 102 while forming silicide layers (not shown) and an interconnect structure (not shown) over the device layer 102. This prevents crystalline damage to the device layer 102, which may degrade SNR, QE, and other suitable performance metrics of the photodetectors 110. The device cap layer 120 may, for example, be the same material as the substrate 104 and/or may, for example, be or comprise silicon or some other suitable semiconductor material.

In some embodiments, the interface 112 at which the device layer 102 and the substrate 104 directly contact is flat and/or planar across the pixels 108. In some embodiments, a vertical separation between a topmost point of the substrate 104 and a bottommost point of the device layer 102 is about 0, is within about 0.01-0.10%, 0.10-1.00%, or 1.00-5.00% of a height $H_{dl}$ of the device layer 102, is less than about 10, 50, 100, or 200 nanometers, or is otherwise some other suitably small value. In some embodiments, the topmost point and the bottommost point are localized to the pixels 108 and/or to the interface 112. In other embodiments, the topmost point and the bottommost point are global to the entire substrate 104.

In some embodiments, the device layer 102 is or comprise a material with a high absorption coefficient for NIR radiation and/or IR radiation relative to silicon. For example, the device layer 102 may be or comprise germanium. Accordingly, the image sensor may be employed to detect NIR radiation and/or IR radiation. This finds application for ToF imaging and other suitable types of imaging. NIR radiation may, for example, include wavelengths of about 700-1000 nanometers, about 850-940 nanometers, about 940-1310 nanometers, some other suitable wavelengths, or any combination of the foregoing. IR radiation may, for example, include wavelengths of about 1-30 micrometers and/or other suitable wavelengths.

In some embodiments, the device layer 102 is or comprises a material with a small bandgap relative to silicon. Such a small bandgap may, for example, result in a high absorption coefficient for NIR radiation and/or IR radiation. In some embodiments, the device layer 102 is or comprises a material with a high absorption coefficient for NIR radiation and/or IR radiation relative to the substrate 104 and/or the device cap layer 120. In some embodiments, the device layer 102 is or comprises a material with a small bandgap relative to the substrate 104 and/or the device cap layer 120. In some embodiments, the device layer 102 is or comprise carbon, silicon, germanium, or some other suitable group IV element.

In some embodiments, a bulk of the device layer 102 is undoped and/or intrinsic. In some embodiments, a bulk of the device cap layer 120 is undoped and/or intrinsic. In some embodiments, a bulk of the substrate 104 is doped with p-type or n-type dopants. In other embodiments, the bulk of the substrate 104 is undoped and/or intrinsic.

In some embodiments, the inter-pixel dielectric layer 106 has a top surface that is even with or about even with that of the device layer 102. In some embodiments, the inter-pixel dielectric layer 106 has a height $H_{idl}$ that is greater than or equal to the height $H_{dl}$ of the device layer 102. In some embodiments, the inter-pixel dielectric layer 106 extends into the substrate 104 by a non-zero distance $D_1$ for increased electrical isolation. The height $H_{idl}$ of the inter-pixel dielectric layer 106 may, for example, be between about 2-50 micrometers, about 2-26 micrometers, about 25-50 micrometers, or some other suitable thickness value.

Figure 2A:
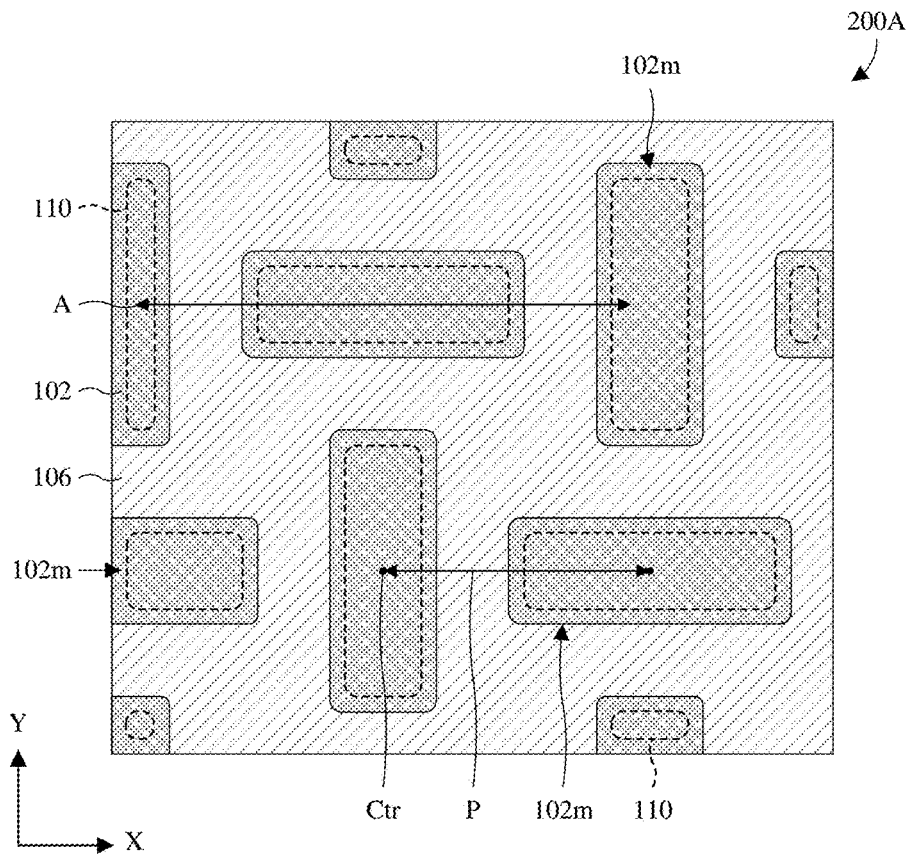
FIGS. 2A and 2B illustrate top layouts of some embodiments of mesa structures defined by the device layer of FIG. 1.
Figure 2B:
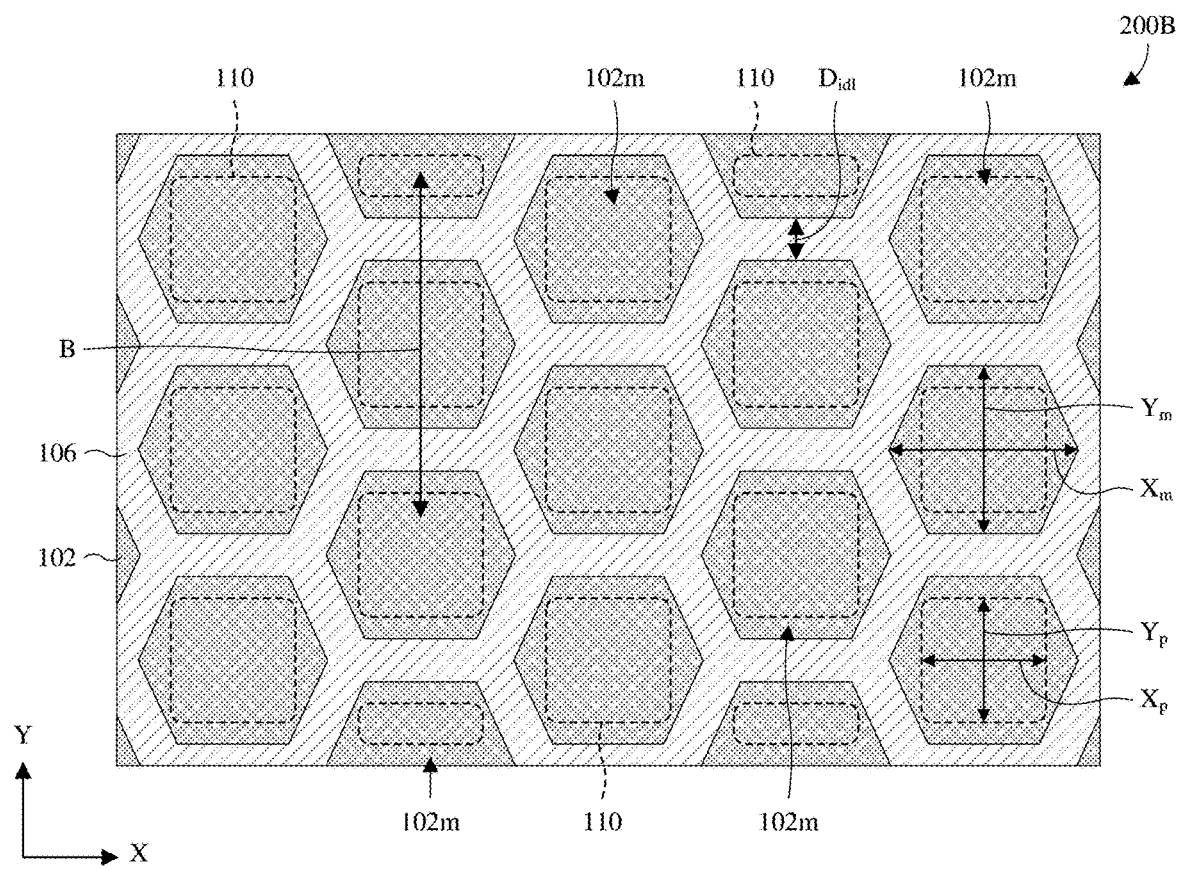

With reference to FIGS. 2A and 2B, top layouts 200A, 200B of some embodiments of the mesa structures 102m of FIG. 1 are provided. Note that the mesa structures 102m and the photodetectors 110 at the peripheries of the top layouts 200A, 200B are only partially illustrated but may, for example, be as their counterparts at the interiors of the top layouts 200A, 200B. Further, note that the first and second contact regions 114, 116 and the contact wells 118 are not shown. The cross-sectional view 100 of FIG. 1 may, for example, be taken along line A and line B respectively in FIGS. 2A and 2B. Other suitable locations are, however, amenable.

In FIG. 2A, the mesa structures 102m have a rectangular shape with rounded corners. In alternative embodiments, the mesa structures 102m have some other suitable layout. Further, the mesa structures 102m are arranged in rows and columns. Along each row and along each column, the mesa structures 102m alternate in a periodic pattern between a first orientation and a second orientation. In a first orientation, a mesa structure is elongated in a first direction (e.g., an X direction). In a second orientation, a mesa structure is elongated in a second direction (e.g., a Y direction) transverse to the first direction. The mesa structures 102m may, for example, alternate between the first and second orientations to improve density while maintaining a uniform pitch P between centers Ctr of the mesa structures 102m in both the first and second directions. This may, for example, improve sensing uniformity of the image sensor.

In FIG. 2B, the mesa structures 102m are hexagonal and arranged in a honeycomb pattern for high density. In alternative embodiments, the mesa structures 102m may have some other suitable polygonal layout (e.g., octagonal, triangular, pentagonal, etc.), a circular layout, or some other suitable layout. Further, the mesa structures 102m have a first dimension $X_m$ in the first direction (e.g., the X direction) and a second dimension $Y_m$ in the second direction (e.g., the Y direction) that are the same or substantially the same. In alternative embodiments, the first and second dimensions $X_m$, $Y_m$ are not the same and are not substantially the same. Two dimensions (e.g., the first and second dimensions $X_m$, $Y_m$) may, for example, be substantially the same when the two dimensions are each within about 1%, 2%, 5%, or 10% of an average of the two dimensions. Other suitable percentages are, however, amenable.

Because the mesa structures 102m are polygonal and the first and second dimensions $X_m$, $Y_m$ of the mesa structures 102m are the same or substantially the same, surface area of the mesa structures 102m may be more efficiently used. For example, the photodetectors 110 may have a first dimension $X_p$ in the first direction and a second dimension $Y_p$ in the second direction that are the same or substantially the same for improved sensing uniformity. As a result, the mesa structures 102m may have a large amount of unused surface area (e.g., surface area unoccupied by the photodetectors 110) if there was a large difference between the first and second dimensions $X_m$, $Y_m$ of the mesa structures 102m. Forming the mesa structures 102m so the first and second dimensions $X_m$, $Y_m$ are the same or substantially the same mitigates this and therefore improves the efficiency with which the surface area of the mesa structures 102m is used.

In some embodiments, the mesa structures 102m have polygonal top layouts that are equilateral or substantially equilateral and/or that are equiangular or substantially equiangular. Substantially equilateral may, for example, mean that sides of a polygon have an average length and each side of the polygon has a length that differs from the average length by less than about 1%, 5%, or 10% of the average length. Substantially equiangular may, for example, mean that corners of a polygon have an average angle and each corner of the polygon has an angle that differs from the average angle by less than about 1%, 5%, or 10% of the average angle. Other meanings are, however, amenable for substantially equilateral and substantially equiangular.

In some embodiments, the photodetectors 110 occupy about 50-100%, about 50-75%, about 75-100%, or some other suitable percentage of the surface area of the mesa structures 102m. If the occupied surface area is too low (e.g., less than about 50% or some other suitable value), QE may be too low and/or density of the mesa structures 102m may be too low.

In some embodiments, the mesa structures 102m have a density of about 40-26000 per squared micrometer, about 40-13020 per squared micrometer, about 13020-26000 per squared micrometer, or some other suitable value. If the density is too low (e.g., less than about 40 per squared micrometer or some other suitable value), image resolution may be too low. If the density is too high (e.g., greater than about 26000 per squared micrometer or some other suitable value), scaling and reliability issues may arise.

In some embodiments, the first dimension $X_m$ of the mesa structures 102m is about 0.1-100 micrometers, about 0.1-50 micrometers, about 50-100 micrometers, or some other suitable value. In some embodiments, the second dimension $Y_m$ of the mesa structures 102m is about 0.1-2 micrometers, about 0.1-1 micrometers, about 1-2 micrometers, or some other suitable value. If the first dimension $X_m$ is too small (e.g., less than about 0.1 micrometers or some other suitable value), and/or the second dimension $Y_m$ is too small (e.g., less than about 0.1 micrometers or some other suitable value), the mesa structures 102m may be too small and QE may be poor. If the first dimension $X_m$ is too large (e.g., more than about 100 micrometers or some other suitable value), and/or the second dimension $Y_m$ is too large (e.g., more than about 2 micrometers or some other suitable value), density of the mesa structures 102m may be too low.

In some embodiments, a distance $D_{idl}$ between the mesa structures 102m is greater than about 100 angstroms, about 200 angstroms, about 500 angstroms, about 1000 angstroms, or some other suitable value. Further, in some embodiments, the distance $D_{idl}$ is about 100-2000 angstroms, about 100-1000 angstroms, about 1000-2000 angstroms, or some other suitable value. If the distance $D_{idl}$ is too small (e.g., less than about 100 angstroms or some other suitable value), leakage current may be high between the mesa structures 102m and QE may be poor. If the distance $D_{idl}$ is too high (e.g., more than about 2000 angstroms or some other suitable value), density of the mesa structures 102m may be too low.

In some embodiments, a first ratio between the first dimension $X_m$ of the mesa structures 102m and the distance $D_{id}$, between the mesa structures 102m is about 2-500, about 10-251, about 251-500, or some other suitable value. In some embodiments, a second ratio between the second dimension $Y_m$ of the mesa structures 102m and the distance $D_{idl}$ between the mesa structures 102m is about 2-200, about 2-101, about 101-200, or some other suitable value. If the first ratio is too small (e.g., less than about 2 or some other suitable value), the first dimension $X_m$ may be too small and/or the distance $D_{idl}$ may be too large. Similarly, if the second ratio is too small (e.g., less than about 2 or some other suitable value), the second dimension $Y_m$ may be too small and/or the distance $D_{idl}$ may be too large. If the first ratio is too large (e.g., more than about 500 or some other suitable value), the first dimension $X_m$ may be too large and/or the distance $D_{idl}$ may be too small. Similarly, if the second ratio is too large (e.g., more than about 200 or some other suitable value), the second dimension $Y_m$ may be too large and/or the distance $D_{idl}$ may be too small.

Figure 3A:
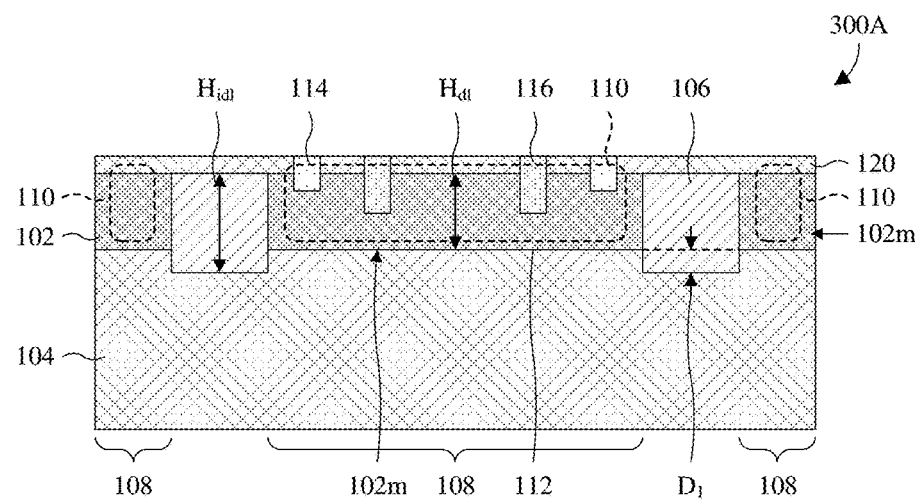
FIGS. 3A-3C illustrate cross-sectional views of some alternative embodiments of the image sensor of FIG. 1 in which contact regions and contact wells are varied.
Figure 3B:
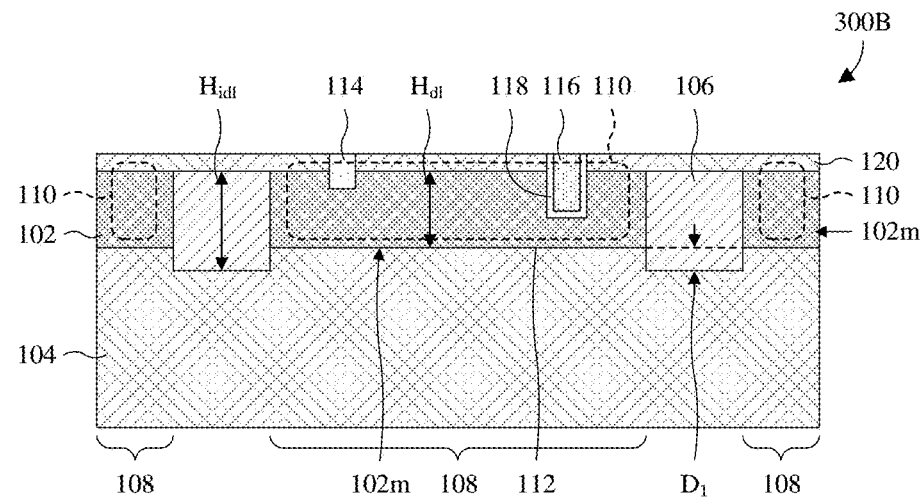
Figure 3C:
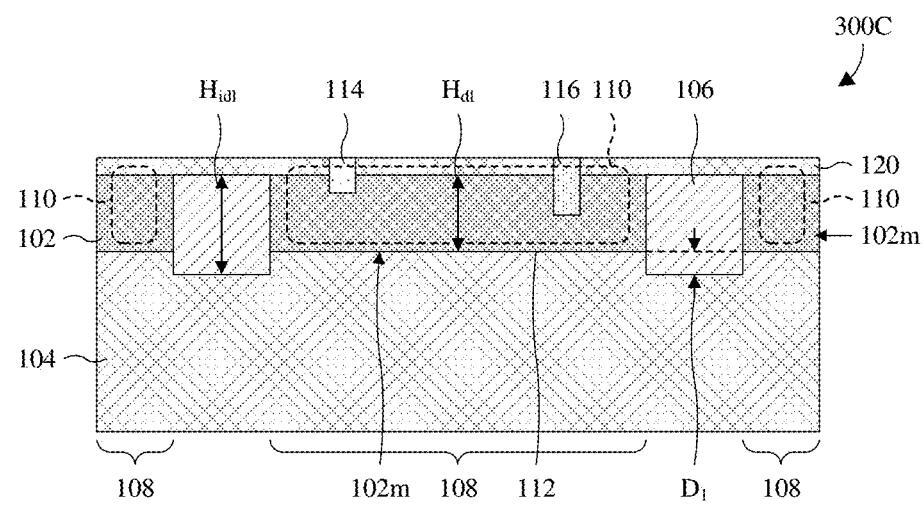

With reference to FIGS. 3A-3C, cross-sectional views 300A-300C of some alternative embodiments of the image sensor of FIG. 1 are provided in which the first and second contact regions 114, 116 and the contact wells 118 are varied. In FIGS. 3A and 3C, the contact wells 118 are omitted. In FIGS. 3B and 3C, the pixels 108 have fewer contact regions. For example, the pixels 108 may each have a single one of the first contact regions 114 and a single one of the second contact regions 116. Further, the first contact regions 114 are localized on first sides of corresponding pixels 108 and the second contact regions 116 are localized on second sides of the corresponding pixels 108 that are respectively opposite the first sides.

Figure 4:
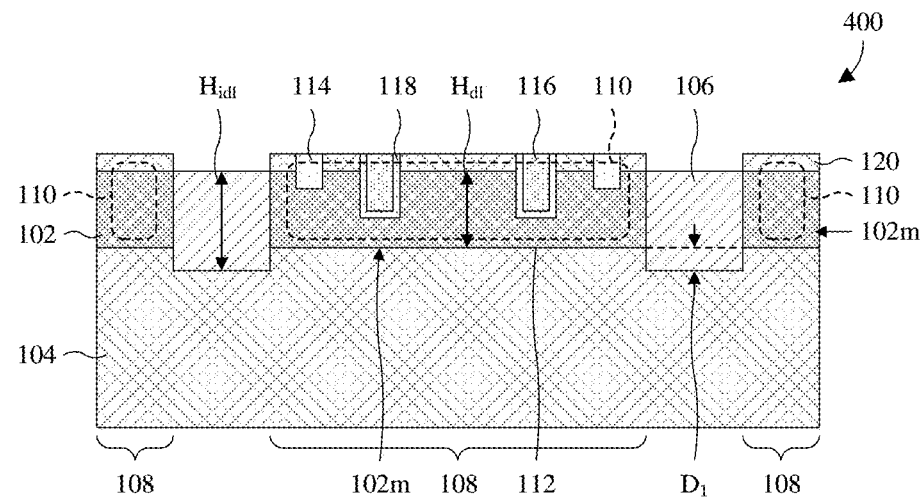
FIG. 4 illustrates a cross-sectional view of some alternative embodiments of the image sensor of FIG. 1 in which a device cap layer is localized to the device layer.

With reference to FIG. 4, a cross-sectional view 400 of some alternative embodiments of the image sensor of FIG. 1 is provided in which the device cap layer 120 is localized to the device layer 102. As such, the inter-pixel dielectric layer 106 is uncovered.

Figure 5:
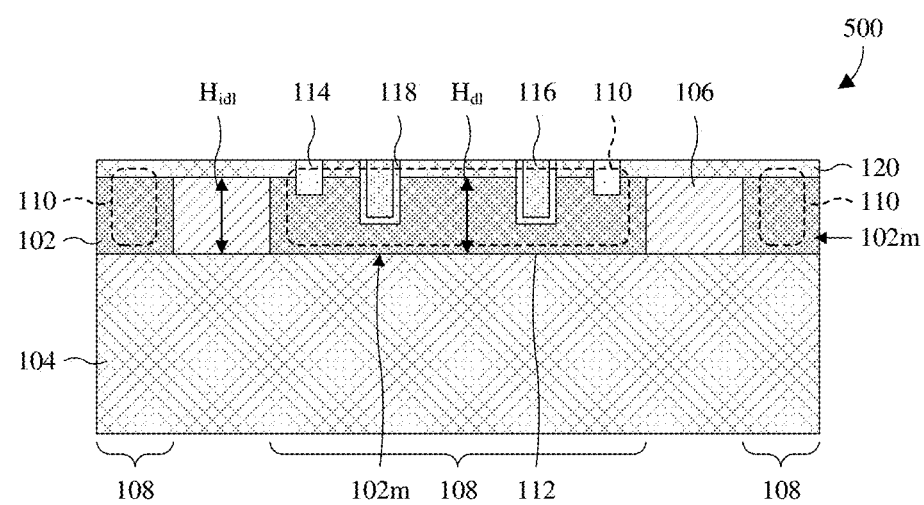
FIG. 5 illustrates a cross-sectional view of some alternative embodiments of the image sensor of FIG. 1 in which an inter-pixel dielectric layer has a bottom surface that is even or about even with a bottom surface of the device layer.

With reference to FIG. 5, a cross-sectional view 500 of some alternative embodiments of the image sensor of FIG. 1 is provided in which the inter-pixel dielectric layer 106 has a bottom surface that is even with or about even with a bottom surface of the device layer 102. Further, in some embodiments, the height $H_{dl}$ of the device layer 102 is the same as or about the same as the height $H_{idl}$ of the inter-pixel dielectric layer 106.

As seen hereafter, a method for forming the image sensor may, for example, comprise: depositing the inter-pixel dielectric layer 106 over the substrate 104; patterning the inter-pixel dielectric layer 106 to form a plurality of cavities exposing the substrate 104; and epitaxially growing the mesa structures 102m in the cavities. Other suitable methods are, however, amenable. For example, the method described above with regard to FIG. 1 may alternatively be employed to form the image sensor. As at FIG. 1, the interface 112 is localized to a bottom surface of the device layer 102 and hence spans a small area. Because of the small area, the density of threading-dislocation defects may be low and crystalline quality may be high.

Because the mesa structures 102m are discrete and separated from each other by the inter-pixel dielectric layer 106, electrical isolation between the mesa structures 102m is high. As a result, the mesa structures 102m may have high density. Further, because top layouts of the mesa structures 102m may be defined by patterning the inter-pixel dielectric layer 106, the top layouts may be chosen for high density. The top layouts may, for example, be square, rectangular, hexagonal, triangular, circular, octagonal, pentagonal, or some other suitable shape. Because density may be high, and because the mesa structures 102m may be defined and isolated from each other with relatively few processing steps, manufacturing costs for the image sensor may be low.

Figure 6:
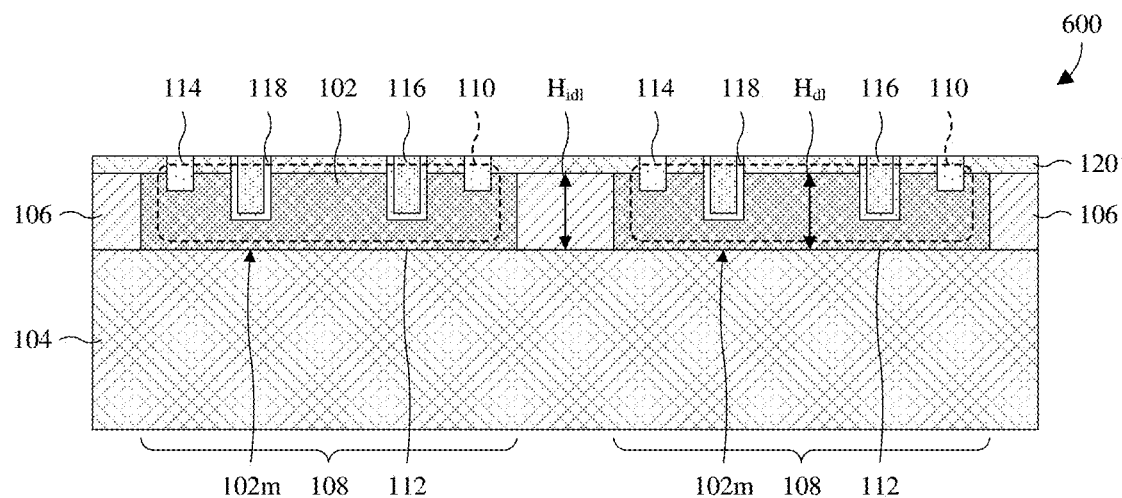
FIG. 6 illustrates an alternative cross-sectional view of some embodiments of the image sensor of FIG. 5 in which two neighboring pixels are fully shown.

With reference to FIG. 6, an alternative cross-sectional view 600 of some embodiments of the image sensor of FIG. 5 is provided in which two neighboring pixels 108 are fully shown. The pixels 108 may, for example, share a common layout.

Figure 7A:
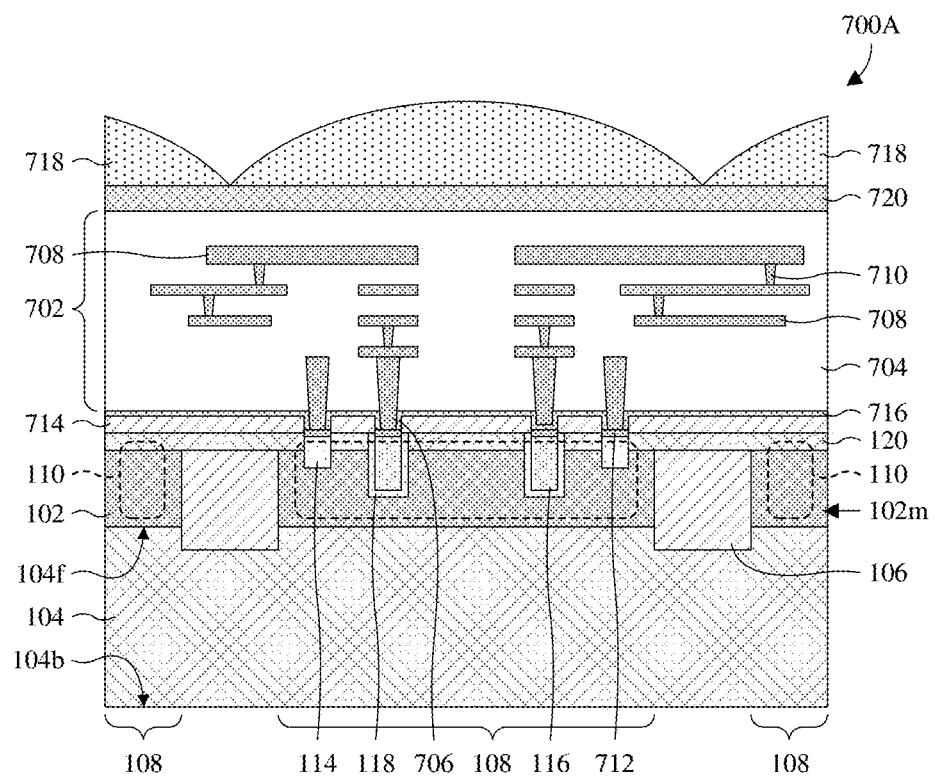
FIGS. 7A and 7B illustrate cross-sectional views of some more detailed embodiments of the image sensor of FIG. 1 in which the image sensor further includes an interconnect structure and is respectively front side illuminated (FSI) and back side illuminated (BSI).
Figure 7B:
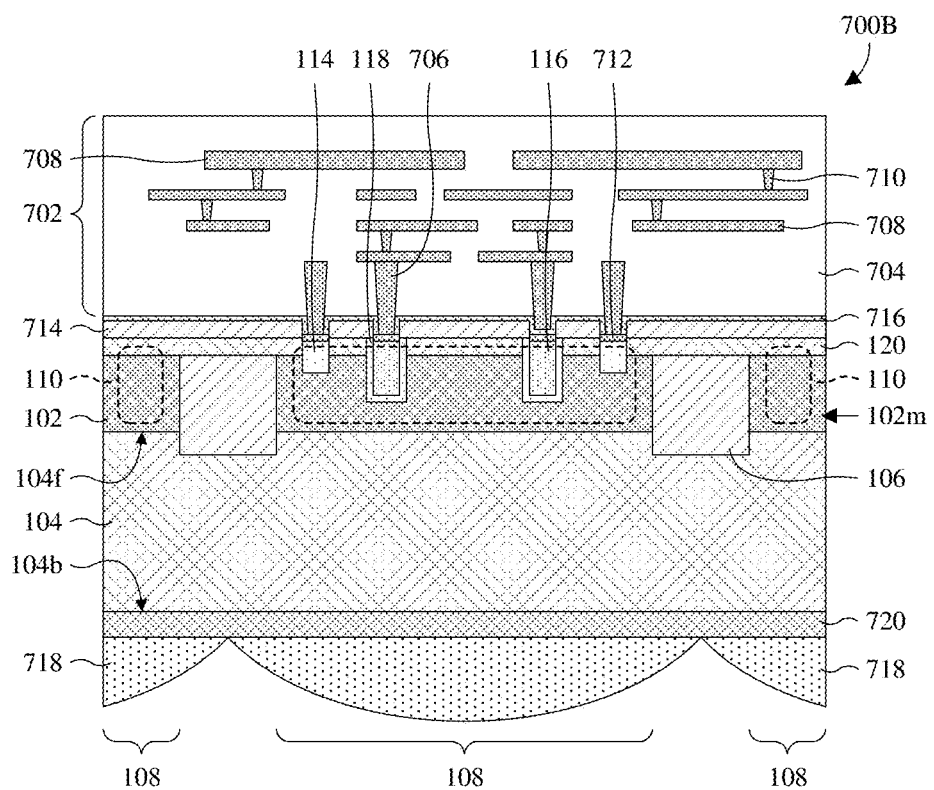

With reference to FIGS. 7A and 7B, cross-sectional views 700A, 700B of some more detailed embodiments of the image sensor of FIG. 1 are provided in which the image sensor further includes an interconnect structure 702 and is respectively front side illuminated (FSI) and back side illuminated (BSI). The interconnect structure 702 overlies the device cap layer 120 on a front side 104f of the substrate 104 and comprises an interconnect dielectric layer 704, a plurality of contacts 706, a plurality of wires 708, and a plurality of vias 710. The interconnect dielectric layer 704 may, for example, be or comprise silicon oxide and/or some other suitable dielectric(s).

The contacts 706, the wires 708, and the vias 710 are in the interconnect dielectric layer 704. The contacts 706 extend from silicide layers 712 on the first and second contact regions 114, 116. The wires 708 and the vias 710 are alternatingly stacked over and electrically coupled to the contacts 706. While some of the contacts 706 do not extend to any wires within the cross-sectional views 700A, 700B, the contacts 706 may, for example, extend to wires outside the cross-sectional views 700A, 700B. The contacts 706, the wires 708, and the vias 710 may, for example, be or comprise metal and/or some other suitable conductive material(s). The silicide layers 712 may, for example, be or comprise nickel silicide and/or some other suitable silicide(s).

A resist protect dielectric (RPD) layer 714 and a contact etch stop layer (CESL) 716 separate the interconnect structure 702 from the device cap layer 120. As seen hereafter, the RPD layer 714 may, for example, define locations at which the silicide layers 712 are formed during formation of the image sensor. Further, the CESL 716 may, for example, serve as an etch stop while forming the contacts 706. The RPD layer 714 may, for example, be or comprise silicon oxide and/or some other suitable dielectric(s). The CESL 716 may, for example, be or comprise silicon nitride and/or some other suitable dielectric(s).

In the FIG. 7A, where the image sensor is FSI, micro lenses 718 overlie the interconnect structure 702 on the front side 104f of the substrate 104. Further, an antireflective layer 720 separates the micro lenses 718 from the interconnect structure 702. In FIG. 7B, where the image sensor is BSI, the micro lenses 718 underlie the substrate 104 on a back side 104b of the substrate 104. Further, the antireflective layer 720 separates the micro lenses 718 from the back side 104b of the substrate 104. The micro lenses 718 correspond to and focus incident radiation on the photodetectors 110.

While FIGS. 2A and 2B illustrate top layouts for the mesa structures 102m in FIG. 1, the top layouts may also be applied to the mesa structures 102m in any one of FIGS. 3A-3C, 4-6, 7A, and 7B. For example, any one of FIGS. 3A-3C, 4-6, 7A, and 7B may be taken along line A of FIG. 2A or line B of FIG. 2B. While FIGS. 3A-3C illustrate variations to the first and second contact regions 114, 116 and the contact wells 118 in the image sensor of FIG. 1, the variations may also be applied to the image sensor in any one of FIGS. 4-6, 7A, and 7B. While FIG. 4 illustrates a variation to the device cap layer 120 in the image sensor of FIG. 1, the variation may also be applied to the image sensor in any one of FIGS. 3A-3C, 5, 6, 7A, and 7B. While FIGS. 5 and 6 illustrate variations to the inter-pixel dielectric layer 106 in the image sensor of FIG. 1, the variations may also be applied to the image sensor in any one of FIGS. 3A-3C, 4, 7A, and 7B. While FIGS. 7A and 7B illustrate the image sensor of FIG. 1 respectively in an FSI configuration and a BSI configuration, the image sensor of any one of FIGS. 3A-3C and 4-6 may have an FSI configuration as in FIG. 7A and a BSI configuration as in FIG. 7B.

Figure 8:
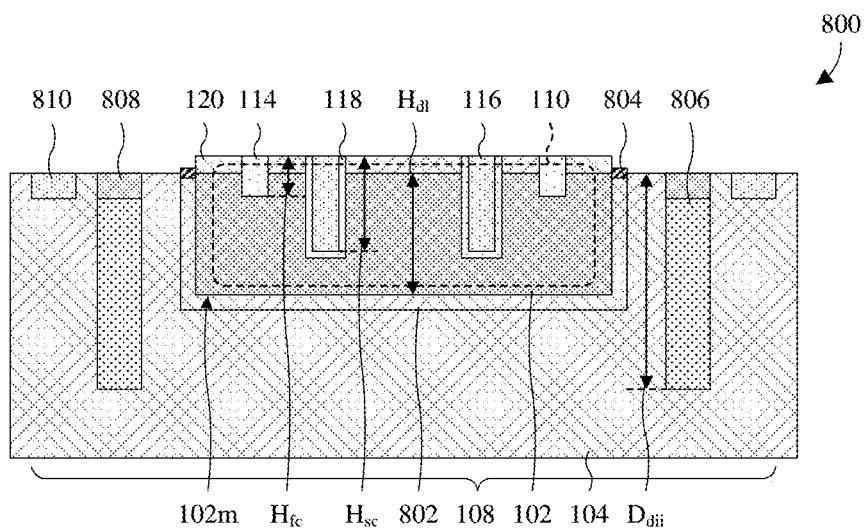
FIG. 8 illustrates a cross-sectional view of some embodiments of an image sensor in which a device layer is recessed into and has a different semiconductor material than a substrate.

With reference to FIG. 8, a cross-sectional view 800 of some embodiments of an image sensor is provided in which a device layer 102 is recessed into a substrate 104 at a pixel 108 and has a different semiconductor material than the substrate 104. The device layer 102 is separated from the substrate 104 by an interlayer 802 that cups an underside of the device layer 102. Further, the device layer 102 accommodates a photodetector 110 that is individual to the pixel 108. The device layer 102 may, for example, be or comprise germanium, silicon germanium, some other suitable semiconductor material(s), or any combination of the foregoing. The substrate 104 may, for example, be or comprise silicon and/or some other suitable semiconductor material.

The interlayer 802 blocks dopants from the substrate 104 from diffusing to the device layer 102. For example, a bulk of the substrate 104 may have a p-type doping and the interlayer 802 may block boron or other suitable p-type dopants from diffusing to the device layer 102 from the substrate 104. Dopants that diffuse to the device layer 102 from the substrate 104 may, for example, create a low resistivity region in the device layer 102 that increases inter-pixel leakage current, which may degrade SNR, QE, and other suitable performance metrics of the photodetector 110. The interlayer 802 is an undoped semiconductor material different than that of the device layer 102 and may, for example, be or comprise silicon and/or some other suitable semiconductor material. Further, in some embodiments, the interlayer 802 is or comprises the same semiconductor material as the substrate 104. For example, the interlayer 802 and the substrate 104 may both be silicon, and/or the device layer 102 may be germanium or silicon germanium. Other suitable semiconductor materials are, however, amenable.

An interlayer cap layer 804 is atop the interlayer 802. The interlayer cap layer 804 may, for example, be an oxide of the interlayer 802. For example, the interlayer cap layer 804 may be or comprise silicon oxide and the interlayer 802 may be or comprise silicon. Other suitable materials are, however, amenable.

In some embodiments, the interlayer cap layer 804 is formed during a method for forming and cleaning the device layer 102. Such a method may, for example, comprise epitaxially growing the device layer 102 in a cavity in the substrate 104, planarizing the device layer 102 to flatten a top surface of the device layer 102, and cleaning errant particles from the top surface with a cleaning solution comprising ozone. Other suitable methods and/or cleaning solutions are, however, amenable. Cleaning using ozone may, for example, lead to formation of oxide (e.g., silicon oxide or some other suitable oxide) on the interlayer 802 and hence formation of the interlayer cap layer 804.

As seen hereafter, the interlayer cap layer 804 may serve as a barrier while forming the image sensor to prevent the device layer 102 from extruding out of the cavity during thermal processing performed after the cleaning. If the device layer 102 were to extrude out of the cavity, the extruded portion may be unprotected by the device cap layer 120 and hence the device layer 102 may be susceptible to damage during subsequent processing. For example, during a subsequent silicide process, etchants used to remove excess metal may come in contact with and etch into the device layer 102 through the extruded portions of the device layer 102. This, in turn, may lead to formation of a cavity in the device layer 102 and may hence damage the crystalline lattice of the device layer 102. Therefore, by preventing extrusion of the device layer 102, the interlayer cap layer 804 may prevents crystalline damage to the device layer 102 and may hence enhance SNR, QE, and other suitable performance metrics of the photodetector 110.

The photodetector 110 includes first contact regions 114, second contact regions 116, and contact wells 118. The first and second contact regions 114, 116 and the contact wells 118 are doped semiconductor regions in the device layer 102. The first contact regions 114 have a first doping type, and the second contact regions 116 and the contact wells 118 have a second doping type opposite the first doping type. The photodetector 110 may, for example, be or comprise a PIN photodiode or some other suitable type of photodiode.

A device cap layer 120 overlies the device layer 102 and may, for example, be or comprise silicon and/or some other suitable semiconductor material(s). In some embodiments, the device cap layer 120 is the same material as the substrate 104 and/or the interlayer 802. The device cap layer 120 protects the device layer 102 while forming silicide layers (not shown) and an interconnect structure (not shown) over the device layer 102. This prevents crystalline damage to the device layer 102, which may degrade SNR, QE, and other suitable performance metrics of the photodetector 110.

In some embodiments, a deep implant isolation (DII) region 806 and a shallow implant isolation (SII) region 808 are in the substrate 104 to provide electrical isolation between the pixel 108 and neighboring pixels (not shown). The DII region 806 has a pair of segments respectively on opposite sides of the pixel 108. In some embodiments, the DII region 806 extends in a closed path (not fully visible within the cross-sectional view 800) along a boundary of the pixel 108 to surround the pixel 108. The SII region 808 overlies the DII region 806 respectively on the opposite sides of the pixel 108. In some embodiments, the SII region 808 extends in a closed path (not fully visible within the cross-sectional view 800) along the boundary of the pixel 108 to surround the pixel 108 and/or has the same top layout as the DII region 806. The DII region 806 and the SII region 808 are doped regions of the substrate 104 sharing a doping type, and the SII region 808 has a greater doping concentration than the DII region 806. In some embodiments, the shared doping type is the same as a doping type of a bulk of the substrate 104. In other embodiments, the shared doping type is opposite that of the bulk of the substrate 104.

In some embodiments, shallow substrate implant (SSI) regions 810 are in the substrate 104 and are respectively on opposite sides of the pixel 108. Further, the DII region 806 and the SII region 808 are between the SSI regions 810. The SSI regions 810 are doped regions of the substrate 104 sharing a doping type with a bulk of the substrate 104 but having a greater doping concentration than the bulk of the substrate 104.

In some embodiments, the device layer 102 is or comprises a material with a high absorption coefficient for NIR radiation and/or IR radiation relative to the interlayer 802 and/or a small bandgap relative to the interlayer 802. In some embodiments, a height Hal of the device layer 102 is about 0.5-1.0 micrometers, about 1.1 micrometers, about 1-2 micrometers, about 2-5 micrometers, about 5-10 micrometers, or some other suitable values.

In some embodiments, a depth $D_{dii}$ of the DII region 806 is about 0.5-2 micrometers, about 0.5-1.25 micrometers, about 1.25-2 micrometers, or some other suitable value. If the depth $D_{dii}$ is too small (e.g., less than about 0.5 micrometers or some other suitable value), the DII region 806 may provide poor electrical isolation structure between the pixel 108 and neighboring pixels. If the depth $D_{dii}$ of the DII region 806 is too large (e.g., more than about 2 micrometers or some other suitable value), process difficulties from implanting to such a depth may arise.

In some embodiments, a height $H_{fc}$ of the first contact region 114 is about 5-20%, about 5-12%, about 12-20%, or some other suitable percentage of the height $H_{dl}$ of the device layer 102. Similarly, in some embodiments, a height $H_{sc}$ of the second contact region 116 is about 5-20%, about 5-12%, about 12-20%, or some other suitable percentage of the height $H_{dl}$ of the device layer 102. If the percentage is too small (e.g., less than about 5% or some other suitable percentage) for either of the first and second contact regions 114, 116, the contact region may fail to extend to the device layer 102. If the percentage is too high (e.g., greater than about 20% or some other suitable percentage) for either of the first and second contact regions 114, 116, the contact region may get too close to a bottom boundary of the device layer 102 and leakage current may be high.

While FIG. 8 illustrates a single pixel 108, it is to be appreciated that additional pixels are amenable in some embodiments. Each of these additional pixels may, for example, be as the pixel 108 is illustrated and described and/or each of these additional pixels may, for example, have an individual portion of the device layer 102. As above, portions of the device layer 102 individual to pixels may more specifically be referred to as mesa structures 102m.

Figure 9:
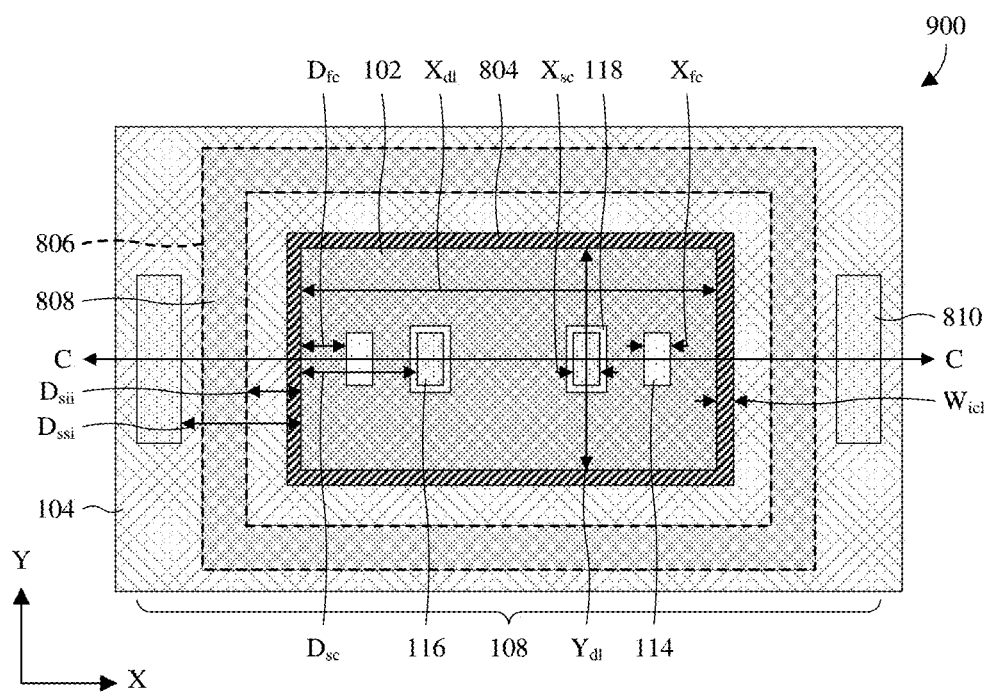
FIG. 9 illustrates a top layout of some embodiments of a pixel in the image sensor of FIG. 8.

With reference to FIG. 9, a top layout 900 of some embodiments of the pixel 108 in the image sensor of FIG. 8 is provided. The image sensor of FIG. 8 may, for example, be take along line C. The interlayer cap layer 804 extends laterally in a closed path around the device layer 102. Further, the interlayer cap layer 804 has a width $W_{icl}$, whereas the device layer 102 has a first dimension $X_{dl}$ and a second dimension $Y_{dl}$. In some embodiments, the width $W_{icl}$ may, for example, be about 0.1-1.0, about 0.1-0.5, or about 0.5-1.0 percent of an average of the first and second dimensions $X_{dl}$, $Y_{dl}$. For example, $W_{icl}$ may be equal to $0.1\%*(X_{dl}+Y_{dl})/2$ to $1.0\%*(X_{dl}+Y_{dl})/2$. In other embodiments, the width $W_{icl}$ has some other suitable value.

The SII region 808 extends laterally along a periphery of the pixel 108 in a closed path to surround the pixel 108 and to separate the pixel 108 from neighboring pixels. Further, the DII region 806 (shown in phantom) underlies the SII region 808 (when viewed in cross section) and also extends laterally in the closed path to surround the pixel 108 and to separate the pixel 108 from neighboring pixels. The SSI regions 810 are respectively on opposite sides of the SII region 808. The DII region 806, the SII region 808, the SSI regions 810, or any combination of the foregoing may, for example, have other suitable locations and/or layouts in alternative embodiments.

In some embodiments, the first dimension $X_{dl}$ of the device layer 102 is greater than about 1 micrometer, between about 1-5 micrometers, or some other suitable value. If the first dimension $X_{dl}$ is too small (e.g., less than about 1 micrometer or some other suitable value), the device layer 102 may be small and QE may be low. If the first dimension $X_{dl}$ is too large (e.g., more than about 5 micrometers or some other suitable value), pixel density may be too low and hence image resolution may be too low. In some embodiments, a dimension $X_{fc}$ of the first contact region 114 and/or a dimension $X_{sc}$ of the second contact region 116 is/are less than about 25% of the first dimension $X_{dl}$ of the device layer 102. Other suitable percentages are, however, amenable.

In some embodiments, the first dimension $X_{dl}$ of the device layer 102 is about 80-95%, about 80-88%, about 88-95%, or some other suitable percentage of the height $H_{dl}$ of the device layer 102 (see, e.g., FIG. 8). If the percentage is too low (e.g., less than about 80% or some other suitable percentage), the height $H_{dl}$ of the device layer 102 may be too large and/or the first dimension $X_{dl}$ may be too small. If the height $H_{dl}$ of the device layer 102 is too large, the device layer 102 may take too long to epitaxially grow and throughput may be significantly impacted. If the first dimension $X_{dl}$ is too small, the device layer 102 may be too small and hence QE may be low.

In some embodiments, a ratio of the first dimension $X_{dl}$ to the second dimension $Y_{dl}$ is about 1-3, about 1-2, about 2-3, or some other suitable value. The device layer 102 and the SII region 808 are separated by a distance $D_{sii}$. Further, the device layer 102 and the SSI region 810 are separated by a distance $D_{ssi}$. In some embodiments, a ratio of the distance $D_{sii}$ to the distance $D_{ssi}$ is about 0.4-1, about 0.4-0.7, about 0.7-1, or some other suitable value. An edge of device layer 102 and the first contact region 114 are separated by a distance $D_{fc}$. Further, the edge of the device layer 102 and the second contact region 116 are separated by a distance $D_{sc}$. In some embodiments, a ratio of the distance $D_{fc}$ to the distance $D_{sc}$ is about 0.7-1.1, about 0.7-0.9, about 0.9-1.1, or some other suitable value.

Figure 10A:
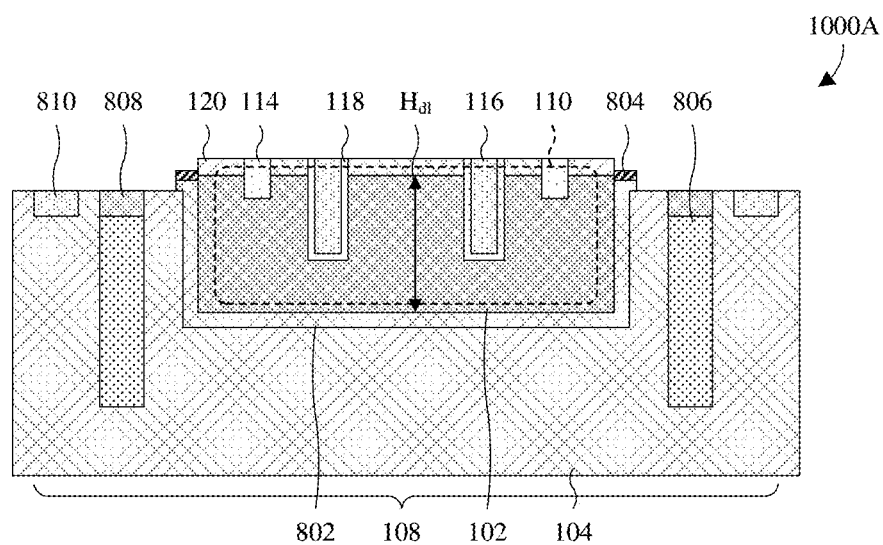
FIGS. 10A-10F illustrate cross-sectional views of some alternative embodiments of the image sensor of FIG. 8 in which constituents of the image sensor are varied.
Figure 10B:
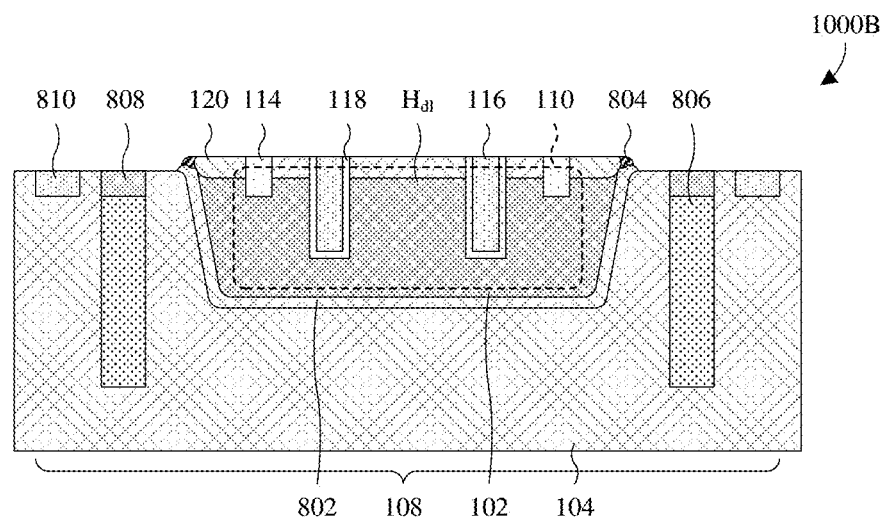

With reference to FIGS. 10A-10F, cross-sectional views 1000A-1000F of some alternative embodiments of the image sensor of FIG. 8 are provided in which constituents are varied. In FIGS. 10A and 10B, the interlayer 802 wraps around top corners of the substrate 104. Further, in FIG. 10B, sidewalls of the device layer 102 are slanted and corners of the interlayer 802, the interlayer cap layer 804, the device layer 102, and the device cap layer 120 are rounded.

Figure 10C:
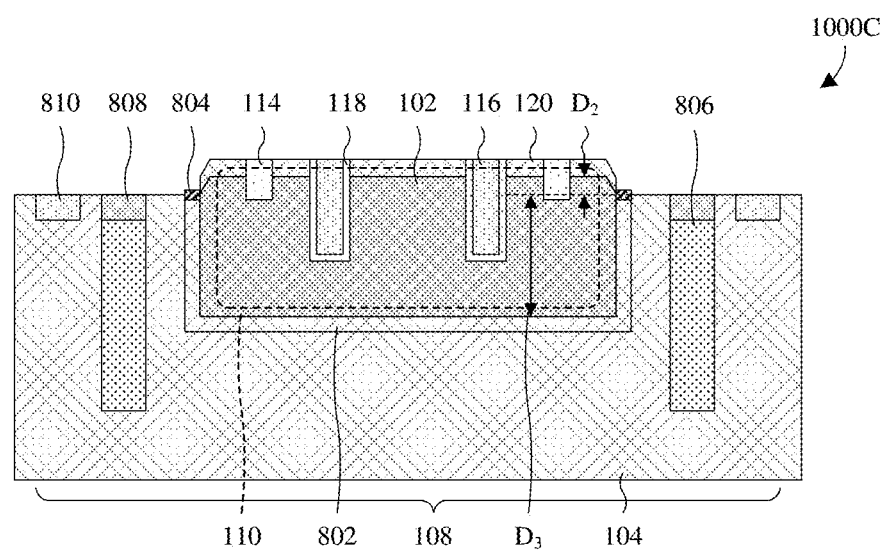
Figure 10D:
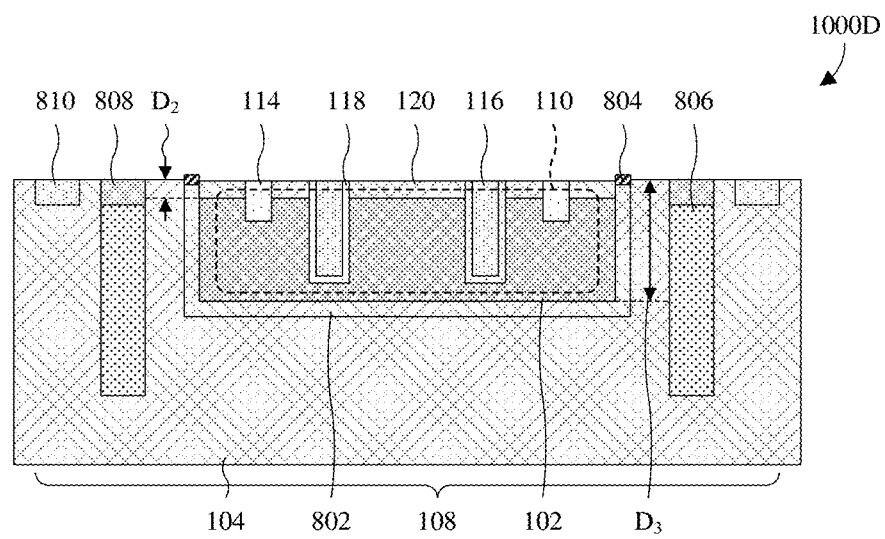

In FIGS. 10C and 10D, a top surface of the device layer 102 is vertically offset from a top surface of the substrate 104 by an offset distance $D_2$. In FIG. 10C, the top surface of device layer 102 is elevated relative to the top surface of the substrate 104 by the offset distance $D_2$. In FIG. 10D, the top surface of device layer 102 is recessed relative to the top surface of the substrate 104 by the offset distance $D_2$. In some embodiments, the offset distance $D_2$ is small. If the offset distance $D_2$ is large, the topography at the device layer 102 may lead to non-uniformity and hence unreliability with processing performed after forming the device layer 102. The offset distance $D_2$ may, for example, be small if within about 1, 2, 5, 10, or 30 percent of a depth $D_3$ and large otherwise. Other suitable percentages are, however, amenable. The depth $D_3$ corresponds to a depth to which the device layer 102 extends into the substrate 104 and may, for example, be measured from the top surface of the substrate 104 to a bottom surface of the device layer 102. In alternative embodiments, the offset distance $D_2$ and the depth $D_3$ are measured from the top surface of the interlayer 802 respectively to the top surface of the device layer 102 and the bottom surface of the device layer 102. Such alternative embodiments may, for example, arise when the top surface of the interlayer 802 is elevated relative to the top surface of the substrate 104.

Figure 10E:
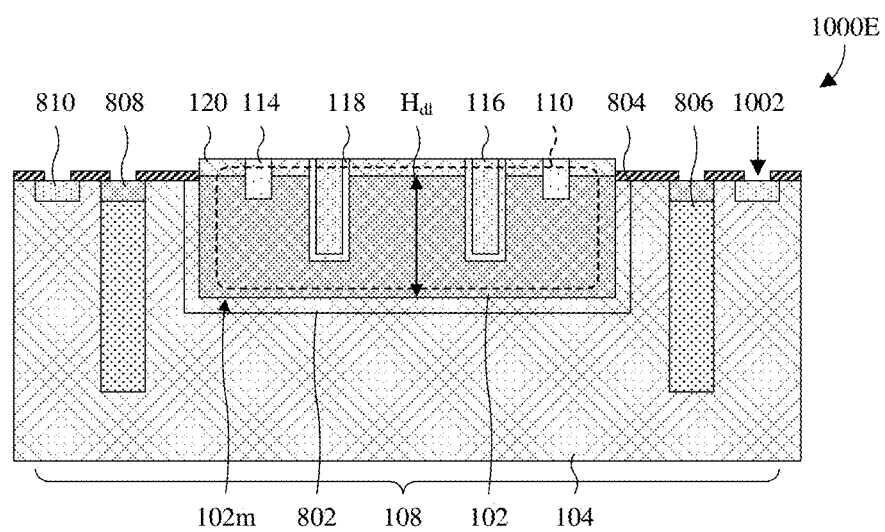
Figure 10F:
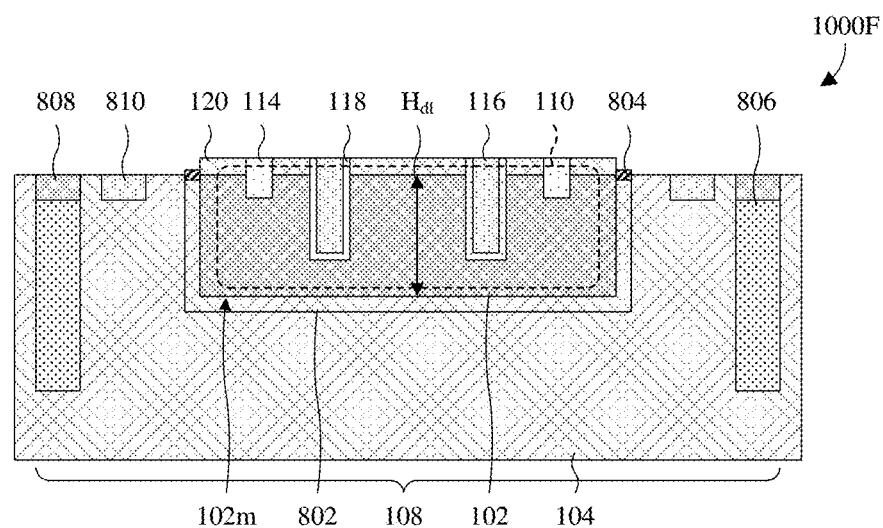

In FIG. 10E, the interlayer cap layer 804 covers the substrate 104 off to sides of the device layer 102 and off to sides of the interlayer 802. Further, the interlayer cap layer 804 defines openings 1002 overlying the DII region 806, the SII region 808, and the SSI region 810. In FIG. 10F, the SSI regions 810 are surrounded by the DII region 806 and the SII region 808.

Figure 11:
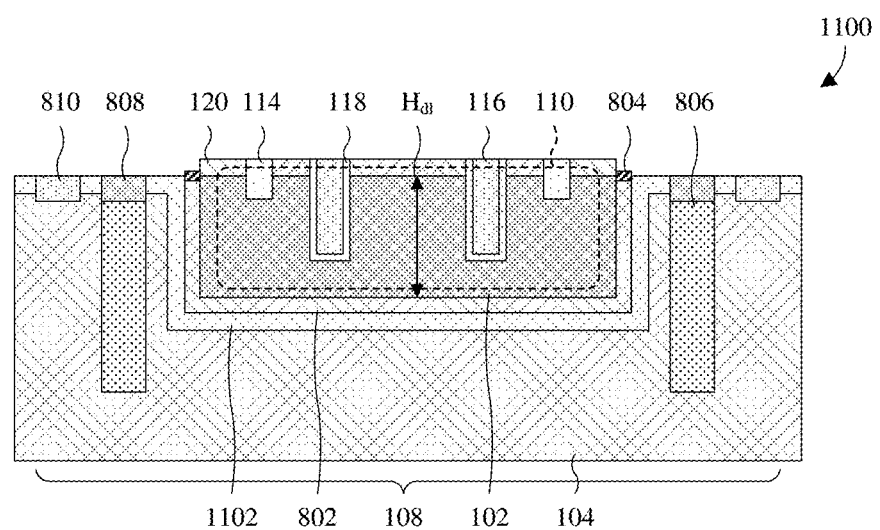
FIG. 11 illustrates a cross-sectional view of some alternative embodiments of the image sensor of FIG. 8 in which a substrate implant region lines the device layer.

With reference to FIG. 11, a cross-sectional view 1100 some alternative embodiments of the image sensor of FIG. 8 is provided in which a substrate implant region 1102 is in the substrate 104 and lines the device layer 102. The substrate implant region 1102 has the same doping type as, but a higher doping concentration than, a bulk of the substrate 104. For example, the substrate implant region 1102 and the bulk of the substrate 104 may, for example, be P-type or N-type. The substrate implant region 1102 may, for example, reduce leakage current from crystalline damage at a boundary between the device layer 102 and the substrate 104.

The interlayer 802 separates the device layer 102 from the substrate implant region 1102 and may, for example, prevent dopants of the substrate implant region 1102 from diffusing to the device layer 102. Dopants that diffuse to the device layer 102 may, for example, create a low resistivity region in the device layer 102 that increases leakage current, which would be counter to the role of the substrate implant region 1102.

Figure 12:
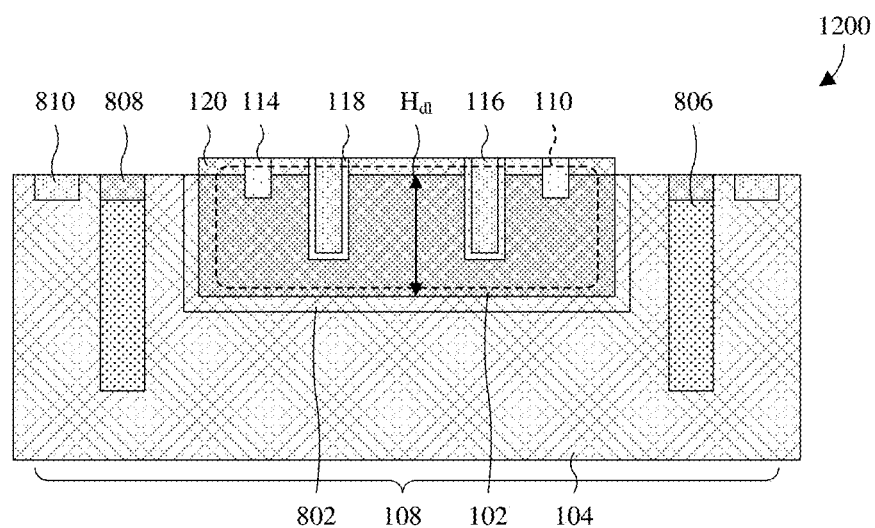
FIG. 12 illustrates a cross-sectional view of some alternative embodiments of the image sensor of FIG. 8 in which an interlayer cap layer is omitted.

With reference to FIG. 12, a cross-sectional view 1200 of some alternative embodiments of the image sensor of FIG. 8 is provided in which the interlayer cap layer 804 is omitted.

Figure 13:
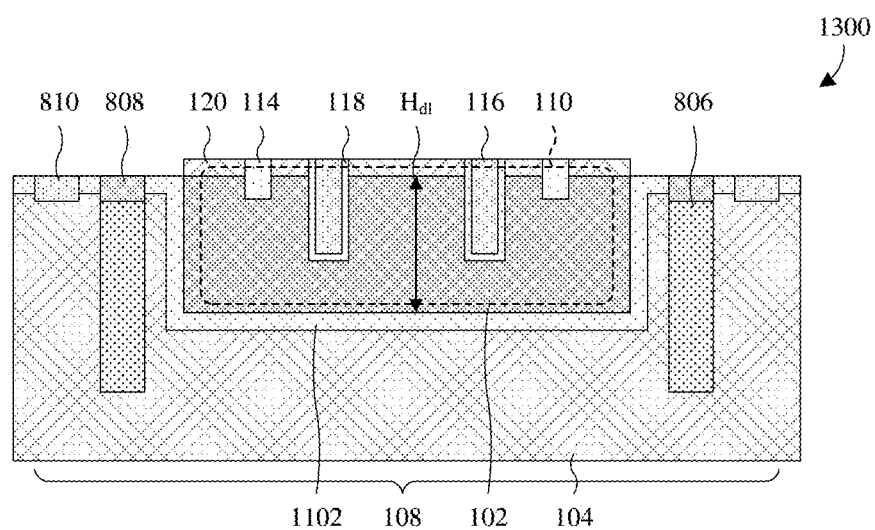
FIG. 13 illustrates a cross-sectional view of some alternative embodiments of the image sensor of FIG. 12 in which an interlayer is omitted.

With reference to FIG. 13, a cross-sectional view 1300 of some alternative embodiments of the image sensor of FIG. 12 is provided in which the interlayer 802 is omitted. Further, the substrate implant region 1102 is in the substrate 104 and lines the device layer 102. The substrate implant region 1102 may, for example, reduce leakage current from crystalline damage at a boundary between the device layer 102 and the substrate 104.

Figure 14A:
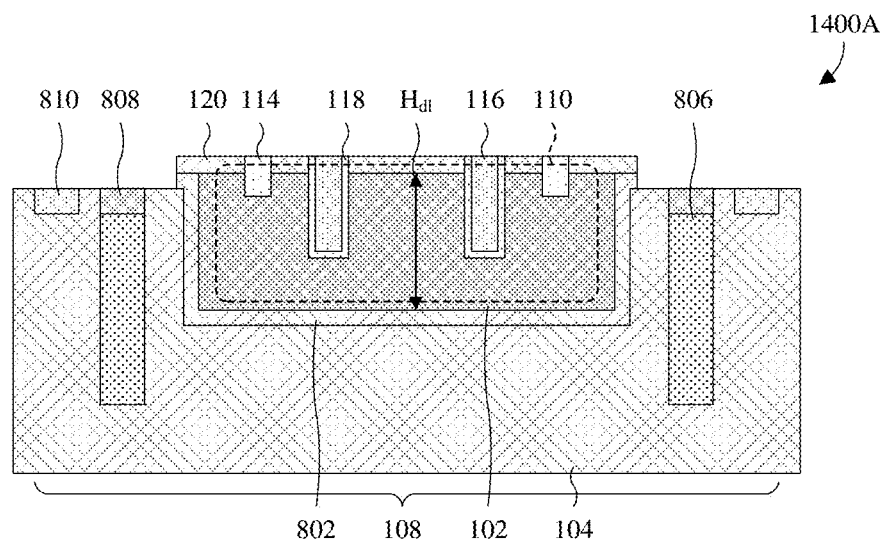
FIGS. 14A-14D illustrate cross-sectional views of some alternative embodiments of the image sensor of FIG. 12 in which constituents of the image sensor are varied.
Figure 14B:
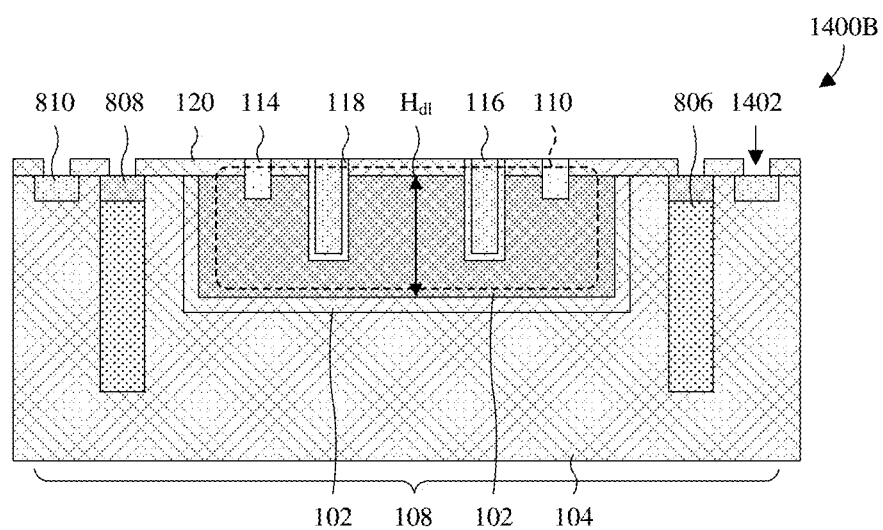
Figure 14C:
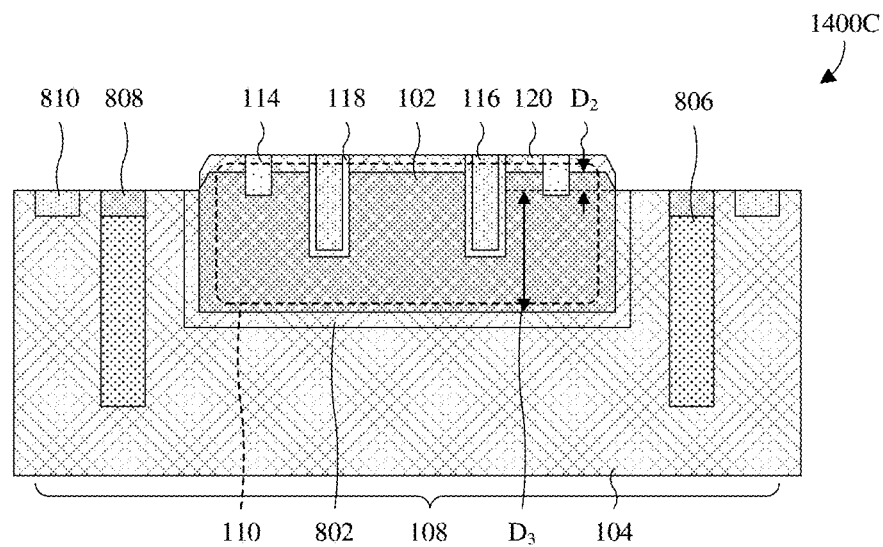
Figure 14D:
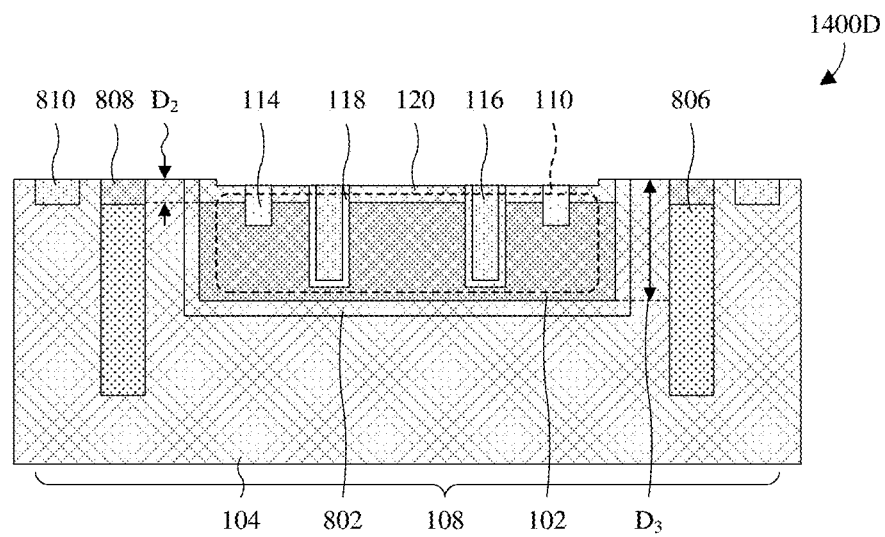

With reference to FIGS. 14A-14D, cross-sectional views 1400A-1400D of some alternative embodiments of the image sensor of FIG. 12 are provided in which constituents are varied. In FIG. 14A, the device cap layer 120 wraps around top corners of the substrate 104. In FIG. 14B, the device cap layer 120 blankets the substrate 104 to cover the substrate 104 off to sides of the device layer 102. Further, the device cap layer 120 defines openings 1402 overlying the DII region 806, the SII region 808, and the SSI region 810. In FIGS. 14C and 14D, a top surface of the device layer 102 is vertically offset from a top surface of the substrate 104 by a distance $D_2$ respectively as described with regard to FIGS. 10C and 10D.

Figure 15:
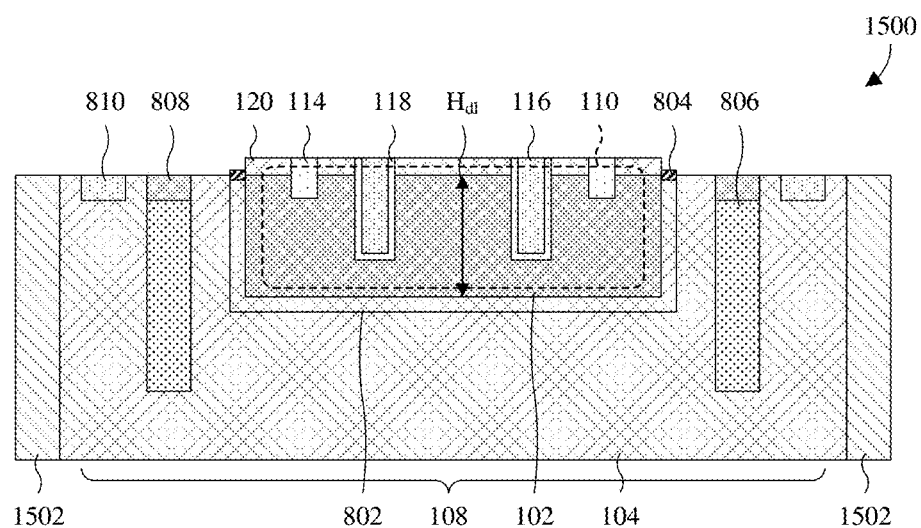
FIG. 15 illustrates a cross-sectional view of some embodiments of the image sensor of FIG. 8 in which a substrate dielectric layer is on outermost sidewalls of the substrate.

With reference to FIG. 15, a cross-sectional view 1500 of some embodiments of the image sensor of FIG. 8 is provided in which a substrate dielectric layer 1502 has a pair of segments lining outermost sidewalls of the substrate 104 that are respectively on opposite sides of the substrate 104. While a single pixel 108 is between the segments, it is to be appreciated that additional pixels may be between the segments. Each of these additional pixels may, for example, be as their counterpart is illustrated and described.

In some embodiments, the substrate 104 is entirely between the segments of the substrate dielectric layer 1502. In some embodiments, the substrate dielectric layer 1502 extends in a closed path (not visible in the cross-sectional view 1500) along the boundary of the substrate 104 to entirely surround the substrate 104. In some embodiments, the substrate dielectric layer 1502 has a same height as the substrate 104. In some embodiments, the substrate dielectric layer 1502 has a top surface that is even or about even with that of the substrate 104 and/or has a bottom surface that is even or about even with that of the substrate 104. The substrate dielectric layer 1502 may, for example, be or comprise silicon oxide and/or some other suitable dielectrics.

As seen hereafter, the device layer 102 is formed by epitaxial growth. The substrate dielectric layer 1502 protects sidewall surfaces of the substrate 104 so material of the device layer 102 does not epitaxially grow on the sidewalls. Further, in some embodiments, the substrate dielectric layer 1502 is on and protects a bottom surface of the substrate 104 during the epitaxial growth so material of the device layer 102 does not epitaxially grow on the bottom surface. In at least some of these embodiments, portions of the device layer 102 on the bottom surface may be subsequently removed by a planarization or some other suitable planarization process.

Figure 16A:
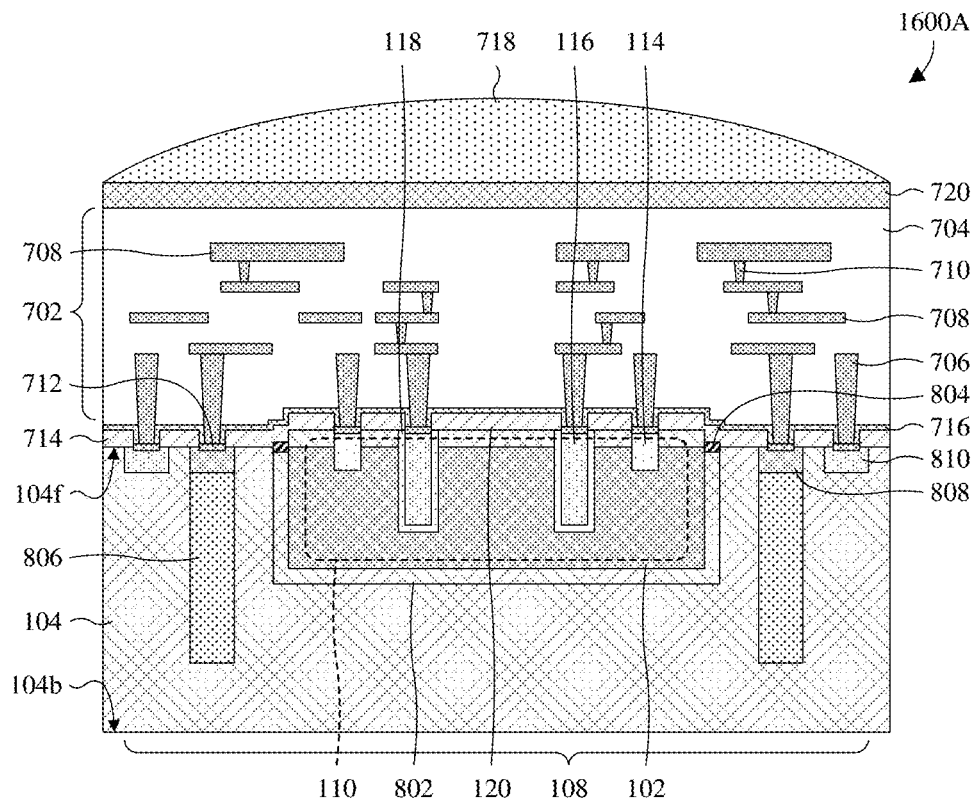
FIGS. 16A and 16B illustrate cross-sectional views of some more detailed embodiments of the image sensor of FIG. 8 in which the image sensor further includes an interconnect structure and is respectively FSI and BSI.
Figure 16B:
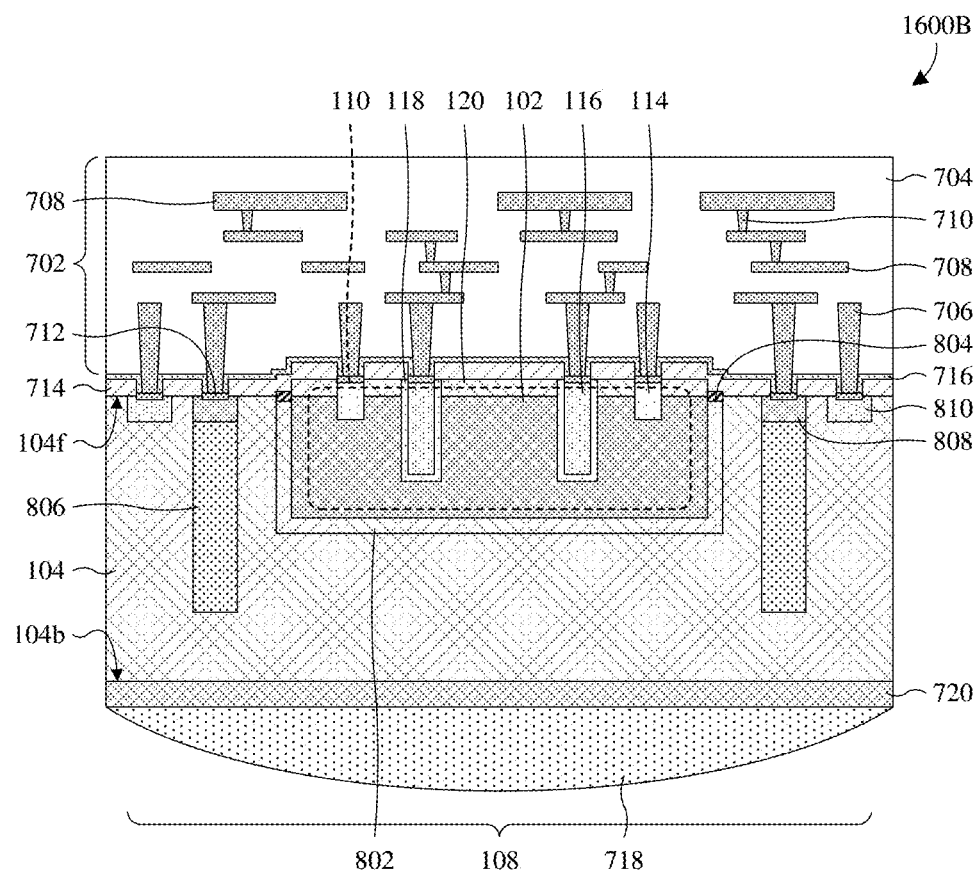

With reference to FIGS. 16A and 16B, cross-sectional views 1600A, 1600B of some more detailed embodiments of the image sensor of FIG. 8 are provided in which the image sensor further includes an interconnect structure 702 and is respectively FSI and BSI. The interconnect structure 702 overlies the device cap layer 120 on a front side 104f of the substrate 104 and comprises an interconnect dielectric layer 704, a plurality of contacts 706, a plurality of wires 708, and a plurality of vias 710. Further, the interconnect structure 702 is separated from the device cap layer 120 by a RPD layer 714 and a CESL 716. Silicide layers 712 are on the first and second contact regions 114, 116, the SII region 808, and the SSI regions 810 and provide ohmic coupling respectively to the contacts 706. The interconnect structure 702, the silicide layers 712, the RPD layer 714, and the CESL 716 may, for example, be as described with regard to FIGS. 7A and 7B.

In the FIG. 16A, where the image sensor is FSI, a micro lens 718 and an antireflective layer 720 overlie the interconnect structure 702 on the front side 104f of the substrate 104. In FIG. 16B, where the image sensor is BSI, the micro lens 718 and the antireflective layer 720 underlie the substrate 104 on a back side 104b of the substrate 104.

While FIGS. 8, 9, 10A-10E, 11-13, 14A-14D, 15, 16A, and 16B illustrate the first and second contact regions 114, 116 and the contact wells 118 configured according to embodiments at FIG. 1, the first and second contact regions 114, 116 and the contact wells 118 may alternatively be configured according to embodiments at any one of FIGS. 3A-3C or according to other suitable embodiments. While FIG. 9 illustrates a top layout for the image sensor of FIG. 8, the top layout may also be applied to the image sensor in any one of FIGS. 10A-10D, 10F, 11, 15, 16A, and 16B. For example, any one of FIGS. 10A-10D, 10F, 11, 15, 16A, and 16B may be taken along line C of FIG. 9. While FIG. 10E illustrates a variation to the image sensor of FIG. 8 in which the interlayer cap layer 804 overlies the SII region 808 and the SSI regions 810, this variation may be applied to the image sensor in any one of FIGS. 10A-10D, 10F, 11, 15, 16A, and 16B. While FIG. 11 illustrates a variation to the image sensor of FIG. 8 in which the image sensor further comprises the substrate implant region 1102, any one of FIGS. 10A-10E, 12, 14A-14D, 15, 16A, and 16B may also have the substrate implant region 1102. While FIG. 12 illustrates a variation to the image sensor of FIG. 8 in which the image sensor omits the interlayer cap layer 804, any one of FIGS. 9, 10A-10E, 11, 15, 16A, and 16B may also omit the interlayer cap layer 804. While FIG. 13 illustrates variations to the image sensor of FIG. 12 in which the image sensor further comprises the substrate implant region 1102 and the interlayer 802 is omitted, these variations may also be applied to the image sensor in any one of FIGS. 14A-14D. While FIG. 15 illustrates variations to the image sensor of FIG. 8 in which the image sensor further comprises a substrate dielectric layer 1502, the image sensor in any one of FIGS. 10A-10E, 11-13, 14A-14D, 16A, and 16B may also include the substrate dielectric layer 1502. While FIGS. 16A and 16B illustrate the image sensor of FIG. 8 respectively in an FSI configuration and a BSI configuration, the image sensor of any one of FIGS. 10A-10E, 11-13, 14A-14D, and 15 may have an FSI configuration as in FIG. 16A and a BSI configuration as in FIG. 16B.

With reference to FIGS. 17-23, a series of cross-sectional views 1700-2300 of some embodiments of a method for forming an image sensor is provided in which a device layer overlies and has a different semiconductor material than a substrate. The method may, for example, be employed to form the image sensor in any one of FIGS. 1, 3A-3C, 4-6, 7A, and 7B or may, for example, be employed to form some other suitable image sensor.

Figure 17:
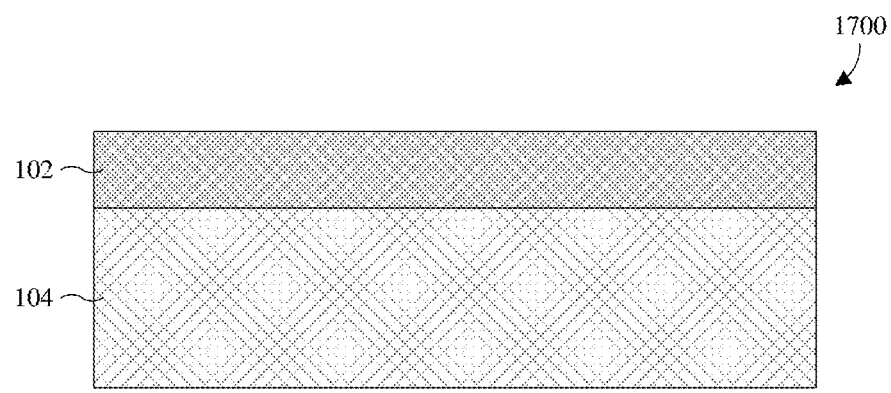
FIGS. 17-23 illustrate a series of cross-sectional views of some embodiments of a method for forming an image sensor in which a device layer overlies and has a different semiconductor material than a substrate.

As illustrated by the cross-sectional view 1700 of FIG. 17, a device layer 102 is epitaxially grown over a substrate 104. The device layer 102 and the substrate 104 are different semiconductor materials. The device layer 102 may, for example, be or comprise germanium or some other suitable semiconductor material, and/or the substrate 104 may, for example, be or comprise silicon or some other suitable semiconductor material. In some embodiments, the device layer 102 is more absorptive of NIR radiation and/or IR radiation than the substrate 104. Further, in some embodiments, the device layer 102 has a smaller bandgap than the substrate 104. The substrate 104 may, for example, be a bulk semiconductor wafer, a semiconductor-on-insulator (SOI) wafer, or some other suitable type of substrate.

The epitaxy may, for example, be performed by vapor-phase epitaxy (VPE), molecular beam epitaxy (MBE), or some other suitable epitaxial process. In some embodiments, the device layer 102 is epitaxially grown so as to entirely cover the substrate 104 and/or to cover all exposed semiconductor material of the substrate 104.

Figure 18:
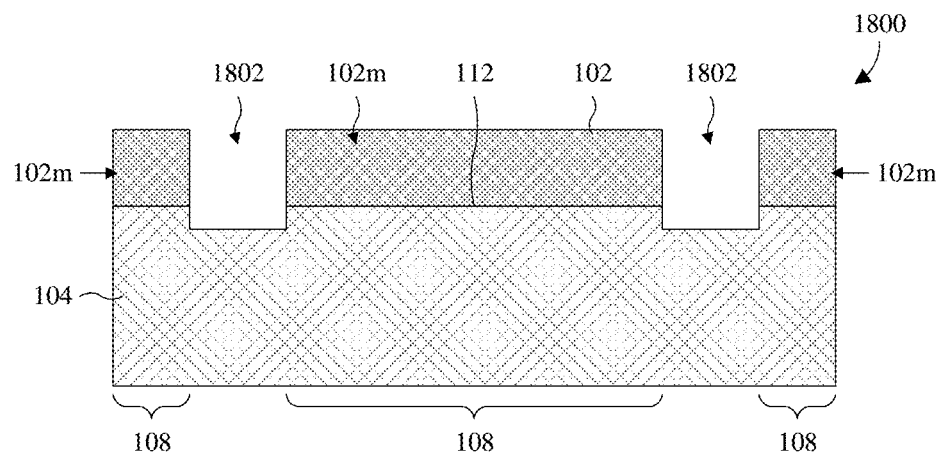

As illustrated by the cross-sectional view 1800 of FIG. 18, the device layer 102 is patterned to form a trench 1802. The trench 1802 extends along boundaries of pixels 108 being formed and divides the device layer 102 into a plurality of discrete mesa structures 102m individual to the pixels 108. The trench 1802 extends completely through the device layer 102, and individually surrounds the mesa structures 102m, so as to completely separate the mesa structures 102m. Further, the trench 1802 extends into the substrate 104 for enhanced electrical isolation between the mesa structures 102m. In alternative embodiments, the trench 1802 does not extend into the substrate 104 and has a bottom surface that is even or substantially even with a bottom surface of the device layer 102. The patterning may, for example, be performed by a photolithography/etching process or some other suitable type of patterning process.

In some embodiments, the trench 1802 and the mesa structures 102m have top layouts as illustrated respectively for the inter-pixel dielectric layer 106 and the mesa structures 102m in any one of Figs. FIGS. 2A and 2B. For example, the cross-sectional view 1800 may be taken along line A in FIG. 2A or line B in FIG. 2B. In alternative embodiments, the trench 1802 and the mesa structures 102m have other suitable top layouts. In some embodiments, the mesa structures 102m have top layouts that are square shaped, rectangular, circular, triangular, hexagonal, or some other suitable shape. In some embodiments, the mesa structures 102m have polygonal top layouts that are equilateral or substantially equilateral and/or that are equiangular or substantially equiangular. Substantially equilateral may, for example, mean that sides of a polygon have an average length and each side of the polygon has a length that differs from the average length by less than about 1%, 5%, or 10% of the average length. Substantially equiangular may, for example, mean that corners of a polygon have an average angle and each corner of the polygon has an angle that differs from the average angle by less than about 1%, 5%, or 10% of the average angle. Other meanings are, however, amenable for substantially equilateral and substantially equiangular.

Because the device layer 102 and the substrate 104 are different semiconductor materials, lattice constants may be different. As a result, threading-dislocation defects may arise at an interface 112 between the device layer 102 and the substrate 104. Because the interface 112 is localized to a bottom surface of the device layer 102 and does not extend along sidewalls of the device layer 102, the interface 112 spans a small area. As a result, the density of threading-dislocation defects is low. Because of the low density of threading-dislocation defects, crystalline quality may be high. High crystalline quality reduces leakage current and may hence enhance SNR, QE, and other suitable performance metrics of the image sensor being formed.

Because the mesa structures 102m are discrete and separated from each other by the inter-pixel dielectric layer 106, electrical isolation between the mesa structures 102m is high. As a result, the mesa structures 102m may have high density. Further, because top layouts of the mesa structures 102m may be defined by patterning the device layer 102, the top layouts may be chosen for high density. The top layouts may, for example, be square, rectangular, hexagonal, triangular, circular, octagonal, pentagonal, or some other suitable shape. Because density may be high, and because the mesa structures 102m may be defined and isolated from each other with relatively few processing steps, manufacturing costs for the image sensor may be low.

Figure 19:
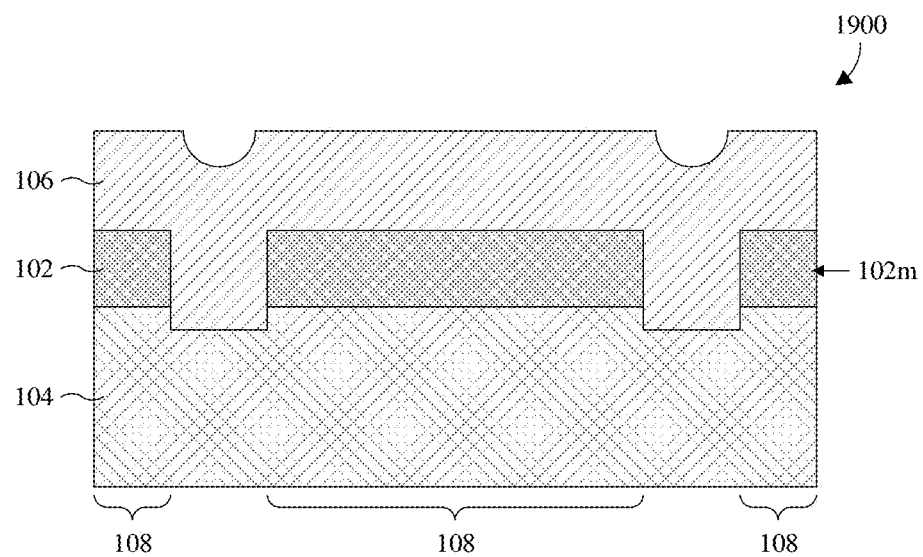

As illustrated by the cross-sectional view 1900 of FIG. 19, an inter-pixel dielectric layer 106 is deposited filling the trench 1802 (see, e.g., FIG. 18) and covering the device layer 102. The inter-pixel dielectric layer 106 may, for example, be deposited by thermal oxidation, vapor deposition, or some other suitable deposition process.

Figure 20:
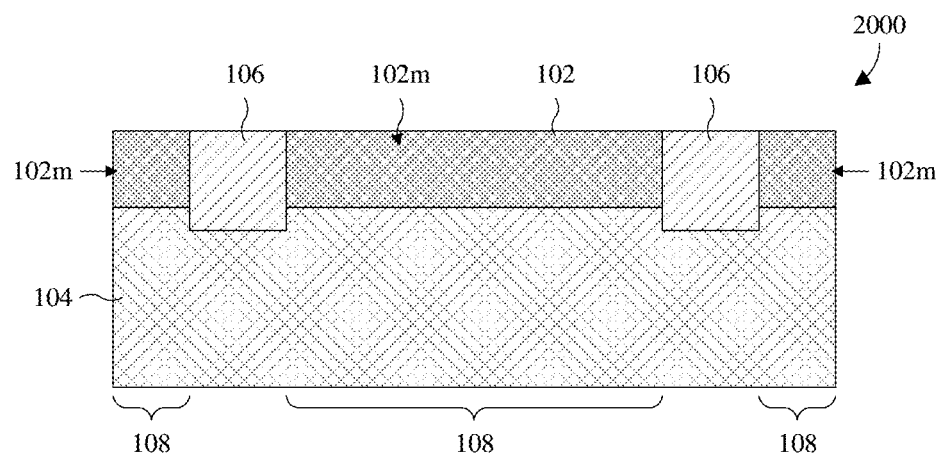

As illustrated by the cross-sectional view 2000 of FIG. 20, a planarization is performed into the inter-pixel dielectric layer 106 to remove the inter-pixel dielectric layer 106 from atop the device layer 102 and to localize the inter-pixel dielectric layer 106 to the trench 1802 (see, e.g., FIG. 18). The planarization may, for example, be performed by a chemical mechanical polish (CMP) and/or some other suitable planarization process.

Figure 21:
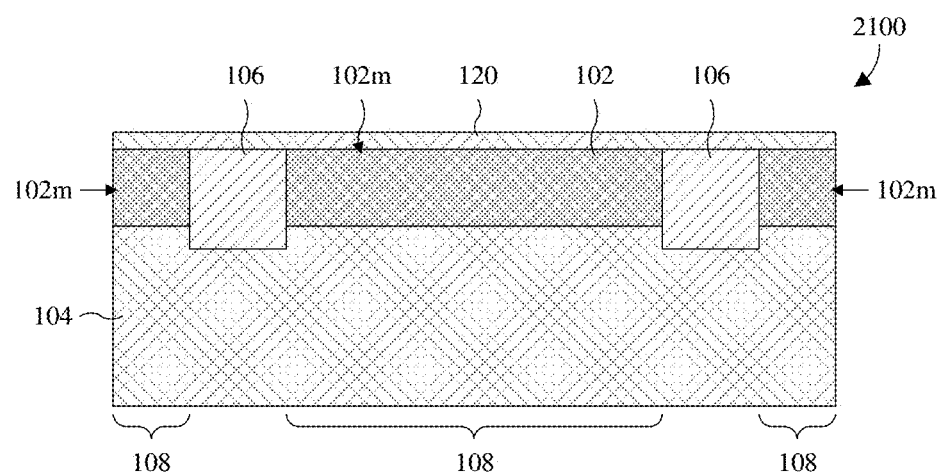

As illustrated by the cross-sectional view 2100 of FIG. 21, a device cap layer 120 is epitaxially grown on the device layer 102 and the inter-pixel dielectric layer 106 to protect the device layer 102 during subsequent processing. In alternative embodiments, the device cap layer 120 is localized to the device layer 102 and/or is not on the inter-pixel dielectric layer 106. The device cap layer 120 may, for example, be or comprise silicon and/or some other suitable type of semiconductor material. The epitaxy may, for example, be performed by VPE, MBE, or some other suitable epitaxial process.

Figure 22:
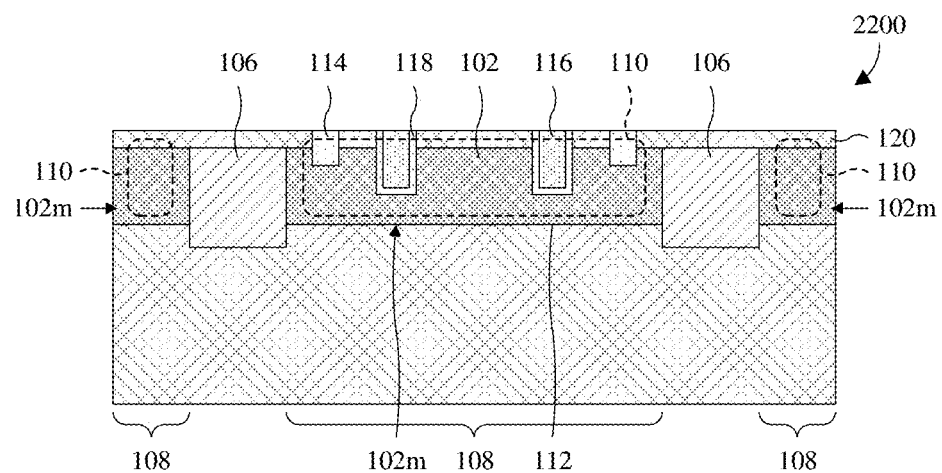

As illustrated by the cross-sectional view 2200 of FIG. 22, photodetectors 110 individual to the pixels 108 are formed in the mesa structures 102m of the corresponding pixels 108. The photodetectors 110 include corresponding first contact regions 114, corresponding second contact regions 116, and corresponding contact wells 118. While not visible for the pixels 108 at the periphery of the cross-sectional view 2200, the pixels 108 at the periphery of the cross-sectional view 2200 include first and second contact regions 114, 116 and contact wells 118. The pixel 108 at the middle of the cross-sectional view 2200 may, for example, be representative of the pixels 108 at the periphery of the cross-sectional view 2200. The photodetectors 110 may, for example, be or comprise PIN photodiodes or some other suitable type of photodiodes.

The photodetectors 110 may, for example, be formed by a series of doping processes that respectively form the first and second contact regions 114, 116 and the contact wells 118 in the mesa structures 102m. The doping processes may, for example, be performed by ion implantation and/or some other suitable type of doping process.

Figure 23:
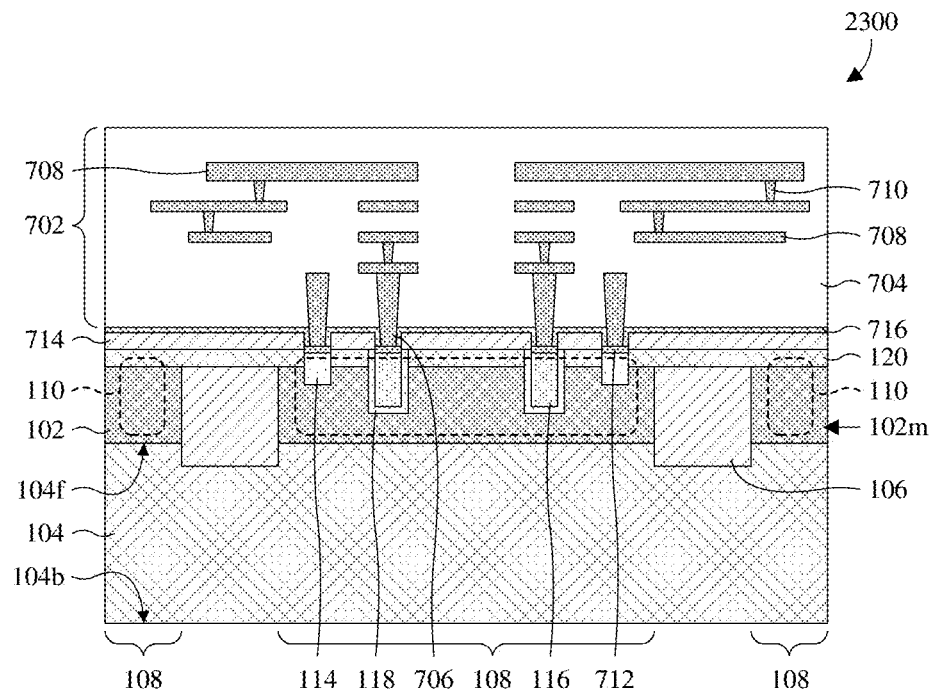

As illustrated by the cross-sectional view 2300 of FIG. 23, an interconnect structure 702 is formed over and electrically coupled to the photodetectors 110 on a front side 104f of the substrate 104. The interconnect structure 702 is separated from the device cap layer 120 by an RPD layer 714 and a CESL 716. Further, the interconnect structure 702 is electrically coupled to the first and second contact regions 114, 116 through silicide layers 712. The interconnect structure 702 may, for example, be as described at FIGS. 7A and 7B.

While not shown, micro lenses 718 and an antireflective layer 720 may be formed on the front side 104f of the substrate 104 or a back side 104b of the substrate 104. FIG. 7A provides an example of the former, and FIG. 7B provides an example of the latter.

While FIGS. 17-23 are described with reference to various embodiments of a method, it will be appreciated that the structures shown in 17-23 are not limited to the method but rather may stand alone separate of the method. While 17-23 are described as a series of acts, it will be appreciated that the order of the acts may be altered in other embodiments. While 17-23 illustrate and describe as a specific set of acts, some acts that are illustrated and/or described may be omitted in other embodiments. Further, acts that are not illustrated and/or described may be included in other embodiments.

Figure 24:
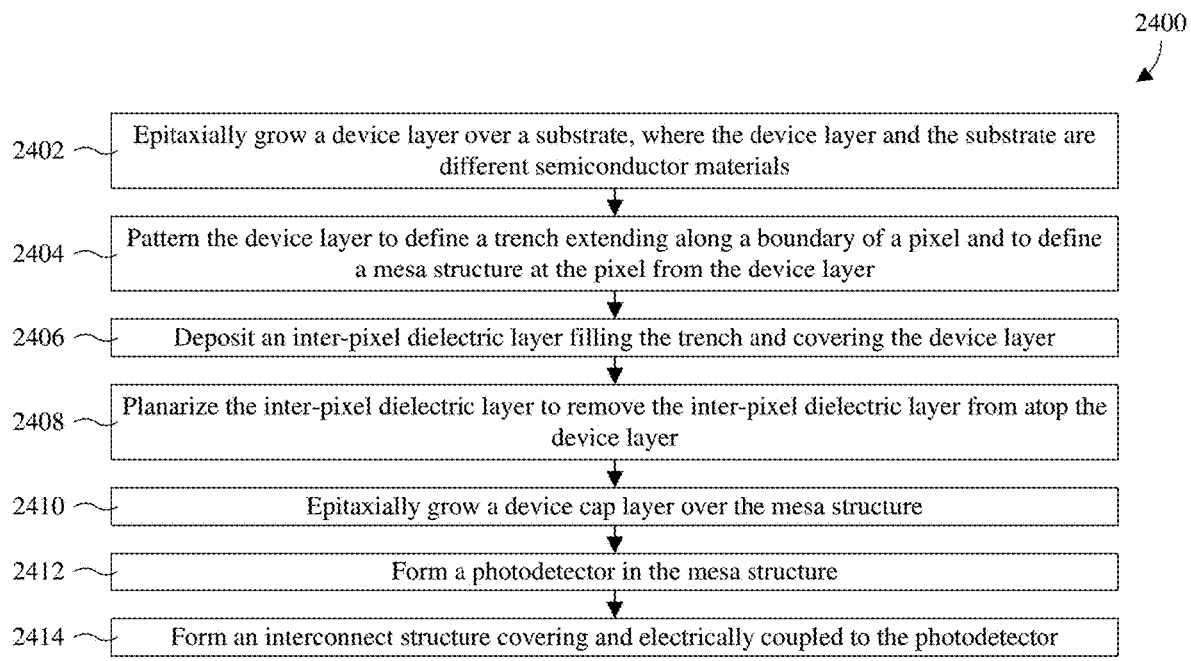
FIG. 24 illustrates a block diagram of some embodiments of the method of FIGS. 17-23.

With reference to FIG. 24, a block diagram 2400 of some embodiments of the method of FIGS. 17-23 is provided.

At 2402, a device layer is epitaxially grown over a substrate, where the device layer and the substrate are different semiconductor materials. See, for example, FIG. 17.

At 2404, device layer is patterned to define a trench extending along a boundary of a pixel and to define a mesa structure at the pixel from the device layer. See, for example, FIG. 18.

At 2406, an inter-pixel dielectric layer is deposited filling the trench and covering the device layer. See, for example, FIG. 19.

At 2408, the inter-pixel dielectric layer is planarized to remove the inter-pixel dielectric layer from atop the device layer. See, for example, FIG. 20.

At 2410, a device cap layer is epitaxially grown over the mesa structure. See, for example, FIG. 21.

At 2412, a photodetector is formed in the mesa structure. See, for example, FIG. 22.

At 2414, an interconnect structure is formed covering and electrically coupled to the photodetector. See, for example, FIG. 23.

While the block diagram 2400 of FIG. 24 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 25-31, a series of cross-sectional views 2500-3100 of some alternative embodiments of the method of FIGS. 17-23 is provided in which the device layer 102 is formed after the inter-pixel dielectric layer 106. The method may be employed to form the image sensor in any one of FIGS. 5 and 6. Further, the method may be employed to from the image sensors in any one of FIGS. 1, 3A-3C, 4, 7A, and 7B if modified so the inter-pixel dielectric layer 106 has a bottom surface that is even with or about even with that of the device layer 102. Further yet, the method may be employed other suitable image sensors.

Figure 25:
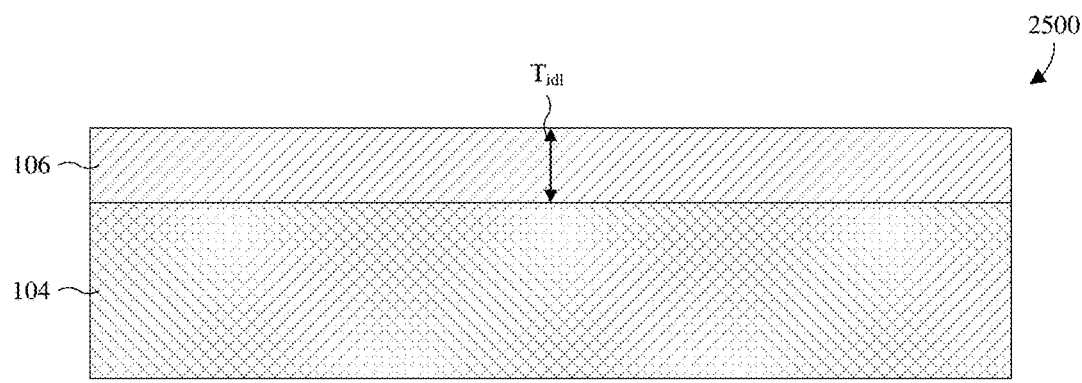
FIGS. 25-31 illustrate a series of cross-sectional views of some alternative embodiments of the method of FIGS. 17-23 in which the device layer is formed after an inter-pixel dielectric layer.

As illustrated by the cross-sectional view 2500 of FIG. 25, an inter-pixel dielectric layer 106 is deposited over a substrate 104. In some embodiments, the inter-pixel dielectric layer 106 is deposited with a thickness $T_{idl}$ that is about 2-50 micrometers, about 2-26 micrometers, about 26-50 micrometers, or some other suitable value. The inter-pixel dielectric layer 106 may, for example, be deposited by thermal oxidation, vapor deposition, or some other suitable deposition process.

Figure 26:
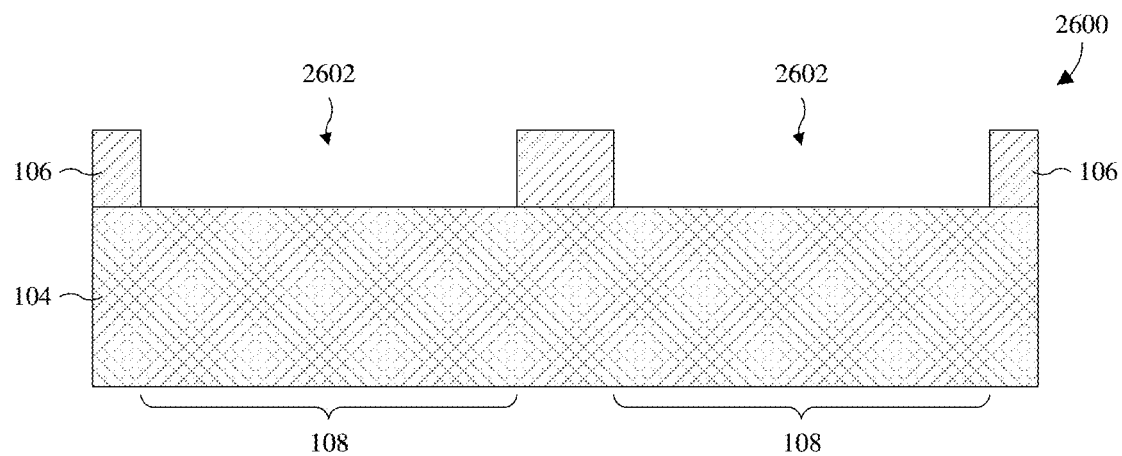

As illustrated by the cross-sectional view 2600 of FIG. 26, the inter-pixel dielectric layer 106 is patterned to form a plurality of discrete cavities 2602 exposing the substrate 104. The cavities 2602 correspond to pixels 108 being formed, and the inter-pixel dielectric layer 106 extends along boundaries of the pixels 108 to individually surround each of the cavities 2602. The patterning may, for example, be performed by a photolithography/etching process or some other suitable type of patterning process.

In some embodiments, the inter-pixel dielectric layer 106 and the cavities 2602 have top layouts as illustrated respectively for the inter-pixel dielectric layer 106 and the mesa structures 102m in any one of Figs. FIGS. 2A and 2B. For example, the cross-sectional view 2600 may be taken along line A in FIG. 2A or line B in FIG. 2B. In alternative embodiments, the inter-pixel dielectric layer 106 and the cavities 2602 have other suitable top layouts. In some embodiments, the cavities 2602 have top layouts that are square shaped, rectangular, circular, triangular, hexagonal, or some other suitable shape. In some embodiments, the cavities 2602 have polygonal top layouts that are equilateral or substantially equilateral and/or that are equiangular or substantially equiangular. Substantially equilateral and/or substantially equiangular may, for example, be as described with regard to FIG. 18. Other meanings are, however, amenable for substantially equilateral and substantially equiangular.

Figure 27:
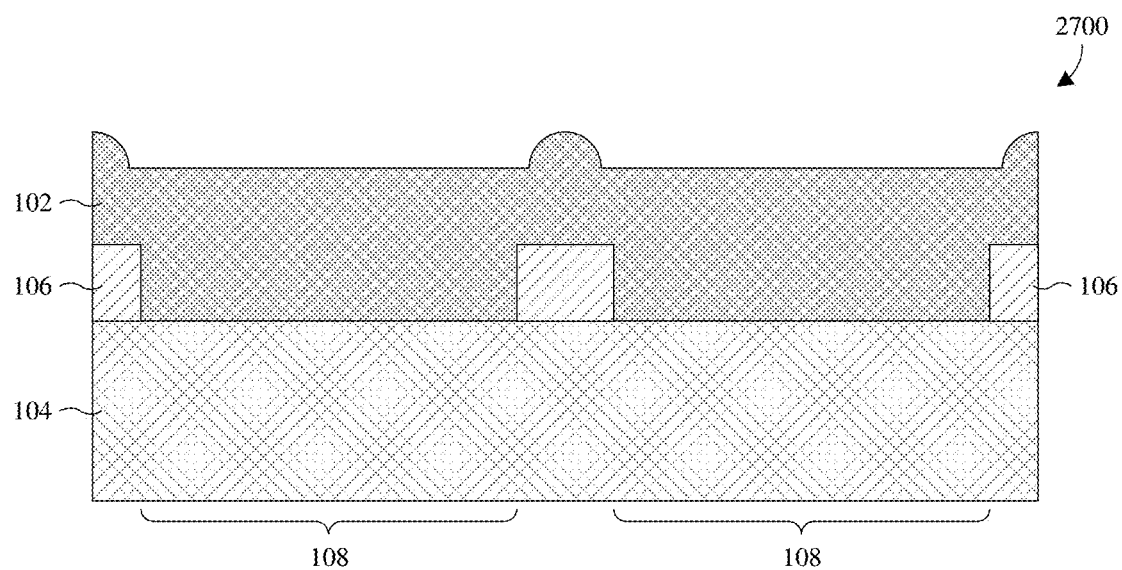

As illustrated by the cross-sectional view 2700 of FIG. 27, a device layer 102 is epitaxially grown filling the cavities 2602 (see, e.g., FIG. 26) and covering the inter-pixel dielectric layer 106. The device layer 102 and the substrate 104 are different semiconductor materials. The epitaxy may, for example, be performed by VPE, MBE, or some other suitable epitaxial process.

Figure 28:
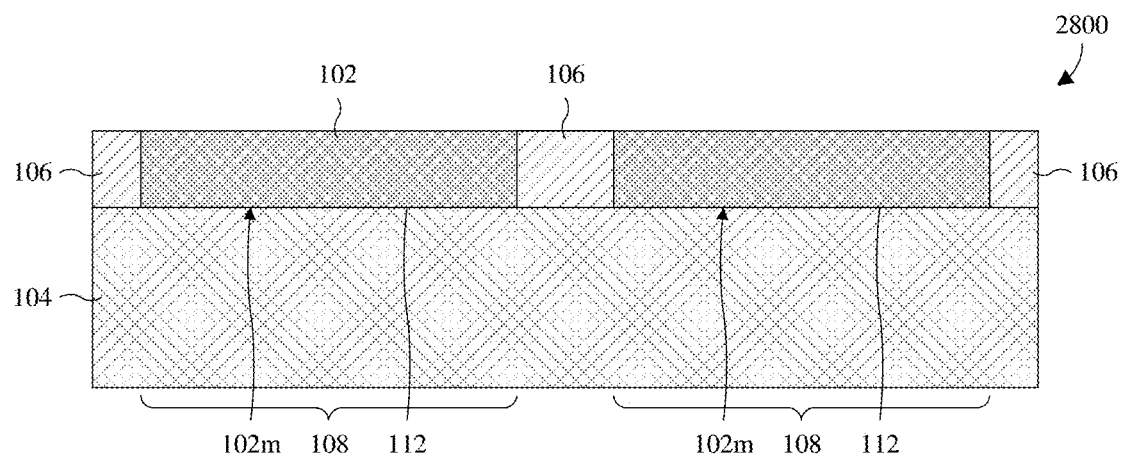

As illustrated by the cross-sectional view 2800 of FIG. 28, a planarization is performed into the device layer 102. The planarization removes the device layer 102 from atop the inter-pixel dielectric layer 106 and localizes the device layer 102 to the cavities 2602 (see, e.g., FIG. 26). Portions of the device layer 102 in the cavities 2602 define mesa structures 102m that correspond to the pixels 108 being formed. The planarization may, for example, be performed by a CMP and/or some other suitable planarization process.

Because the device layer 102 and the substrate 104 are different semiconductor materials, lattice constants may be different. As a result, threading-dislocation defects may arise at an interface 112 between the device layer 102 and the substrate 104. Because the interface 112 is localized to a bottom surface of the device layer 102 and does not extend along sidewalls of the device layer 102, the interface 112 spans a small area. As a result, the density of threading-dislocation defects is low. Because of the low density of threading-dislocation defects, crystalline quality may be high. High crystalline quality reduces leakage current and may hence enhance SNR, QE, and other suitable performance metrics of the image sensor being formed.

Because the mesa structures 102m are discrete and separated from each other by the inter-pixel dielectric layer 106, electrical isolation between the mesa structures 102m is high. As a result, the mesa structures 102m may have high density. Further, because top layouts of the mesa structures 102m may be defined by patterning the inter-pixel dielectric layer 106, the top layouts may be chosen for high density. The top layouts may, for example, be square, rectangular, hexagonal, triangular, circular, octagonal, pentagonal, or some other suitable shape. Because density may be high, and because the mesa structures 102m may be defined and isolated from each other with relatively few processing steps, manufacturing costs for the image sensor may be low.

Figure 29:
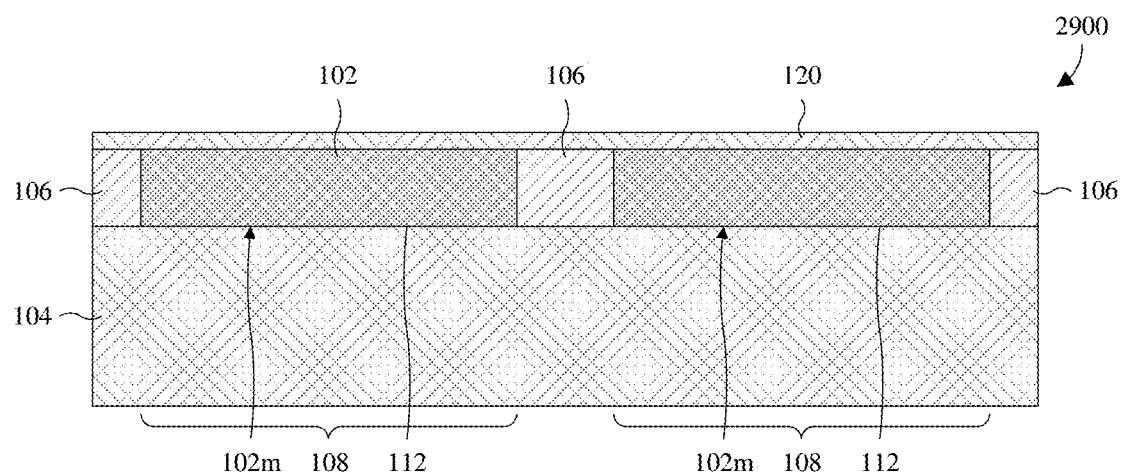
Figure 30:
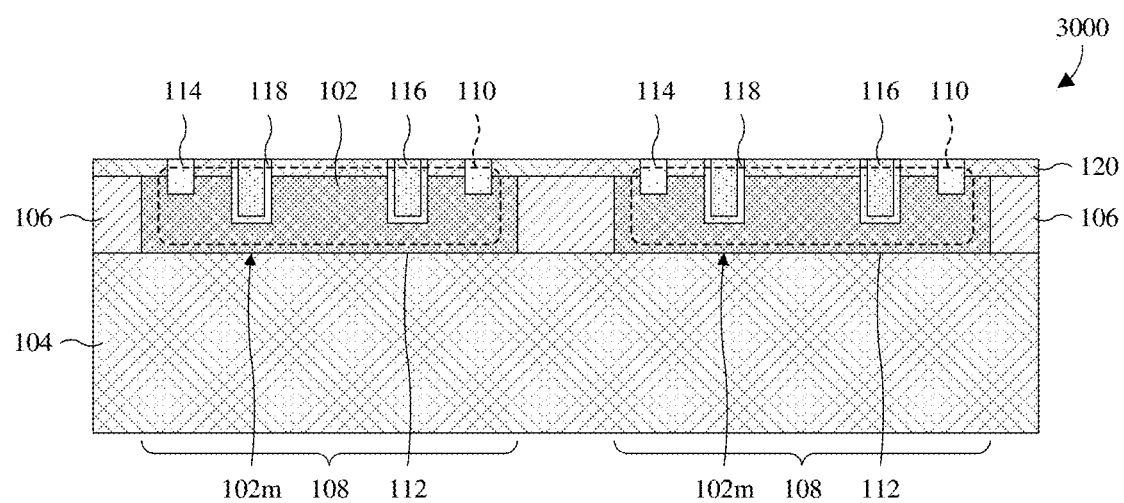
Figure 31:
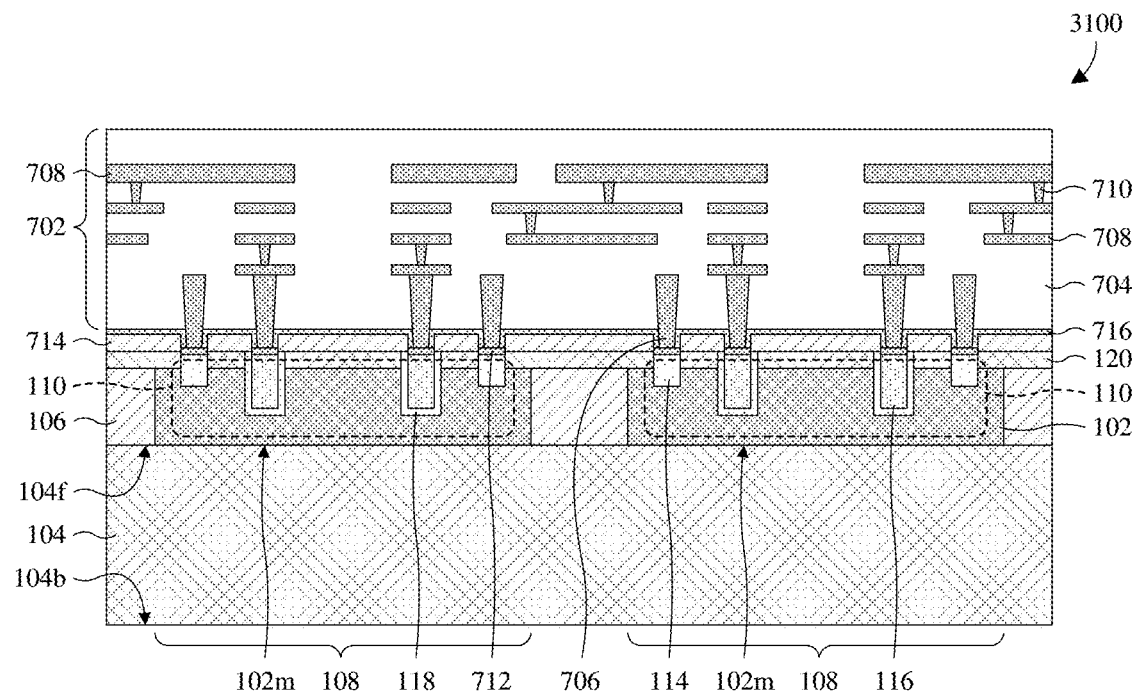

As illustrated by the cross-sectional views 2900-3100 of FIGS. 29-31, the acts illustrated and described at FIGS. 21-23 are respectively performed. At FIG. 29, a device cap layer 120 is epitaxially grown on the device layer 102 as illustrated and described at FIG. 21. At FIG. 30, photodetectors 110 are formed in the mesa structures 102m as illustrated and described at FIG. 22. At FIG. 31, an interconnect structure 702 is formed over and electrically coupled to the photodetectors 110 on a front side 104f of the substrate 104 as illustrated and described at FIG. 23. While not shown, micro lenses 718 and an antireflective layer 720 may be formed on the front side 104f of the substrate 104 or a back side 104b of the substrate 104. FIG. 7A provides an example of the former, and FIG. 7B provides an example of the latter.

While FIGS. 25-31 are described with reference to various embodiments of a method, it will be appreciated that the structures shown in 25-31 are not limited to the method but rather may stand alone separate of the method. While 25-31 are described as a series of acts, it will be appreciated that the order of the acts may be altered in other embodiments. While 25-31 illustrate and describe as a specific set of acts, some acts that are illustrated and/or described may be omitted in other embodiments. Further, acts that are not illustrated and/or described may be included in other embodiments.

Figure 32:
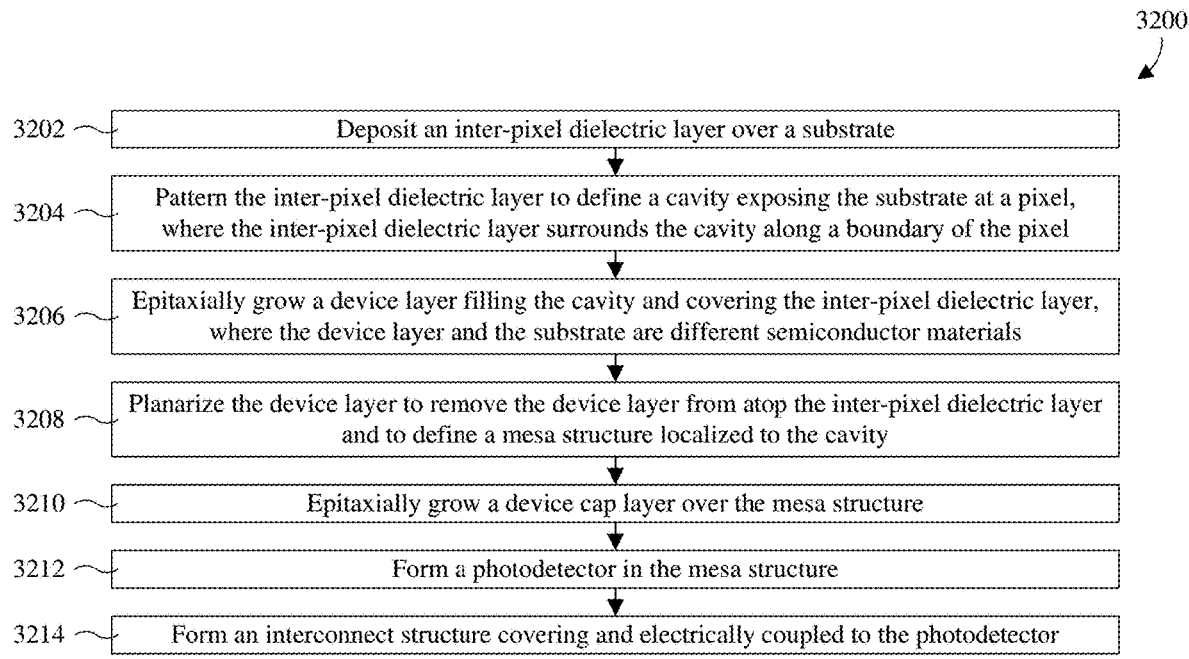
FIG. 32 illustrates a block diagram of some embodiments of the method of FIGS. 25-31.

With reference to FIG. 32, a block diagram 3200 of some embodiments of the method of FIGS. 25-31 is provided.

At 3202, an inter-pixel dielectric layer is deposited over a substrate. See, for example, FIG. 25.

At 3204, the inter-pixel dielectric layer is patterned to define a cavity exposing the substrate at a pixel, where the inter-pixel dielectric layer surrounds the cavity along a boundary of the pixel. See, for example, FIG. 26.

At 3206, a device layer is epitaxially grown filling the cavity and covering the inter-pixel dielectric layer, where the device layer and the substrate are different semiconductor materials. See, for example, FIG. 27.

At 3208, the device layer is planarized to remove the device layer from atop the inter-pixel dielectric layer and to define a mesa structure localized to the cavity. See, for example, FIG. 28.

At 3210, a device cap layer is epitaxially grown over the mesa structure. See, for example, FIG. 29.

At 3212, a photodetector is formed in the mesa structure. See, for example, FIG. 30.

At 3214, an interconnect structure is formed covering and electrically coupled to the photodetector. See, for example, FIG. 31.

While the block diagram 3200 of FIG. 32 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 33-35, 36A-36C, 37A, 37B, and 38-41, a series of cross-sectional views 3300-3500, 3600A-3600C, 3700A, 3700B, 3800-4100 of some embodiments of a method for forming an image sensor is provided in which a device layer is recessed into and has a different semiconductor material than a substrate. The method may, for example, be employed to form the image sensor in any one of FIGS. 8, 9, 10B-10D, 10F, 11, 15, 16A, and 16B. Further, the method may be employed to form other suitable image sensors.

Figure 33:
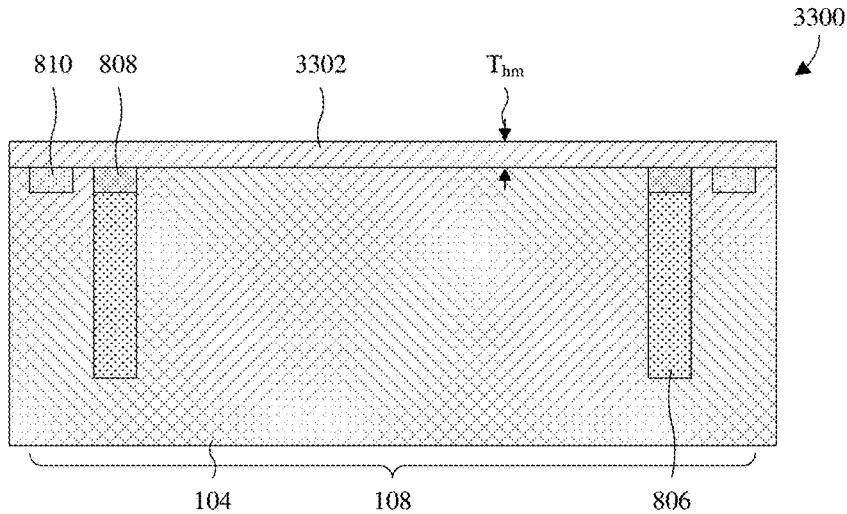
FIGS. 33-35, 36A-36C, 37A, 37B, and 38-41 illustrate a series of cross-sectional views of some embodiments of a method for forming an image sensor in which a device layer is recessed into and has a different semiconductor material than a substrate.

As illustrated by the cross-sectional view 3300 of FIG. 33, a DII region 806, a SII region 808, and SSI regions 810 are formed in a substrate 104. The substrate 104 may, for example, be or comprise silicon or some other suitable semiconductor material.

The DII region 806 extends along a periphery of a pixel 108 being formed on the substrate 104 and has a pair of segments respectively on opposite sides of the pixel 108. The SII region 808 overlies the DII region 806. Further, the SII region 808 similarly extends along the periphery of the pixel 108 and has a pair of segments respectively on the opposite sides of the pixel 108. The SSI regions 810 are respectively on opposite sides of the SII region 808, such that the DII region 806 and the SII region 808 are between the SSI regions 810. In some embodiments, the DII region 806, the SII region 808, and the SSI regions 810 have top layouts as in FIG. 9, but other suitable top layouts are amenable. The DII region 806, the SII region 808, and the SSI regions 810 are doped regions of the substrate 104 and may be formed by ion implantation or some other suitable doping process. The DII region 806 and the SII region 808 share a common doping type, and the SII region 808 has a higher doping concentration than the DII region 806. The common doping type may, for example, be the same as that of a bulk of the substrate 104.

Also illustrated by the cross-sectional view 3300 of FIG. 33, a hard mask layer 3302 is deposited over the substrate 104. In some embodiments, a thickness $T_{hm}$ of the hard mask layer 3302 is about 500-1000 angstroms, about 500-750 angstroms, about 750-1000 angstroms, about 750 angstroms, or some other suitable value. The hard mask layer 3302 may, for example, be or comprise undoped silicate glass (USG) and/or some other suitable dielectric(s).

Figure 34:
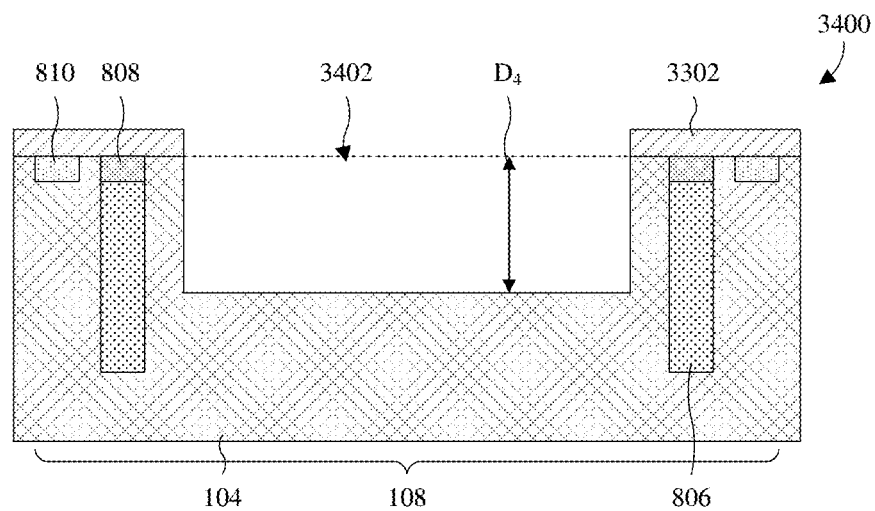

As illustrated by the cross-sectional view 3400 of FIG. 34, the hard mask layer 3302 and the substrate 104 are patterned to define a cavity 3402. In some embodiments, the cavity 3402 has a depth $D_4$ that is about 0.5-1.0 micrometers, about 1.1 micrometers, about 1-2 micrometers, about 2-5 micrometers, about 5-10 micrometers, or some other suitable value. The patterning may, for example, be performed by a photolithography/etching process or some other suitable patterning process. Further, the photolithography/etching process may, for example, employ dry etching but other suitable types of etching are amenable.

Figure 35:
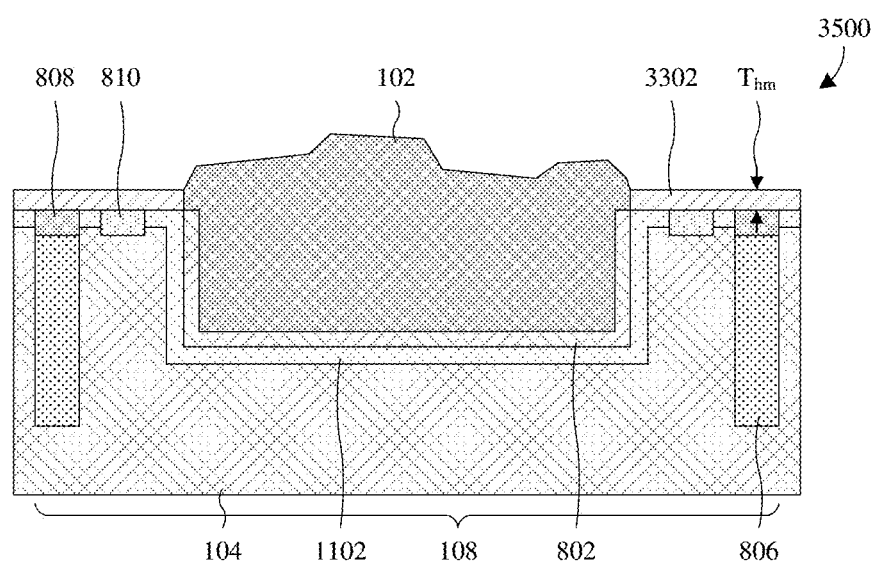

As illustrated by the cross-sectional view 3500 of FIG. 35, a substrate implant region 1102 is formed lining the cavity 3402 (see, e.g., FIG. 34). In alternative embodiments, the substrate implant region 1102 is omitted. The substrate implant region 1102 is a doped region of the substrate 104 and may, for example, be formed by blanket ion implantation or some other suitable doping process. In some embodiments, the substrate implant region 1102 has the same doping type, but a higher doping concentration than, a bulk of the substrate 104.

Also illustrated by the cross-sectional view 3500 of FIG. 35, an interlayer 802 is epitaxially grown lining the cavity 3402 (see, e.g., FIG. 34) over the substrate implant region 1102. The interlayer 802 is epitaxially grown from the substrate 104 and is hence localized to exposed surfaces of the substrate 104 in the cavity 3402. The interlayer 802 is or comprises the same semiconductor material as the substrate 104 and is undoped.

Also illustrated by the cross-sectional view 3500 of FIG. 35, a device layer 102 is epitaxially grown filling the cavity 3402 over the interlayer 802. The device layer 102 is epitaxially grown from the interlayer 802 and is hence localized to exposed surfaces of the interlayer 802 in the cavity 3402. Further, due to the way the crystalline lattice grows, a top surface of the device layer 102 may be rough.

The device layer 102 is a different semiconductor material than the substrate 104 and the interlayer 802. For example, the device layer 102 may be germanium or silicon germanium, whereas the substrate 104 and the interlayer 802 may be silicon. Other suitable materials are, however, amenable. In some embodiments, the device layer 102 has a higher absorption coefficient for NIR and/or IR radiation than the substrate 104 and the interlayer 802. Further, in some embodiments, the device layer 102 has a smaller bandgap than the substrate 104 and the interlayer 802. In some embodiments, the thickness $T_{hm}$ of the hard mask layer 3302 is less than when deposited at Fig. FIG. 33 and/or is about 200-500 angstroms, about 200-350 angstroms, about 350-500 angstroms, about 300 angstroms, about 380 angstroms, or some other suitable value.

Because the device layer 102 and the interlayer 802 are different semiconductor materials, lattice constants may be different and threading-dislocation defects may arise at an interface therebetween. As a result, leakage current may occur along the interface and negatively impact performance of a photodetector hereafter formed in the device layer 102. For example, the leakage current may negatively impact SNR, QE, and other suitable performance metrics of the photodetector. The substrate implant region 1102 at least partially mitigates the leakage current and thereby enhances performance of the photodetector.

Dopants of the substrate implant region 1102 and/or the substrate 104 may diffuse to the device layer 102. Dopants that diffuse to the device layer 102 may create a low resistivity region in the device layer 102 that increases leakage current. This, in turn, may degrade performance of the photodetector, counter to the role of the substrate implant region 1102. The interlayer 802 blocks or otherwise reduces dopants diffusing to the device layer 102 and may therefore enhance performance of the photodetector.

Figure 36A:
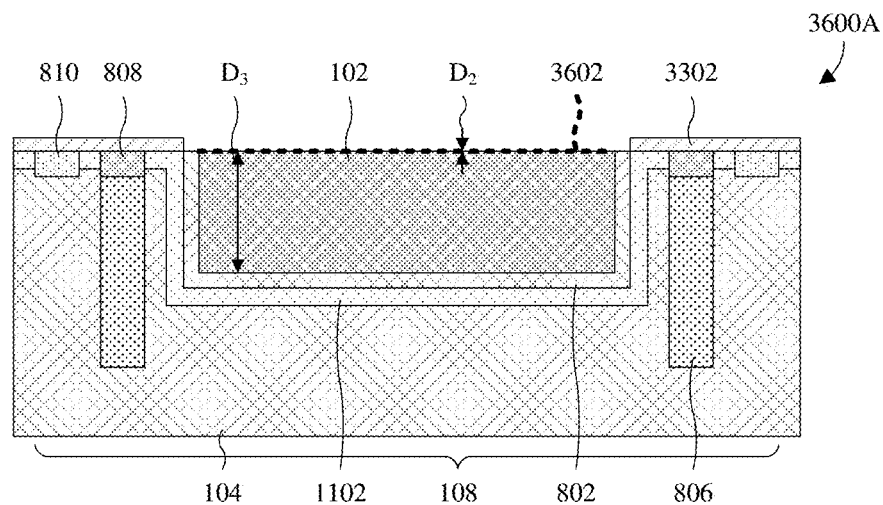
Figure 36B:
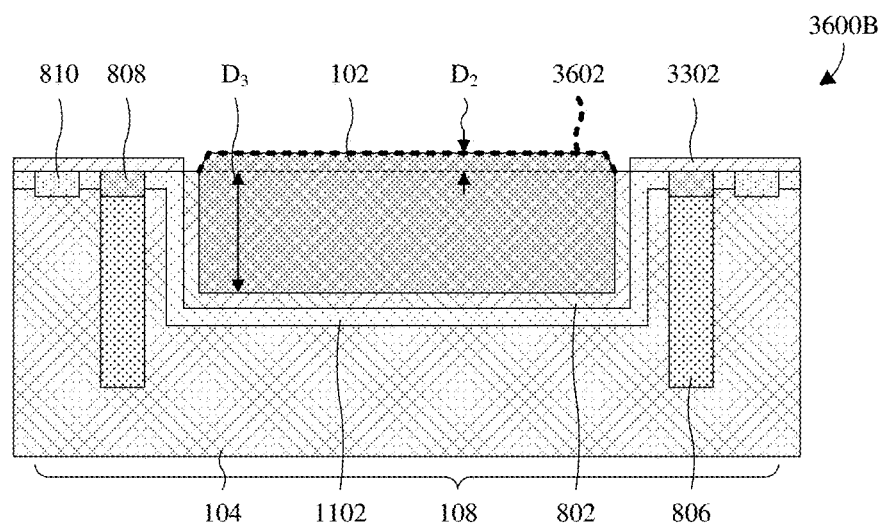
Figure 36C:
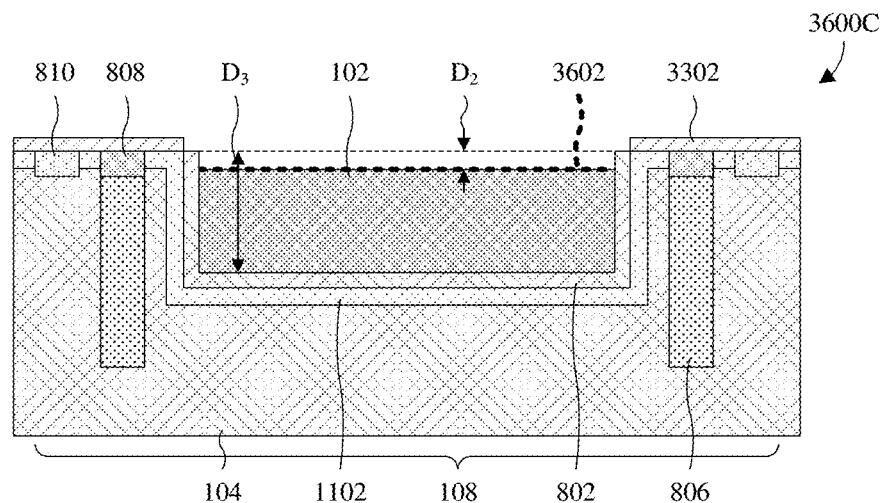

As illustrated by the cross-sectional views 3600A-3600C of FIGS. 36A-36C, a planarization is performed into a top surface of the device layer 102 to flatten the top surface. FIGS. 36A-36C are alternative embodiments of the planarization and hence each individually illustrates the planarization. Further, FIGS. 36A-36C illustrate different offset distances $D_2$ vertically from the top surface of the device layer 102 to a top surface of the substrate 104. In FIG. 36A, the offset distance $D_2$ is zero or about zero. In FIGS. 36B and 36C, the offset distance $D_2$ is positive and the top surface of the device layer 102 is respectively elevated and recessed relative to the top surface of the interlayer 802 and/or the top surface of the substrate 104. As a result of the planarization, errant particles 3602 settle and/or form on the top surface of the device layer 102. The errant particles may, for example, include organic impurities, metallic contaminants, polymers, other suitable particles, or any combination of the foregoing.

Flattening the top surface of the device layer 102 improves uniformity and hence reliability with processing performed hereafter. For example, flattening the top surface of the device layer 102 may improve uniformity and reliability while forming a device cap layer, an interconnect structure, and other suitable features hereafter described. Further, the flattening is performed such that the offset distance $D_2$ is small. If the offset distance $D_2$ is large, the topography at the device layer 102 may fully or partially negate the benefits from the flattening and may hence lead to non-uniformity and unreliability with processing performed hereafter. The offset distance $D_2$ may, for example, be small if within about 1, 2, 5, 10, or 30 percent of a depth $D_3$ that the device layer 102 extends into the substrate 104 and may, for example, be large otherwise. Other suitable percentages are, however, amenable. The depth $D_3$ may, for example, be measured from the top surface of the substrate 104 to a bottom surface of the device layer 102. In alternative embodiments, the offset distance $D_2$ and the depth $D_3$ are measured from the top surface of the interlayer 802 respectively to the top surface of the device layer 102 and the bottom surface of the device layer 102. Such alternative embodiments may, for example, arise when the top surface of the interlayer 802 is elevated relative to the top surface of the substrate 104.

In some embodiments, the planarization is performed by a CMP. In alternative embodiments, the planarization is performed by a dry/wet etch process. The dry/wet etch process may, for example, comprise: 1) depositing or otherwise forming a planarization layer (not shown) over the device layer 102 so a top surface of the planarization layer is flat or substantially flat; 2) etching back the planarization layer and the device layer 102 in parallel using an etchant having the same or similar etch rates for the planarization layer and the device layer 102; and 3) removing any remainder of the planarization layer after the etch back. The planarization layer may, for example, be deposited with a top surface that is a flat or substantially flat by spin on coating or some other suitable deposition process. Alternatively, the planarization layer may, for example, be deposited with a top surface that is rough and then flattened with a CMP or some other suitable planarization process. The planarization layer may, for example, be or comprise a bottom antireflective coating (BARC) and/or some other suitable material. In alternative embodiments, the planarization is performed by a CMP followed by an etch back. In alternative embodiments, the planarization is performed by some other suitable planarization process.

As illustrated by the cross-sectional views 3700A and 3700B, a cleaning process is performed on the top surface of the device layer 102. FIG. 37B illustrates an enlarged cross-sectional view 3700B at circle D in the cross-sectional view 3700A of FIG. 37A. The cleaning process may be performed on the device layer 102 in any one of FIGS. 36A-36C but is illustrated using the device layer 102 in FIG. 36A. As noted above, FIGS. 36A-36C are alternatives of each other. The cleaning process removes at least some of the errant particles 3602 (see, e.g., FIGS. 36A-36C) and further forms an interlayer cap layer 804 on the interlayer 802. In some embodiments, the interlayer cap layer 804 and the device layer 102 have a top layout as shown in FIG. 9. In alternative embodiments, other suitable top layouts are amenable.

The cleaning process comprises application of a wet cleaning solution to the top surface of the device layer 102. The wet cleaning solution oxidizes the interlayer 802 to form the interlayer cap layer 804 while simultaneously removing the errant particles 3602. For example, in at least some embodiments in which the device layer 102 is or comprise germanium and the interlayer 802 is or comprises silicon, the cleaning solution may at least partially remove the errant particles 3602 from the device layer 102 while forming the interlayer cap layer 804 as silicon oxide. In some embodiments, the wet cleaning solution comprises ozone and further comprises deionized water or some other suitable solvent within which the ozone may be dissolved. In some embodiments, the wet cleaning solutions consists or consists essentially of ozone and deionized water. In other embodiments, the wet cleaning solution comprises additional components.

Also illustrated by the cross-sectional views 3700A and 3700B, a hydrogen baking process is performed after the cleaning process to further remove the errant particles 3602 (see, e.g., FIGS. 36A-36C). For example, the hydrogen baking process may remove residual oxygen and/or carbon on the device layer 102. In alternative embodiments, the hydrogen baking process is omitted and/or some other suitable thermal process is performed instead. The hydrogen baking process may, for example, comprise heating the device layer 102 at high temperatures and in an atmosphere comprising hydrogen gas (e.g., $H_2$). The high temperatures may, for example, be about 700-800 degrees Celsius, but other suitable temperatures are amenable.

In some embodiments, an additional cleaning process is performed between the hydrogen baking process and subsequent epitaxial growth of a device layer to further remove the errant particles 3602 (see, e.g., FIGS. 36A-36C). For example, in at least some embodiments in which the device layer 102 is or comprises germanium, the additional cleaning process may remove germanium oxide from the device layer 102. In some embodiments, the additional cleaning process is performed without removing the interlayer cap layer 804. In alternative embodiments, the additional cleaning process removes the interlayer cap layer 804.

Figure 38:
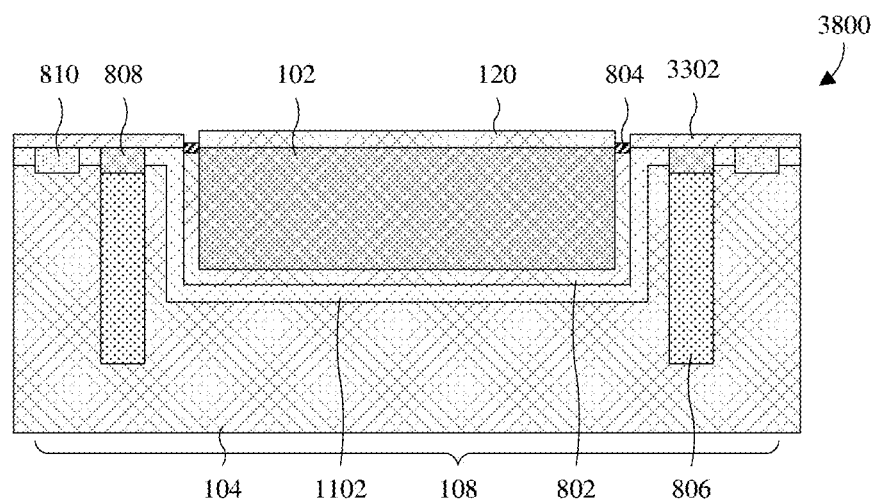

As illustrated by the cross-sectional view 3800 of FIG. 38, the device cap layer 120 is epitaxially grown on and covering the device layer 102. The device cap layer 120 is a different semiconductor material than the device layer 102 and may, for example, be or comprise silicon or some other suitable semiconductor material. In some embodiments, the device cap layer 120 is the same semiconductor material as the interlayer 802 and/or the substrate 104. Further, in some embodiments, the device cap layer 120 is undoped.

The device cap layer 120 is epitaxially grown, such that the device cap layer 120 grows on the device layer 102 but not on the hard mask layer 3302 and not on the interlayer cap layer 804. As such, the device cap layer 120 is localized to the device layer 102 by a self-aligned process that does not depend upon photolithography. Because photolithography is costly, forming the device cap layer 120 by a self-aligned process reduces costs.

The device cap layer 120 protects the device layer 102 from damage during subsequent processing. For example, subsequent wet cleaning processes may use acids that have high etch rates for the device layer 102 but low etch rates for the device cap layer 120. As such, the device layer 102 would undergo significant crystalline damage and/or erosion if directly exposed to the acids whereas the device cap layer 120 would not. Such crystalline damage would increase leakage current and hence degrade SNR, QE, and other suitable performance metrics for a photodetector hereafter formed in the device layer 102. Therefore, by preventing the device layer 102 from coming into direct contact with the acids, the device cap layer 120 protects the device layer 102. This, in turn, reduces leakage current and enhances performance of the photodetector.

Because the device layer 102 is a different material than the substrate 104 and the interlayer 802, the device layer 102 may have a different coefficient of thermal expansion than the substrate 104 and the interlayer 802. As a result, the high temperatures during the hydrogen baking process may lead to different degrees of thermal expansion and hence crystalline stress in the substrate 104, the interlayer 802, and the device layer 102. The high temperatures and the stress may promote outward extrusion of the device layer 102 from the cavity 3402 (see, e.g., FIG. 34). The interlayer cap layer 804 serves as a barrier to prevent or otherwise minimize this outward extrusion and to keep the device layer 102 in the cavity 3402.

But for the interlayer cap layer 804, the device layer 102 may extrude across a top surface of the interlayer 802 and may extrude under the hard mask layer 3302 along an interface between the hard mask layer 3302 and the substrate 104. This may cause stress in the device layer 102 to persist after the hydrogen baking process. The persistent stress roughens surfaces and increase leakage current, which degrades performance of the photodetector hereafter formed in the device layer 102. Further, because the device cap layer 120 does not grow on the hard mask layer 3302, the device cap layer 120 would not cover the extruded portion of the device layer 102. As seen hereafter, the hard mask layer 3302 is removed, such that extruded portion would also become unprotected by the hard mask layer 3302.

Without protection from the hard mask layer 3302 and the device cap layer 120, the extruded portion of the device layer 102 would be susceptible to damage during subsequent processing. For example, as noted above, subsequent wet cleaning processes may use acids that have high etch rates for the device layer 102 but low etch rates for the device cap layer 120. The acids described above may erode the extruded portion of the device layer 102 to define a channel leading under the device cap layer 120 to a bulk of the device layer 102 in the cavity 3402 (see, e.g., FIG. 34). The acids may then erode the bulk of the device layer 102 through the channel and may hence lead to significant crystalline damage and/or erosion to the device layer 102. This, in turn, increases leakage current and degrades perform for the photodetector hereafter formed in the device layer 102.

Therefore, by preventing the device layer 102 from extruding under the hard mask layer 3302, the interlayer cap layer 804 prevents damage to the device layer 102, reduces leakage current, and enhances performance of the photodetector.

Figure 39:
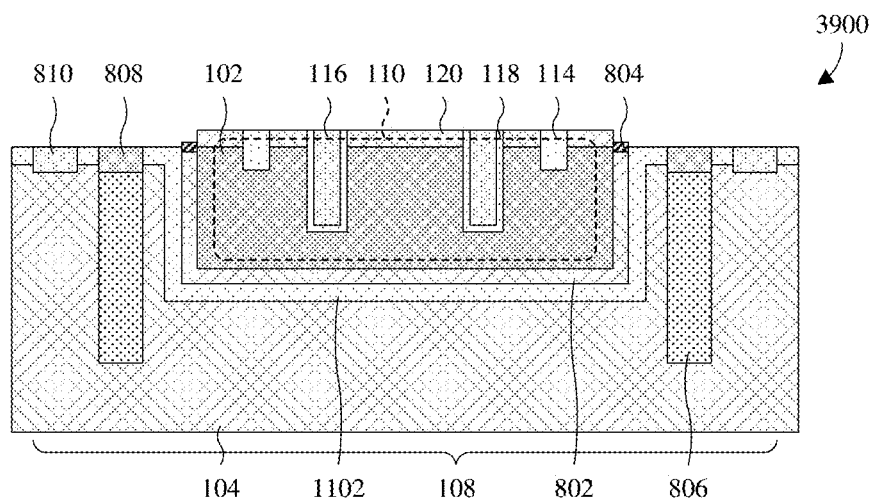

As illustrated by the cross-sectional view 3900 of FIG. 39, the hard mask layer 3302 (see, e.g., FIG. 38) is removed. The removal may, for example, be performed by an etching process or some other suitable removal process.

Also illustrated by the cross-sectional view 3900 of FIG. 39, a photodetector 110 is formed in the device layer 102. The photodetector 110 includes a pair of first contact regions 114, a pair of second contact regions 116, and a pair of contact wells 118. In alternative embodiments, embodiments, the contact wells 118 are omitted. Further, in alternative embodiments, the photodetector 110 may have fewer contact regions.

The first and second contact regions 114, 116 and the contact wells 118 are doped semiconductor regions in the device layer 102 and may be formed by ion implantation and/or some other suitable doping process. The first contact regions 114 have a first doping type, and the second contact regions 116 and the contact wells 118 have a second doping type opposite the first doping type. The first and second doping types may, for example, respectively be N-type and P-type or vice versa. The contact wells 118 are individual to and respectively cup undersides of the second contact regions 116 to separate the second contact regions 116 from a bulk of the device layer 102. The bulk of the device layer 102 may, for example, be undoped. The photodetector 110 may, for example, be or comprise PIN photodiode or some other suitable type of photodiode.

Figure 40:
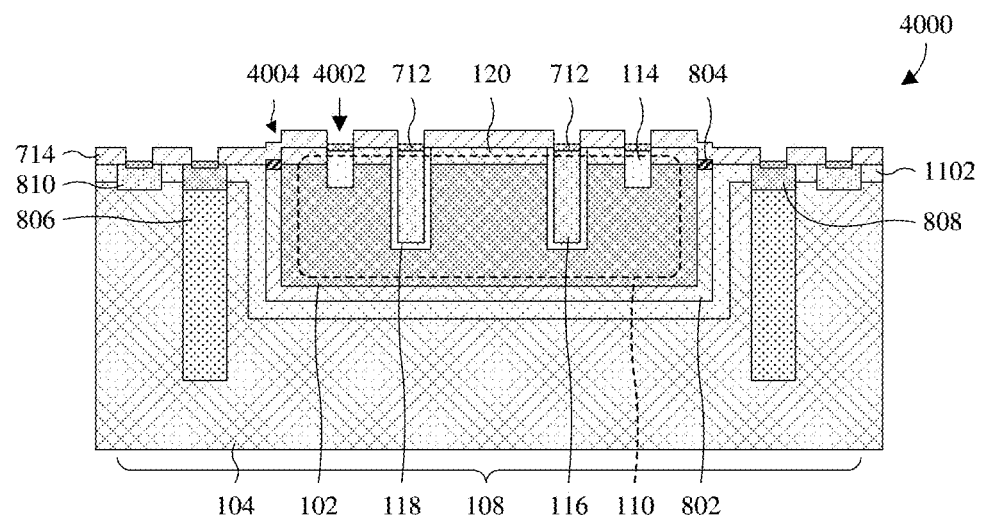

As illustrated by the cross-sectional view 4000 of FIG. 40, silicide layers 712 and an RPD layer 714 are formed. The RPD layer 714 defines silicide openings 4002 respectively overlying the first and second contact regions 114, 116, the SII region 808, and the SSI regions 810. The silicide layers 712 are respectively in the silicide openings 4002 and may, for example, be or comprise nickel silicide or some other suitable type of metal silicide. A process for forming the silicide layers 712 and the RPD layers 714 may, for example, comprise: 1) depositing the RPD layer 714; 2) patterning the RPD layer 714 to define the silicide openings 4002; 3) depositing metal covering the RPD layer 714 and lining the silicide openings 4002; 4) annealing the metal to trigger a silicide reaction that forms the silicide layers 712; and 5) removing unreacted metal. Other suitable processes are, however, amenable. The patterning may, for example, be performed by a photolithography/etching process or some other suitable etching process.

As noted above, the interlayer cap layer 804 may prevent the device layer 102 from extruding outward. This, in turn, may prevent crystalline damage to the device layer 102, reduce leakage current at the device layer 102, and enhances performance of the photodetector 110. However, if the interlayer cap layer 804 was omitted and the extrusion occurred, the patterning of the RPD layer 714 and/or the removal of unreacted metal may damage the device layer 102 through the extruded portions of the device layer 102. Such damage may, in turn, increase leakage current and degrade performance of the photodetector 110.

For example, to the extent that the extruded portions of the device layer 102 extended to the SSI regions 810, an etchant used during the patterning may come in contact with the extruded portions through the silicide openings 4002 of the SSI regions 810. The extruded portions may then be eroded to define channels extending under the device cap layer 120 and the etchant may erode a bulk of the device layer 102 through the channel.

As another example, the removal may be performed with a wet cleaning solution comprising an ammonia-peroxide mixture (APM), a sulfuric acid and hydrogen peroxide mixture (SPM), or some other suitable mixture comprising hydrogen peroxide (e.g., $H_2O_2$). In at least embodiments in which the device layer 102 is or comprise germanium and the device cap layer 120 is or comprises silicon, the hydrogen peroxide may have high etch rate for the device layer 102 and a low etch rate for the device cap layer 120. The device cap layer 120 may therefore protect underlying portions of the device layer 102. However, extruded portions of the device layer 102 that extend beyond to device cap layer 120 may be susceptible to damage by the wet cleaning solution. For example, if the extruded portions extended to the SSI regions 810, the wet cleaning solution may come in contact with the extruded portions through the silicide openings 4002 of the SSI regions 810. As another example, seams 4004 may develop in the RPD layer 714 at corners of the device cap layer 120, thereby allowing the wet cleaning solution to come in contact with the extruded portions through the seams 4004. To the extent that the wet cleaning solution came in contact with the extruded portions, the extruded portions may be eroded to define channels extending under the device cap layer 120 to a bulk of the device layer 102. The wet cleaning solution may then erode the bulk of the device layer 102 through the channels.

Figure 41:
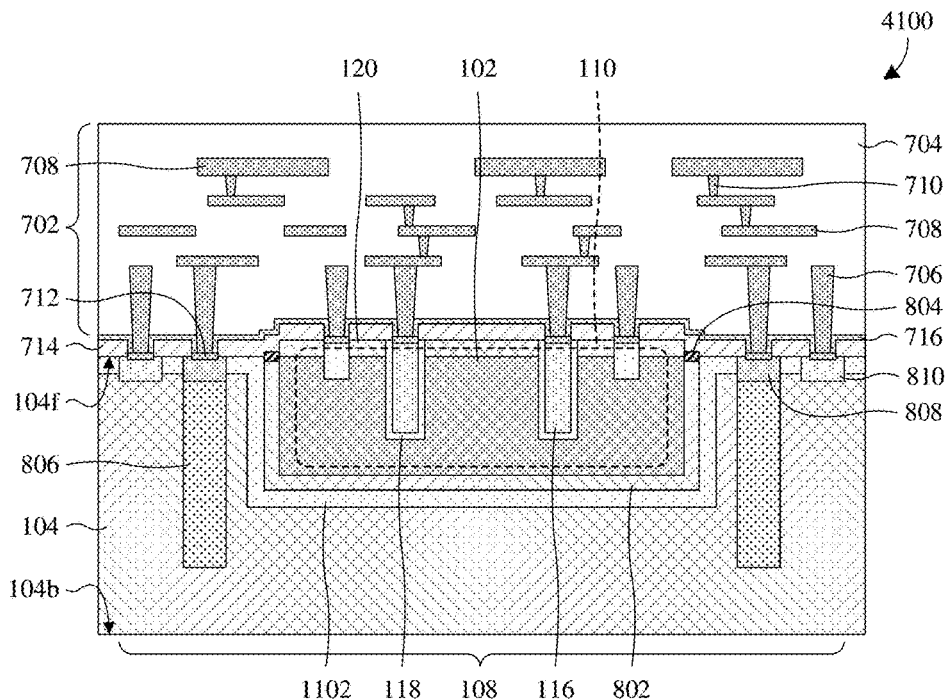

As illustrated by the cross-sectional view 4100 of FIG. 41, an interconnect structure 702 is formed over and electrically coupled to the photodetector 110 on a front side 104f of the substrate 104. The interconnect structure 702 is separated from the RPD layer 714 by a CESL 716. Further, the interconnect structure 702 is electrically coupled to the first and second contact regions 114, 116, the SII region 808, and the SSI regions 810 through the silicide layers 712. The interconnect structure 702 may, for example, be as described with regard to FIGS. 16A and 16B.

While not shown, micro lenses 718 and an antireflective layer 720 may be formed on the front side 104f of the substrate 104 or a back side 104b of the substrate 104. FIG. 16A provides an example of the former, and FIG. 16B provides an example of the latter.

While FIGS. 33-35, 36A-36C, 37A, 37B, and 38-41 are described with reference to various embodiments of a method, it will be appreciated that the structures shown in FIGS. 33-35, 36A-36C, 37A, 37B, and 38-41 are not limited to the method but rather may stand alone separate of the method. While FIGS. 33-35, 36A-36C, 37A, 37B, and 38-41 are described as a series of acts, it will be appreciated that the order of the acts may be altered in other embodiments. While FIGS. 33-35, 36A-36C, 37A, 37B, and 38-41 illustrate and describe as a specific set of acts, some acts that are illustrated and/or described may be omitted in other embodiments. Further, acts that are not illustrated and/or described may be included in other embodiments.

Figure 37A:
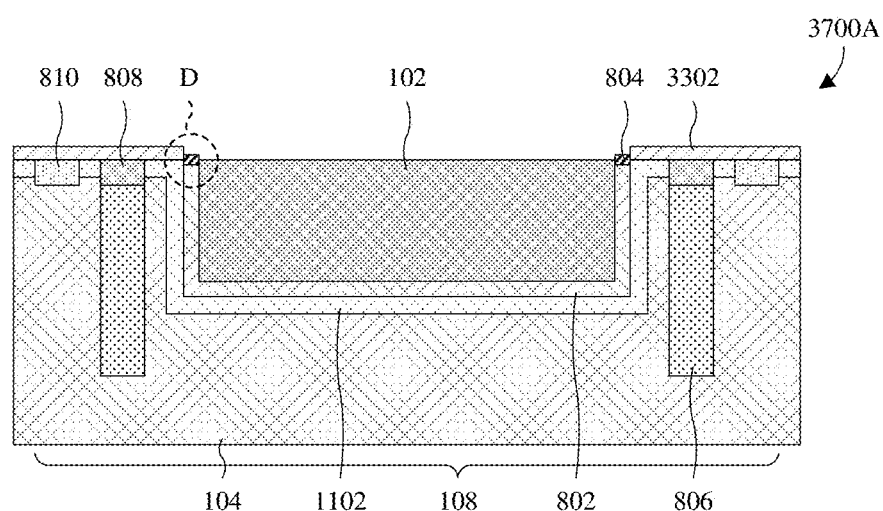
Figure 37B:
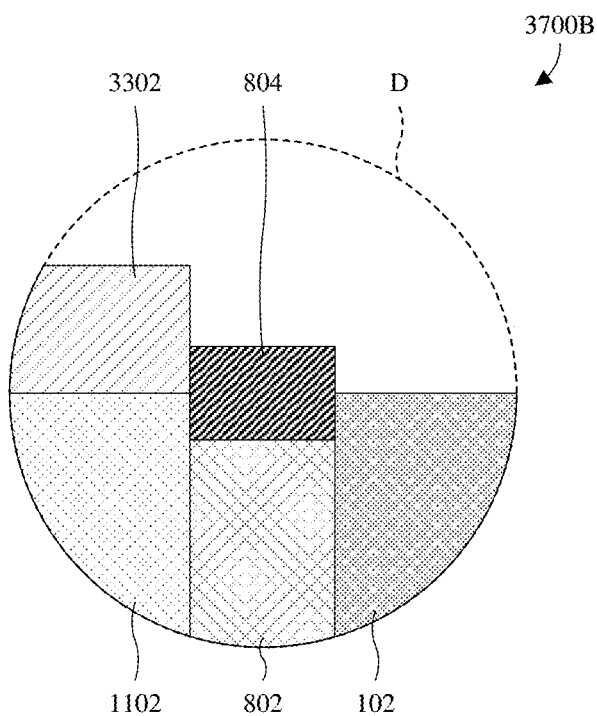

In some embodiments, to form the image sensor in any one of FIGS. 12, 13, 14A, 14C, and 14D or to form other suitable image sensors, the cleaning at FIGS. 37A and 37B is performed with a wet cleaning solution that does not form the interlayer cap layer 804. The wet cleaning solution may, for example, comprise hydrofluoric acid or some other suitable component. In some embodiments, to form the image sensor in FIG. 13 or to form other suitable image sensors, the interlayer 802 is further omitted while performing the acts at FIG. 35. In some embodiments, to form the image sensor in any one of FIGS. 10A and 14A or to form other suitable image sensors, sidewalls of the hard mask layer 3302 in the cavity 3402 are further pulled back from neighboring sidewalls of the substrate 104 between the acts of FIG. 34 and the acts of FIG. 35. The pullback exposes a top surface portion of the substrate 104 that adjoins the cavity 3402 and allows the interlayer 802 to epitaxially grow on the exposed top surface portion. The pullback may, for example, be performed by an etching process or some other suitable process. In some embodiments, to form the image sensor in FIG. 10E, the planarization at FIGS. 36A-36C further removes the hard mask layer 3302, thereby allowing the interlayer cap layer 804 to form on exposed surface of the substrate 104 that were covered by the hard mask layer 3302.

Figure 42:
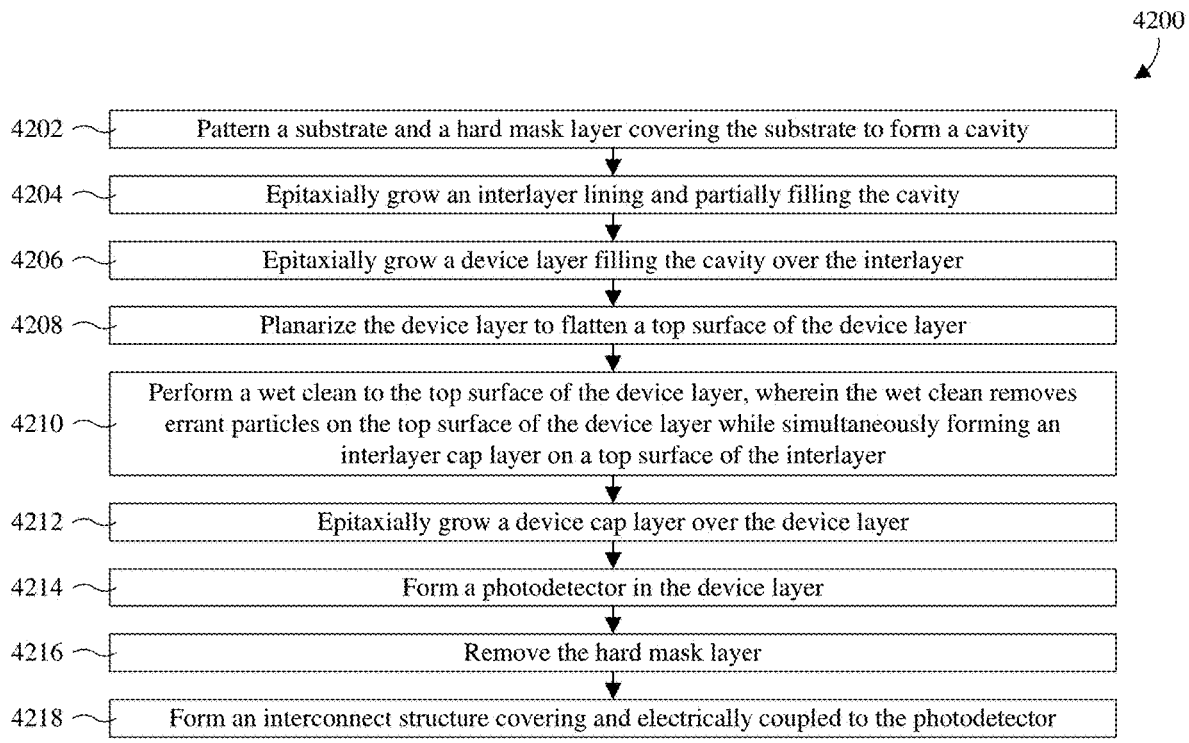
FIG. 42 illustrates a block diagram of some embodiments of the method of FIGS. 33-35, 36A-36C, 37A, 37B, and 38-41.

With reference to FIG. 42, a block diagram 4200 of some embodiments of the method of FIGS. 33-35, 36A-36C, 37A, 37B, and 38-41 is provided.

At 4202, a substrate and a hard mask layer covering the substrate are patterned to form a cavity. See, for example, FIGS. 33 and 34.

At 4204, an interlayer is epitaxially grown lining and partially filling the cavity. See, for example, FIG. 35.

At 4206, a device layer is epitaxially grown filling the cavity over the interlayer. See, for example, FIG. 35.

At 4208, the device layer is planarized to flatten a top surface of the device layer. See, for example, FIGS. 36A-36C.

At 4210, a wet clean is performed to the top surface of the device layer, wherein the wet clean removes errant particles on the top surface of the device layer while simultaneously forming an interlayer cap layer on a top surface of the interlayer. See, for example, FIGS. 37A and 37B.

At 4212, a device cap layer is epitaxially grown over the device layer. See, for example, FIG. 38.

At 4214, a photodetector is formed in the device layer. See, for example, FIG. 39.

At 4216, the hard mask layer is removed. See, for example, FIG. 39.

At 4218, an interconnect structure is formed covering and electrically coupled to the photodetector. See, for example, FIGS. 40 and 41.

While the block diagram 4200 of FIG. 42 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 43, 44A, 44B, and 45-49, a series of cross-sectional views 4300, 4400A, 4400B, 4500-4900 of some alternative embodiments of the method of FIGS. 33-35, 36A-36C, 37A, 37B, and 38-41 is provided in which the planarization of the device layer 102 removes the hard mask layer 3302. The method may be employed to form the image sensor in FIG. 14B. Further, the method may be employed other suitable image sensors.

Figure 43:
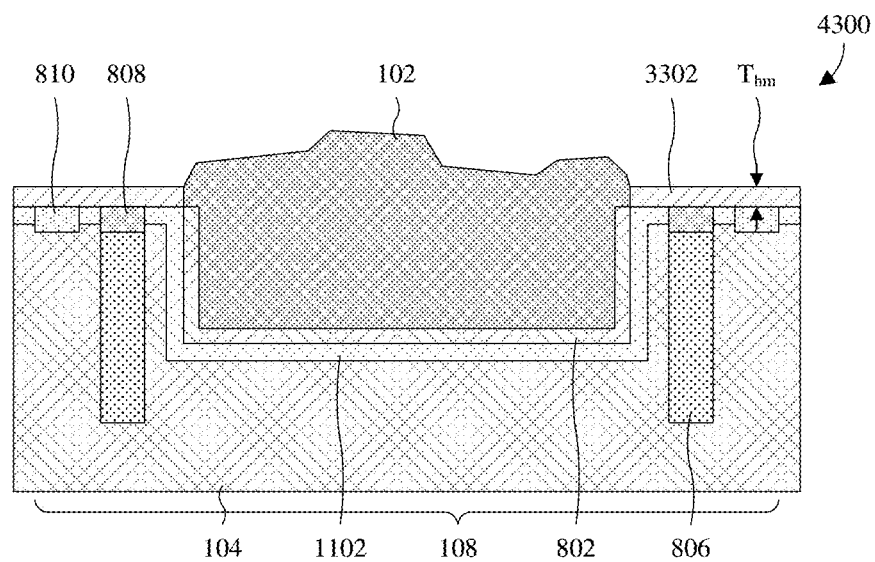
FIGS. 43, 44A, 44B, and 45-49 illustrate a series of cross-sectional views of some alternative embodiments of the method of FIGS. 33-35, 36A-36C, 37A, 37B, and 38-41 in which a device layer planarization removes a hard mask layer.

As illustrated by the cross-sectional view 4300 of FIG. 43, the acts illustrated and described at FIGS. 33-35 are performed. By performing the acts described at FIG. 33, a DII region 806, a SII region 808, and SSI regions 810 are formed in a substrate 104. Further, a hard mask layer 3302 is deposited over the substrate 104. By performing the acts described at FIG. 34, the hard mask layer 3302 and the substrate 104 are patterned to define a cavity 3402. By performing the acts described at FIG. 35, a substrate implant region 1102 is formed lining the cavity 3402. Further, an interlayer 802 is epitaxially grown lining the cavity 3402 over the substrate implant region 1102 and a device layer 102 is epitaxially grown filling the cavity 3402 over the interlayer 802. In alternative embodiments, the substrate implant region 1102 is omitted.

Figure 44A:
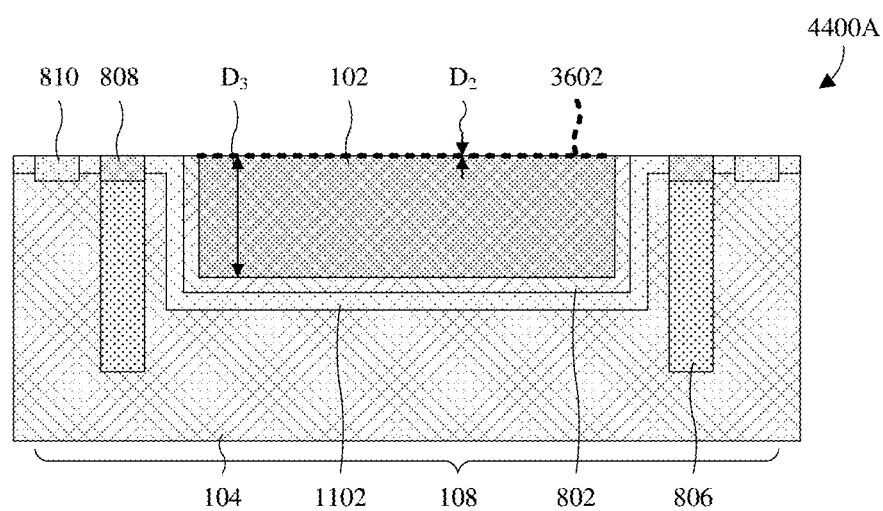
Figure 44B:
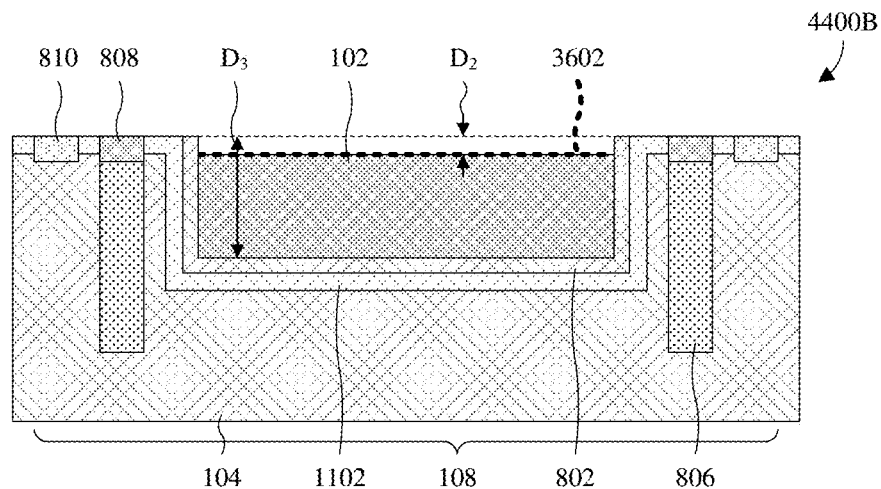

As illustrated by the cross-sectional view 4400A, 4400B of FIGS. 44A and 44B, a planarization is performed into a top surface of the device layer 102 to flatten the top surface and to simultaneously remove the hard mask layer 3302 (see, e.g., FIG. 43). FIGS. 44A and 44B are alternative embodiments of the planarization and hence each individually illustrates the planarization. Further, FIGS. 44A and 44B illustrate different offset distances $D_2$ from the top surface of the device layer 102 to a top surface of the substrate 104. In FIG. 44A, the offset distance $D_2$ is zero or about zero. In FIGS. 44B, the offset distance $D_2$ is positive. As a result of the planarization, errant particles 3602 settle and/or form on the top surface of the device layer 102.

Flattening the device layer 102 improves uniformity and hence reliability with processing performed hereafter. Further, the flattening is performed such that the offset distance $D_2$ is small. If the offset distance $D_2$ is large, the topography at the device layer 102 may fully or partially negate the benefits from the flattening. The offset distance $D_2$ may, for example, be small if within about 1, 2, 5, 10, or 30 percent of a depth $D_3$ that the device layer 102 extends into the substrate 104 and may, for example, be large otherwise. Other suitable percentages are, however, amenable. The depth $D_3$ may, for example, be measured from the top surface of the substrate 104 to a bottom surface of the device layer 102. In alternative embodiments, the offset distance $D_2$ and the depth $D_3$ are measured from the top surface of the interlayer 802 respectively to the top surface of the device layer 102 and the bottom surface of the device layer 102.

In some embodiments, the planarization is performed by a CMP. In alternative embodiments, the planarization is performed by a dry/wet etch process. The dry/wet etch process may, for example, be as described with regard to FIGS. 36A-36C. In alternative embodiments, the planarization is performed by a CMP followed by an etch back. In alternative embodiments, the planarization is performed by some other suitable planarization process.

Figure 45:
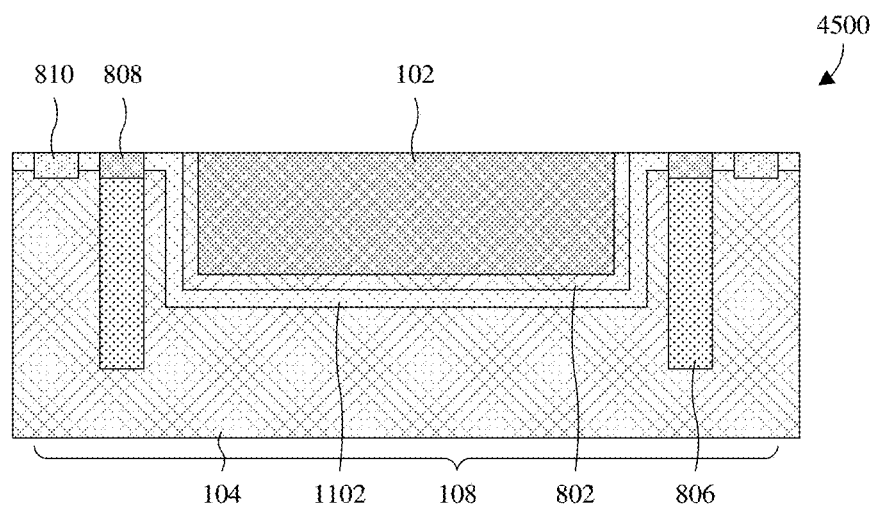

As illustrated by the cross-sectional view 4500 of FIG. 45, a cleaning process is performed on the top surface of the device layer 102. The cleaning process may be performed on the device layer 102 in any one of FIGS. 44A and 44B but is illustrated using the device layer 102 in FIG. 44A. As noted above, FIGS. 44A and 44B are alternatives of each other. The cleaning process at least partially removes the errant particles 3602 (see, e.g., FIGS. 44A and 44B) and comprises application of a wet cleaning solution to the device layer 102. In some embodiments, the wet cleaning solution comprises hydrofluoric acid (e.g., HF) and/or other suitable components.

As should be appreciated, the cleaning process is similar to that described at FIGS. 37A and 37B. However, in contrast with FIGS. 37A and 37B, the cleaning process does not form the interlayer cap layer 804 on the interlayer 802. In alternative embodiments, the cleaning process may be the same as that described at FIGS. 37A and 37B. For example, the cleaning process may use a wet cleaning solution comprising ozone and deionized water. In such alternative embodiments, the interlayer cap layer 804 would form on both the substrate 104 and the interlayer 802 because the hard mask layer 3302 (see, e.g., FIGS. 43) is not present.

Also illustrated by the cross-sectional view 4500 of FIG. 45, a hydrogen baking process is performed after the cleaning process to further remove the errant particles 3602 (see, e.g., FIGS. 44A and 44B). Further, in some embodiments, an additional cleaning process is performed between the hydrogen baking process and subsequent epitaxial growth of a device layer to further remove the errant particles 3602. The hydrogen baking process and/or the additional cleaning process may, for example, be performed as described with regard to FIGS. 37A and 37B.

Figure 46:
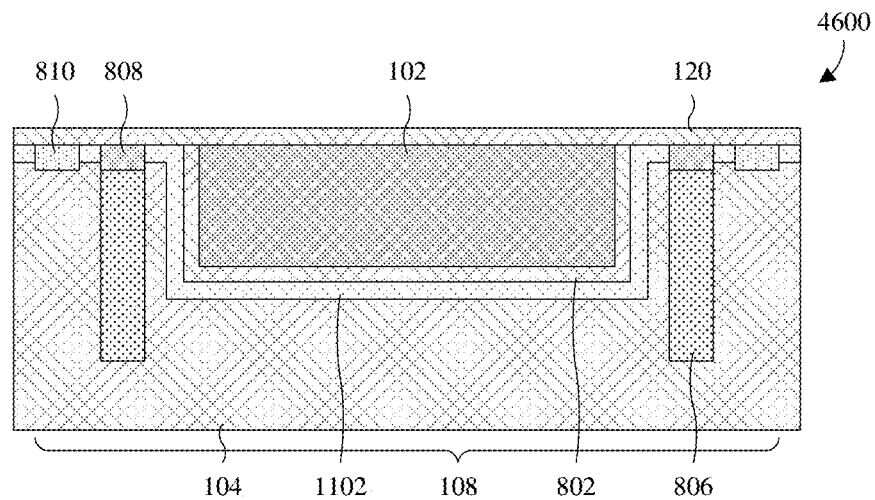
Figure 47:
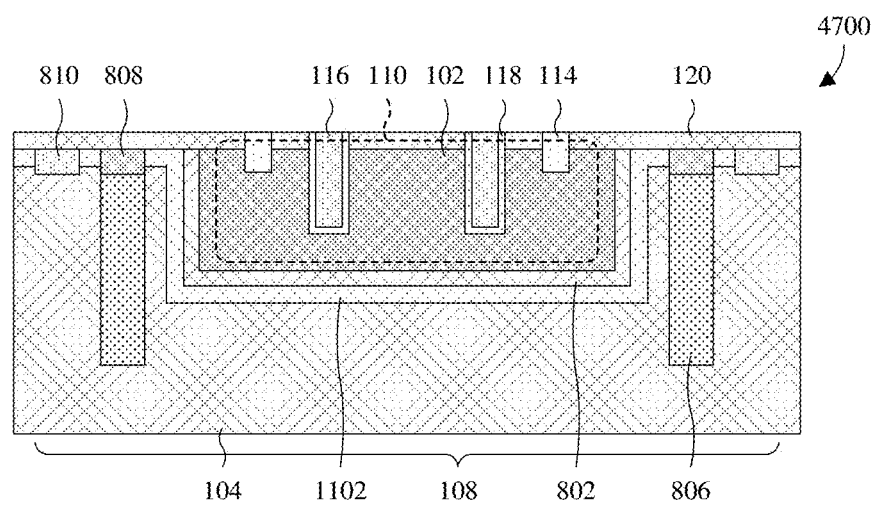

As illustrated by the cross-sectional views 4600, 4700 of FIGS. 46 and 47, the acts illustrated and described at FIGS. 38 and 39 are respectively performed except as noted hereafter. At FIG. 46, a device cap layer 120 is epitaxially grown on and fully covering the device layer 102. Because the hard mask layer 3302 (see, e.g., FIGS. 43) has been removed, the device cap layer 120 further grows on and covers the substrate 104 off to sides of the device layer 102. At FIG. 47, a photodetector 110 is formed in the device layer 102 as described at FIG. 39. However, removal of the hard mask layer 3302 is not performed as described at FIG. 39 because the hard mask layer 3302 has already been removed by the planarization at FIGS. 44A and 44B.

Figure 48:
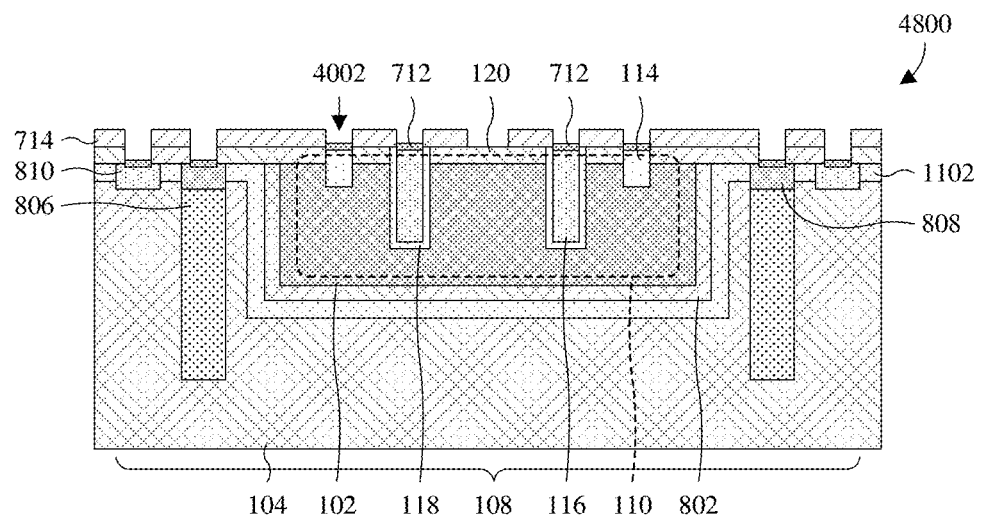

As illustrated by the cross-sectional view 4800 of FIG. 48, silicide layers 712 and an RPD layer 714 are formed. The RPD layer 714 defines silicide openings 4002 respectively overlying the first and second contact regions 114, 116, the SII region 808, and the SSI regions 810. The silicide layers 712 are respectively in the silicide openings 4002. A process for forming the silicide layers 712 and the RPD layers 714 may, for example, comprise: 1) depositing the RPD layer 714; 2) patterning the RPD layer 714 with a first mask to define silicide openings 4002 at the first and second contact regions 114, 116; 3) patterning the RPD layer 714 with a second, different mask to define additional silicide openings 4002 at the SII and SSI regions 808, 810; 4) depositing metal covering the RPD layer 714 and lining the silicide openings 4002; 4) annealing the metal to trigger a silicide reaction that forms the silicide layers 712; and 5) removing unreacted metal. Other suitable processes are, however, amenable.

Figure 49:
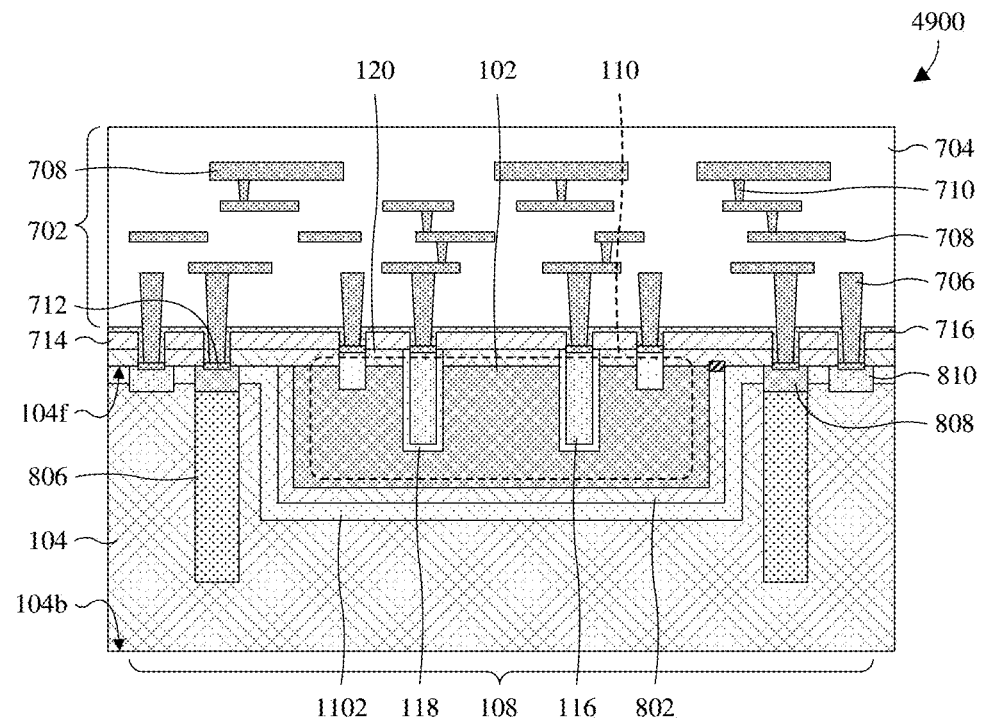

As illustrated by the cross-sectional view 4900 of FIG. 49, an interconnect structure 702 is formed over and electrically coupled to the photodetector 110. The interconnect structure 702 is separated from the RPD layer 714 by a CESL 716 and is electrically coupled to the first and second contact regions 114, 116, the SII region 808, and the SSI regions 810 through the silicide layers 712. The interconnect structure 702 may, for example, be as described at FIGS. 16A and 16B. While not shown, micro lenses 718 and an antireflective layer 720 may be formed on the front side 104*f* of the substrate 104 or a back side 104*b* of the substrate 104. FIG. 16A provides an example of the former, and FIG. 16B provides an example of the latter.

While FIGS. 43, 44A, 44B, and 45-49 are described with reference to various embodiments of a method, it will be appreciated that the structures shown in FIGS. 43, 44A, 44B, and 45-49 are not limited to the method but rather may stand alone separate of the method. While FIGS. 43, 44A, 44B, and 45-49 are described as a series of acts, it will be appreciated that the order of the acts may be altered in other embodiments. While FIGS. 43, 44A, 44B, and 45-49 illustrate and describe as a specific set of acts, some acts that are illustrated and/or described may be omitted in other embodiments. Further, acts that are not illustrated and/or described may be included in other embodiments.

Figure 50:
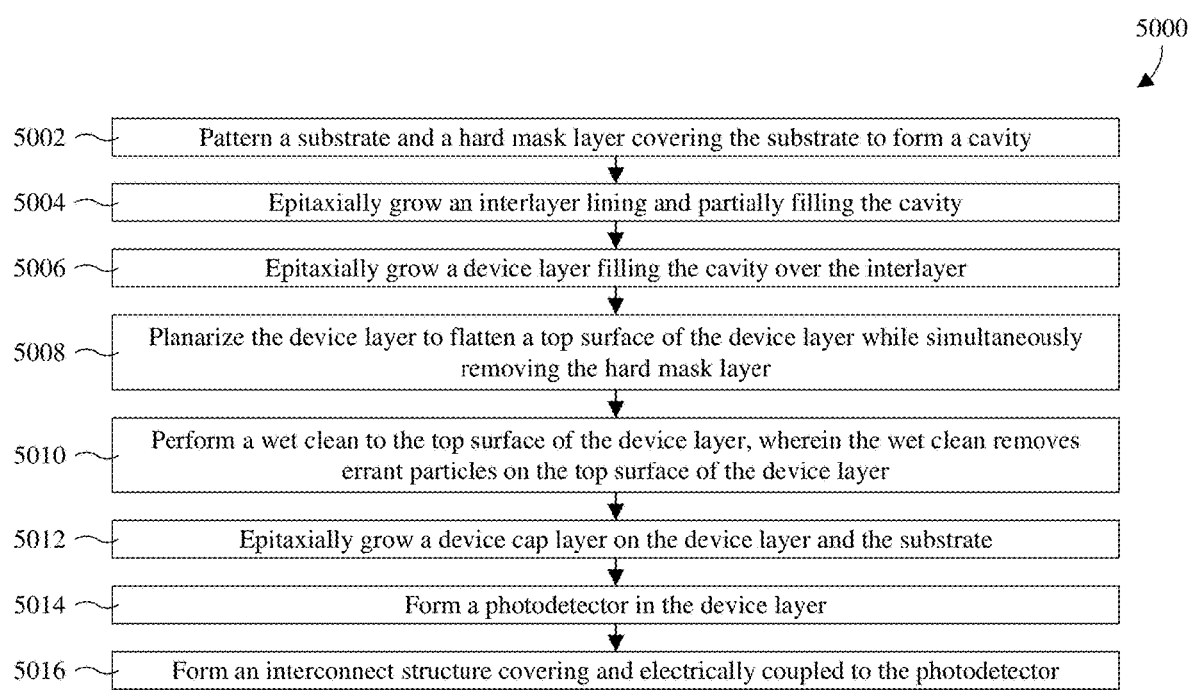
FIG. 50 illustrates a block diagram of some embodiments of the method of FIGS. 43, 44A, 44B, and 45-49.

With reference to FIG. 50, a block diagram 5000 of some embodiments of the method of FIGS. 43, 44A, 44B, and 45-49 is provided.

At 5002, a substrate and a hard mask layer covering the substrate are patterned to form a cavity. See, for example, FIG. 43.

At 5004, an interlayer is epitaxially grown lining and partially filling the cavity. See, for example, FIG. 43.

At 5006, a device layer is epitaxially grown filling the cavity over the interlayer. See, for example, FIG. 43.

At 5008, the device layer is planarized to flatten a top surface of the device layer while simultaneously removing the hard mask layer. See, for example, FIGS. 44A and 44B.

At 5010, a wet clean is performed to the top surface of the device layer, wherein the wet clean removes errant particles on the top surface of the device layer. See, for example, FIG. 45.

At 5012, a device cap layer is epitaxially grown on the device layer and the substrate. See, for example, FIG. 46.

At 5014, a photodetector is formed in the device layer. See, for example, FIG. 47.

At 5016, an interconnect structure is formed covering and electrically coupled to the photodetector. See, for example, FIGS. 48 and 49.

While the block diagram 5000 of FIG. 50 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present disclosure provides an image sensor including: a substrate; a device layer overlying the substrate and defining a first mesa structure; a cap layer overlying the device layer, wherein the substrate, the cap layer, and the device layer are semiconductors, and wherein the device layer has a different absorption coefficient than the substrate and the cap layer; a first photodetector in the device layer at the first mesa structure; and a dielectric layer extending through the device layer to the substrate, wherein the dielectric layer extends in a first closed path along a boundary of the first mesa structure to surround the first mesa structure. In some embodiments, a height of the dielectric layer is about equal to that of the device layer. In some embodiments, the dielectric layer extends into the substrate. In some embodiments, a sidewall of the first mesa structure directly contacts the dielectric layer from top to bottom. In some embodiments, the device layer defines a plurality of mesa structures, including the first mesa structure, arranged in a honeycomb pattern, wherein the dielectric layer individually surrounds and separates the mesa structures. In some embodiments, a density of the mesa structures is about 40-26000 per micrometer squared. In some embodiments, the device layer defines a second mesa structure bordering the first mesa structure, wherein the dielectric layer extends in a second closed path along a boundary of the second mesa structure to surround the second mesa structure, wherein the first and second closed paths partially, but not fully, overlap, and wherein the image sensor further includes: a second photodetector in the second mesa structure. In some embodiments, the first mesa structure is longer in a first direction than in a second direction transverse to the first direction, wherein the second mesa structure is longer in the second direction than in the first direction.

In some embodiments, the present disclosure provides another image sensor including: a substrate; a device layer overlying and recessed into the substrate; a cap layer overlying the device layer; a first photodetector in the device layer; and an interlayer cupping an underside of the device layer and separating the device layer from the substrate; wherein the substrate, the cap layer, the interlayer, and the device layer are semiconductors, wherein the interlayer is undoped, and wherein the device layer has a different energy bandgap than the substrate, the cap layer, and the interlayer. In some embodiments, the image sensor further includes a dielectric layer localized on and directly contacting a top surface of the interlayer. In some embodiments, the dielectric layer extends laterally in a closed path along a boundary of the device layer. In some embodiments, a top layout of the device layer has an X dimension and a Y dimension that are orthogonal to each other, and wherein a width of the dielectric layer is about 0.1% to about 1% of an average of the X and Y dimensions. In some embodiments, the cap layer is localized over the device layer. In some embodiments, the cap layer overlies the substrate at locations laterally offset from the device layer and the interlayer. In some embodiments, the cap layer has substantially the same energy bandgap as the substrate. In some embodiments, a top surface of the device layer is elevated relative to a top surface of the substrate. In some embodiments, a top surface of the device layer is recessed relative to a top surface of the substrate. In some embodiments, the device layer extends into the substrate to a depth, wherein a vertical offset between a top surface of the device layer and a top surface of the substrate is within about 10% of the depth.

In some embodiments, the present disclosure provides a method for forming an image sensor, the method including: depositing a first layer over a substrate; performing an etch selectively into the first layer to form one or more openings in the first layer and exposing the substrate; depositing a second layer covering the first layer and filling the one or more openings, wherein one of the first and second layers is a dielectric layer and another one of the first and second layers is a semiconductor layer; performing a planarization into the second layer to localize the second layer to the one or more openings, wherein the semiconductor layer and the dielectric layer directly contact at a sidewall boundary that extends in a closed path to surround and demarcate a mesa structure; and forming a photodetector in the mesa structure. In some embodiments, the one or more openings define a periodic pattern. In some embodiments, the method further includes epitaxially growing a cap layer on the semiconductor layer, wherein the cap layer has a larger bandgap than the semiconductor layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising:
a substrate;
a device layer overlying the substrate and defining a first mesa structure and a second mesa structure;
a cap layer overlying the device layer, wherein the substrate, the cap layer, and the device layer are semiconductors, and wherein the device layer has an absorption coefficient different than an absorption coefficient of the substrate and an absorption coefficient of the cap layer;
a first photodetector in the device layer at the first mesa structure;
a second photodetector in the device layer at the second mesa structure;
a dielectric layer extending through the device layer to the substrate, wherein the dielectric layer extends in a first closed path along a boundary of the first mesa structure to surround the first mesa structure; and
an interconnect structure overlying and electrically coupled to the first photodetector and the second photodetector through the cap layer, wherein the cap layer is continuous from the first photodetector to the second photodetector.

2. The image sensor according to claim 1, wherein a sidewall of the first mesa structure directly contacts the dielectric layer from top to bottom.

3. The image sensor according to claim 1, wherein the device layer defines a plurality of mesa structures, including the first mesa structure and the second mesa structure, arranged in a honeycomb pattern, and wherein the dielectric layer individually surrounds and separates the plurality of mesa structures.

4. The image sensor according to claim 1, wherein the second mesa structure borders the first mesa structure, wherein the dielectric layer extends in a second closed path along a boundary of the second mesa structure to surround the second mesa structure, and wherein the first closed path partially, but not fully, overlaps with the second closed path.

5. The image sensor according to claim 4, wherein the first mesa structure is longer in a first direction than in a second direction transverse to the first direction, and wherein the second mesa structure is longer in the second direction than in the first direction.

6. The image sensor according to claim 1, wherein the cap layer has the same energy bandgap as the substrate.

7. The image sensor according to claim 1, wherein the first photodetector and the second photodetector are in the cap layer.

8. The image sensor according to claim 1, wherein the first photodetector comprises a pair of contact regions in the first mesa structure, wherein the interconnect structure comprises a pair of contact vias overlying and electrically coupled respectively to the pair of contact regions, and wherein the pair of contact vias are at a bottom of the interconnect structure.

9. The image sensor according to claim 8, wherein the pair of contact regions are further in the cap layer, correspond to doped regions, and have individual top surfaces level with a top surface of the cap layer.

10. An image sensor, comprising:
a semiconductor substrate;
a plurality of semiconductor mesa structures overlying the semiconductor substrate in a periodic pattern, wherein the plurality of semiconductor mesa structures have a bandgap that is small compared to a bandgap of the semiconductor substrate;
a semiconductor cap layer overlying the plurality of semiconductor mesa structures and having a bandgap that is large compared to the bandgap of the plurality of semiconductor mesa structures; and
a plurality of photodetectors respectively in the plurality of semiconductor mesa structures;
wherein the plurality of photodetectors comprise individual contact regions in the semiconductor cap layer and respectively in the plurality of semiconductor mesa structures, and wherein the individual contact regions correspond to doped regions.

11. The image sensor according to claim 10, wherein the semiconductor substrate and the semiconductor cap layer are silicon, and wherein the plurality of semiconductor mesa structures comprise germanium.

12. The image sensor according to claim 10, wherein the plurality of semiconductor mesa structures comprises a first semiconductor mesa structure and a second semiconductor mesa structure, and wherein the semiconductor cap layer is continuous from the first semiconductor mesa structure to the second semiconductor mesa structure.

13. The image sensor according to claim 10, wherein the plurality of semiconductor mesa structures comprises a first semiconductor mesa structure and a second semiconductor mesa structure, wherein the image sensor further comprises a dielectric layer extending continuously from a first sidewall of the first semiconductor mesa structure to a second sidewall of the second semiconductor mesa structure facing the first sidewall, and wherein the dielectric layer has a height greater than a height of the first sidewall and a height of the second sidewall.

14. The image sensor according to claim 10, wherein the individual contact regions have top surfaces level with a top surface of the semiconductor cap layer.

15. An image sensor, comprising:
a semiconductor substrate;
a germanium mesa structure elevated relative to a topmost surface of the semiconductor substrate;
a dielectric layer extending in a closed path continuously along a sidewall of the germanium mesa structure; and
a photodetector in the germanium mesa structure;
wherein the dielectric layer has a top surface recessed relative to a top surface of the photodetector.

16. The image sensor according to claim 15, wherein the dielectric layer has a height greater than a height of the photodetector.

17. The image sensor according to claim 16, wherein the dielectric layer is recessed into the topmost surface of the semiconductor substrate.

18. The image sensor according to claim 15, further comprising:
a semiconductor cap layer overlying the dielectric layer and partially forming the photodetector.

19. The image sensor according to claim 18, wherein the photodetector comprises a contact region in the germanium mesa structure and the semiconductor cap layer and further comprises a silicide layer atop the contact region and level with a top surface of the semiconductor cap layer.

20. The image sensor according to claim 18, wherein the semiconductor cap layer comprises undoped silicon and directly contacts the germanium mesa structure.

* * * * *